United States Patent
Kim et al.

(10) Patent No.: US 11,729,930 B2
(45) Date of Patent: *Aug. 15, 2023

(54) ANTENNA USING HORN STRUCTURE AND ELECTRONIC DEVICE INCLUDING THE SAME

(71) Applicant: Samsung Electronics Co., Ltd., Suwon-si (KR)

(72) Inventors: Dongyeon Kim, Suwon-si (KR); Seongjin Park, Suwon-si (KR); Sehyun Park, Suwon-si (KR); Myunghun Jeong, Suwon-si (KR); Jehun Jong, Suwon-si (KR); Jaehoon Jo, Suwon-si (KR); Yoonjung Kim, Suwon-si (KR); Gyubok Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/082,136

(22) Filed: Dec. 15, 2022

(65) Prior Publication Data

US 2023/0122983 A1    Apr. 20, 2023

Related U.S. Application Data

(63) Continuation of application No. 17/464,120, filed on Sep. 1, 2021, now Pat. No. 11,533,815, which is a
(Continued)

(30) Foreign Application Priority Data

Nov. 19, 2018    (KR) .......................... 10-2018-0142304

(51) Int. Cl.
*H05K 5/02*    (2006.01)
*H05K 7/14*    (2006.01)

(52) U.S. Cl.
CPC ......... *H05K 5/0217* (2013.01); *H05K 7/1427* (2013.01)

(58) Field of Classification Search
CPC .. H05K 1/0243; H05K 5/0017; H05K 7/1427; H05K 1/115; H05K 5/0217;
(Continued)

(56) References Cited

U.S. PATENT DOCUMENTS

| 4,626,865 A | 12/1986 | Rammos |
| 5,796,371 A | 8/1998 | Sato et al. |

(Continued)

FOREIGN PATENT DOCUMENTS

| JP | 2013-042376 A | 2/2013 |
| KR | 10-0818897 B1 | 4/2008 |

(Continued)

OTHER PUBLICATIONS

International Search Report dated Feb. 28, 2020, International Appln. No. PCT/KR2019/015760.
(Continued)

*Primary Examiner* — Hung S. Bui
*Assistant Examiner* — Sagar Shrestha
(74) *Attorney, Agent, or Firm* — Jefferson IP Law, LLP

(57) ABSTRACT

An electronic device in provided, including an antenna using a horn structure capable of using at least a portion of a metal member as a signal waveguide structure of the antenna. The device includes a housing, a display, a printed circuit board, and at least one wireless communication circuit, where a waveguide hole is provided to connect at least a portion of a through hole and an electronic component and is used as an operating channel of the electronic component together with the waveguide hole.

20 Claims, 49 Drawing Sheets

Related U.S. Application Data continuation of application No. 16/686,687, filed on Nov. 18, 2019, now Pat. No. 11,202,365.

(58) Field of Classification Search
CPC ......... H05K 2201/10098; H05K 1/141; H05K 1/165; H01Q 13/02; H01Q 21/08; H01Q 1/44; H01Q 1/243
See application file for complete search history.

(56) References Cited

U.S. PATENT DOCUMENTS

| | | | |
|---|---|---|---|
| 6,043,789 A | 3/2000 | Suzuki et al. | |
| 6,061,026 A | 5/2000 | Ochi et al. | |
| 7,737,894 B2 | 6/2010 | Choudhury | |
| 9,136,576 B2 | 9/2015 | Hashimoto et al. | |
| 9,219,017 B2 | 12/2015 | Takagi | |
| 9,379,760 B2 | 6/2016 | Pescod et al. | |
| 9,871,299 B2 | 1/2018 | Ganchrow et al. | |
| 10,306,760 B2 | 5/2019 | Li et al. | |
| 10,389,857 B2 | 8/2019 | Sun et al. | |
| 10,903,563 B2 | 1/2021 | Kang et al. | |
| 2005/0122265 A1 | 6/2005 | Gaucher et al. | |
| 2005/0270247 A1 | 12/2005 | Kitamori et al. | |
| 2006/0202312 A1 | 9/2006 | Iijima et al. | |
| 2009/0066590 A1 | 3/2009 | Kamada et al. | |
| 2009/0309680 A1 | 12/2009 | Suzuki | |
| 2010/0238068 A1 | 9/2010 | Seidel et al. | |
| 2011/0309899 A1 | 12/2011 | Leiba et al. | |
| 2014/0225785 A1 | 8/2014 | Yu | |
| 2014/0361933 A1 | 12/2014 | Zhang et al. | |
| 2015/0289401 A1 | 10/2015 | Hikino | |
| 2016/0033273 A1 | 2/2016 | Kamisuki | |
| 2016/0079675 A1 | 3/2016 | Van Zeijl et al. | |
| 2016/0351996 A1 | 12/2016 | Ou | |
| 2016/0351998 A1 | 12/2016 | Ahn et al. | |
| 2017/0033445 A1 | 2/2017 | Okajima et al. | |
| 2017/0201011 A1 | 7/2017 | Khripkov et al. | |
| 2017/0201014 A1 | 7/2017 | Lee et al. | |
| 2017/0214120 A1 | 7/2017 | Lee et al. | |
| 2017/0294705 A1 | 10/2017 | Khripkov et al. | |
| 2017/0309992 A1 | 10/2017 | Noori et al. | |
| 2017/0324135 A1 | 11/2017 | Blech et al. | |
| 2017/0330836 A1 | 11/2017 | Vanhille et al. | |
| 2018/0026341 A1* | 1/2018 | Mow .................. | H01Q 1/243 343/702 |
| 2018/0048061 A1 | 2/2018 | Brigham | |
| 2018/0069616 A1 | 3/2018 | Kim et al. | |
| 2018/0090816 A1 | 3/2018 | Mow et al. | |
| 2018/0267161 A1 | 9/2018 | Nagaishi et al. | |
| 2018/0358686 A1* | 12/2018 | Park .................. | H01Q 21/08 |
| 2018/0366258 A1 | 12/2018 | Otsubo et al. | |
| 2019/0208632 A1 | 7/2019 | Chandra et al. | |
| 2019/0288392 A1 | 9/2019 | Kim et al. | |
| 2019/0348746 A1 | 11/2019 | Gupta et al. | |
| 2019/0379134 A1* | 12/2019 | Paulotto .............. | H01Q 21/062 |
| 2020/0014091 A1 | 1/2020 | Othmezouri et al. | |
| 2020/0021019 A1* | 1/2020 | Rajagopalan ........ | H01Q 1/2291 |
| 2020/0067198 A1 | 2/2020 | Hunziker | |
| 2020/0099138 A1 | 3/2020 | Garrido Lopez et al. | |
| 2020/0337157 A1 | 10/2020 | Ariumi | |

FOREIGN PATENT DOCUMENTS

| | | | |
|---|---|---|---|
| KR | 10-2017-0087753 A | 7/2017 | |
| KR | 10-2018-0050820 A | 5/2018 | |
| WO | 2016/092084 A1 | 6/2016 | |
| WO | 2016/190999 A1 | 12/2016 | |
| WO | 2017/186913 A1 | 11/2017 | |

OTHER PUBLICATIONS

Extended European Search Report dated Oct. 26, 2021, issued in European Patent Application No. 19887207.9.
Korean Office Action dated Nov. 15, 2022, issued in Korean Patent Application No. 10-2018-0142304.
Decision of Patent dated May 29, 2023, issued in Korean Application No. 10-2018-0142304.

* cited by examiner

ANTENNA USING HORN STRUCTURE AND ELECTRONIC DEVICE INCLUDING THE SAME

CROSS-REFERENCE TO RELATED APPLICATION(S)

This application is a continuation application of prior application Ser. No. 17/464,120, filed on Sep. 1, 2021, which application is a continuation application of prior application Ser. No. 16/686,687, filed on Nov. 18, 2019, which has issued as U.S. Pat. No. 11,202,365 on Dec. 14, 2021 and is based on and claims priority under 35 U.S.C. § 119(a) of a Korean patent application number 10-2018-0142304, filed on Nov. 19, 2018, in the Korean Intellectual Property Office, the disclosure of which is incorporated by reference herein in its entirety.

BACKGROUND

1. Field

The disclosure relates to an antenna using a horn structure and an electronic device including the same.

2. Description of Related Art

With the development of wireless communication technology, electronic devices (e.g., communication electronic devices) are commonly used in daily life; thus, use of contents is increasing exponentially. Because of such rapid increase in the use of contents, a network capacity is reaching its limit. After commercialization of 4th generation (4G) communication systems, in order to meet growing wireless data traffic demand, a communication system (e.g., 5th generation (5G) or pre-5G communication system, or new radio (NR))) that transmits and/or receives signals using a frequency of a high frequency (e.g., millimeter wave (mmWave)) band (e.g., 3 GHz to 300 GHz band) is being studied.

Next generation wireless communication technology may transmit and receive signals using a frequency in a range of substantially 3 GHz to 100 GHz, and an efficient mounting structure for overcoming a high free space loss because of frequency characteristics and increasing a gain of an antenna and a new antenna structure corresponding thereto are being developed.

In recent years, electronic devices are becoming slimmer and may include at least partially a metal member (e.g., conductive member) for the purpose of rigid reinforcement and aesthetic design. In order to form a beam pattern direction of an antenna, a metal member may be excluded in the beam pattern direction or the beam pattern direction may be changed to avoid the metal member.

The above information is presented as background information only, and to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below Accordingly, an aspect of the disclosure is to provide an antenna using a horn structure and an electronic device including the same.

Another aspect of the disclosure is to provide an antenna using a horn structure and an electronic device including the same capable of using at least a portion of a metal member as a signal waveguide structure of an antenna.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate, a second plate facing in a direction opposite to that of the first plate, and a side member configured to enclose a space between the first plate and the second plate and connected to the second plate or formed integrally with the second plate and including a conductive material.

In accordance with another aspect of the disclosure, a first portion of the side member includes a first surface facing outside the housing, a second surface facing in a direction opposite to that of the first surface, and a through hole formed between the first surface and the second surface.

In accordance with another aspect of the disclosure, the through hole includes a first opening formed on the first surface and having a first size when viewed from the outside of the housing, a second opening formed on the second surface, having a second size smaller than the first size when viewed from the outside of the housing, and at least partially overlapped with the first opening, and a channel formed between the first opening and the second opening.

In accordance with another aspect of the disclosure, the housing further includes a first non-conductive material inserted into the through hole.

In accordance with another aspect of the disclosure, the electronic device includes a display visible through at least a portion of the first plate, a printed circuit board disposed inside the housing so as to face the first portion, wherein the printed circuit board includes a third surface facing the second surface, a fourth surface facing in a direction opposite to that of the third surface, a first conductive layer disposed closer to the third surface rather than the fourth surface, wherein the first conductive layer includes a first area including a slot and facing the second opening, and a second area formed at a periphery of the first area, a second conductive layer disposed closer to the fourth surface rather than the first conductive layer, and a conductive line overlapped with at least a portion of the second area when viewed from above the first conductive layer and disposed between the first conductive layer and the second conductive layer, and a printed circuit board configured to enclose at least a portion of the second area and including a plurality of conductive vias configured to electrically connect the first conductive layer and the second conductive layer.

In accordance with another aspect of the disclosure, the electronic device includes at least one wireless communication circuit electrically connected to the conductive line and configured to transmit and/or receive a signal having a frequency between 3 GHz and 100 GHz.

In accordance with another aspect of the disclosure, an electronic device is provided. The electronic device includes a housing including a first plate, a second plate facing in a direction opposite to that of the first plate, and a side member configured to enclose a space between the first plate and the second plate and connected to the second plate or formed integrally with the second plate and including a conductive material.

In accordance with another aspect of the disclosure, a first portion of the side member includes a first surface facing outside the housing, a second surface facing in a direction opposite to that of the first surface, and a through hole formed between the first surface and the second surface.

In accordance with another aspect of the disclosure, the through hole includes a first opening formed on the first surface and having a first size when viewed from the outside of the housing, a second opening formed on the second surface, having a second size smaller than the first size when viewed from the outside of the housing, and at least partially overlapped with the first opening, and a channel formed between the first opening and the second opening.

In accordance with another aspect of the disclosure, the housing includes a first non-conductive material inserted into the through hole.

In accordance with another aspect of the disclosure, the electronic device includes a display visible through at least a portion of the first plate, a structure disposed inside the housing so as to face the first portion, wherein the structure includes a first area disposed to face the second opening, a second area including a plurality of conductive vias formed at a periphery of the first area, and a conductive line disposed in the second area.

In accordance with another aspect of the disclosure, the electronic device includes at least one wireless communication circuit electrically connected to the conductive line and configured to transmit and/or receive a signal having a frequency between 3 GHz and 100 GHz.

In accordance with another aspect of the disclosure, an electronic device is provided. The electronic device includes a housing including a first plate, a second plate facing in a direction opposite to that of the first plate, and a side member configured to enclose a space between the first plate and the second plate and connected to the second plate or formed integrally with the second plate and including a conductive material.

In accordance with another aspect of the disclosure, a first portion of the side member includes a first surface facing outside the housing, a second surface facing in a direction opposite to that of the first surface, a through hole formed between the first surface and the second surface.

In accordance with another aspect of the disclosure, the through hole includes a first opening formed on the first surface and having a first size when viewed from the outside of the housing, a second opening formed on the second surface, having a second size smaller than the first size when viewed from the outside of the housing, and at least partially overlapped with the first opening, and a channel formed between the first opening and the second opening.

In accordance with another aspect of the disclosure, the housing further includes a first non-conductive material inserted into the through hole.

In accordance with another aspect of the disclosure, the electronic device includes a display visible through at least a portion of the first plate, a printed circuit board disposed inside the housing so as to face the first portion, wherein the printed circuit board includes a third surface facing in the same direction as that of the first plate, a fourth surface facing in a direction opposite to that of the third surface, a substrate side surface configured to enclose a space between the third surface and the fourth surface and including a first area facing the second opening, a first conductive layer disposed closer to the third surface rather than the fourth surface and including a second area formed at the third surface adjacent to the substrate side surface, a second conductive layer disposed closer to the fourth surface rather than the first conductive layer, and a conductive line overlapped with at least a portion of the second area and disposed between the first conductive layer and the second conductive layer, when viewed from above the first conductive layer, wherein the printed circuit board is configured to enclose at least a portion of the second area and includes a plurality of conductive vias configured to electrically connect the first conductive layer and the second conductive layer.

In accordance with another aspect of the disclosure, the electronic device includes at least one wireless communication circuit electrically connected to the conductive line and configured to transmit and/or receive a signal having a frequency between 3 GHz and 100 GHz.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
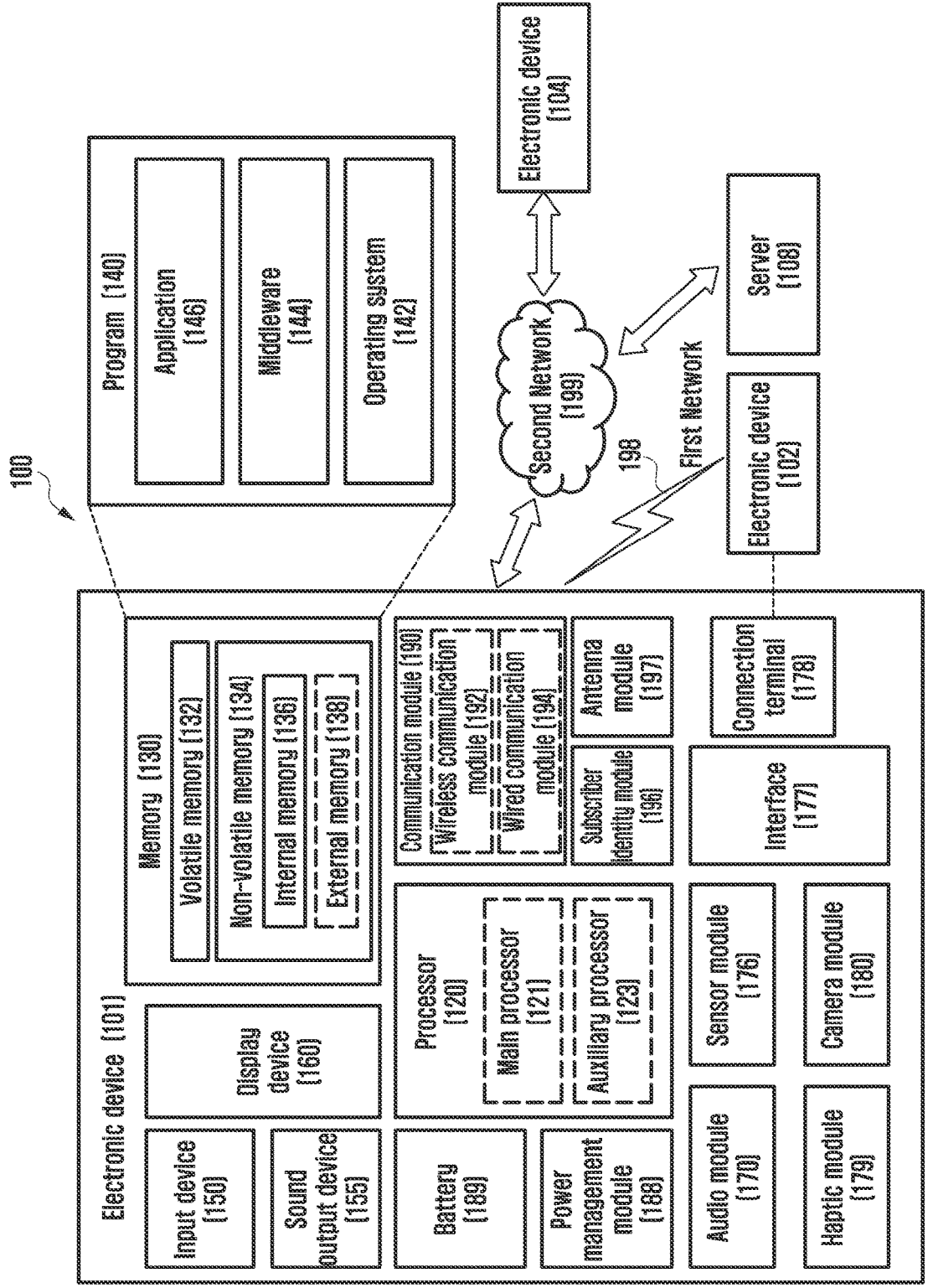
FIG. 1 is a block diagram illustrating an electronic device in a network environment according to an embodiment of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
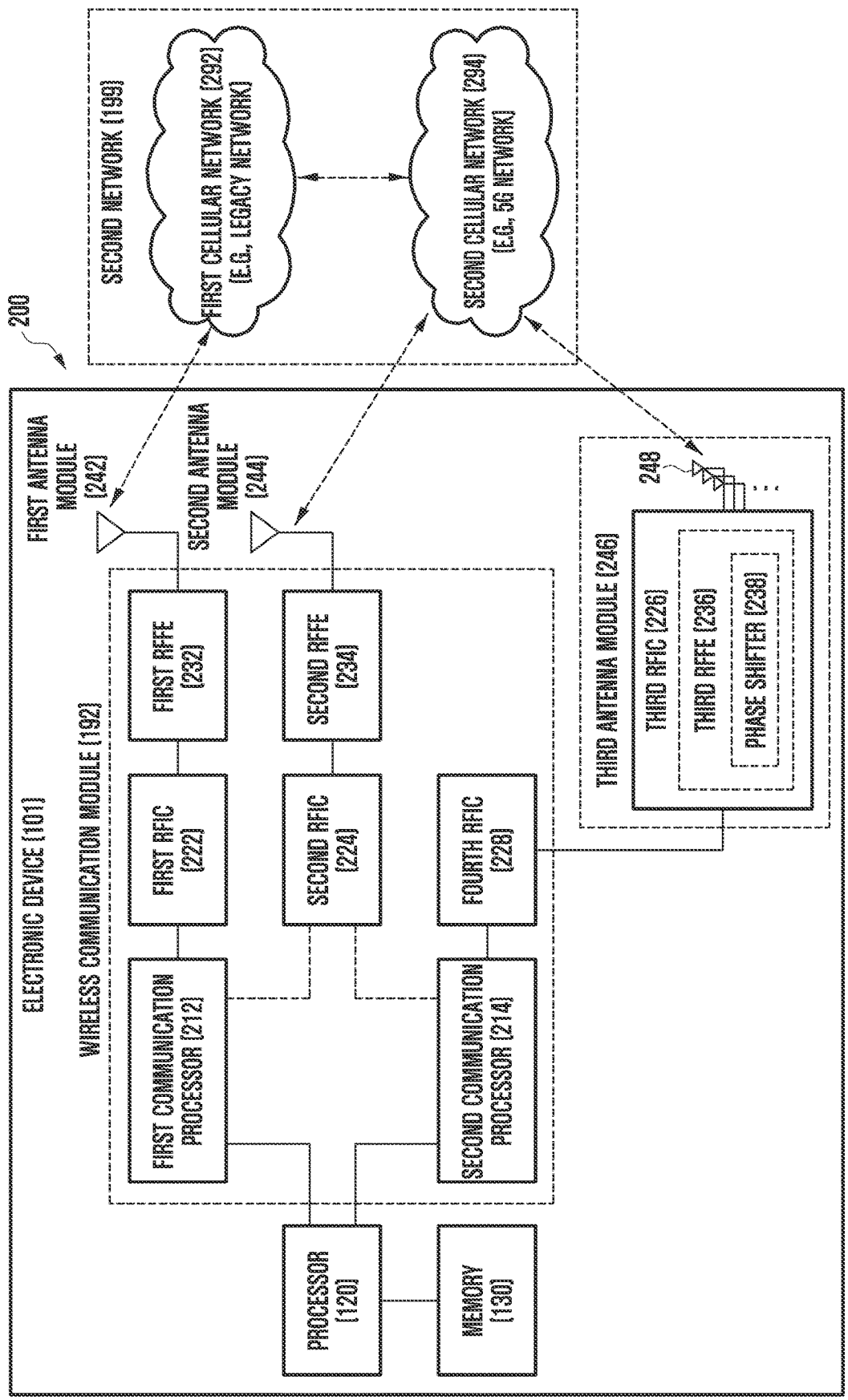
FIG. 2 is a block diagram illustrating an electronic device for supporting legacy network communication and 5G network communication according to an embodiment of the disclosure.

FIG. 2 is a block diagram illustrating an electronic device in a network environment including a plurality of cellular networks according to an embodiment of the disclosure.

Referring to FIG. 2, the electronic device 101 in a network environment 200 may include a first communication processor 212, second communication processor 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include the processor 120 and the memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through a third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3A:
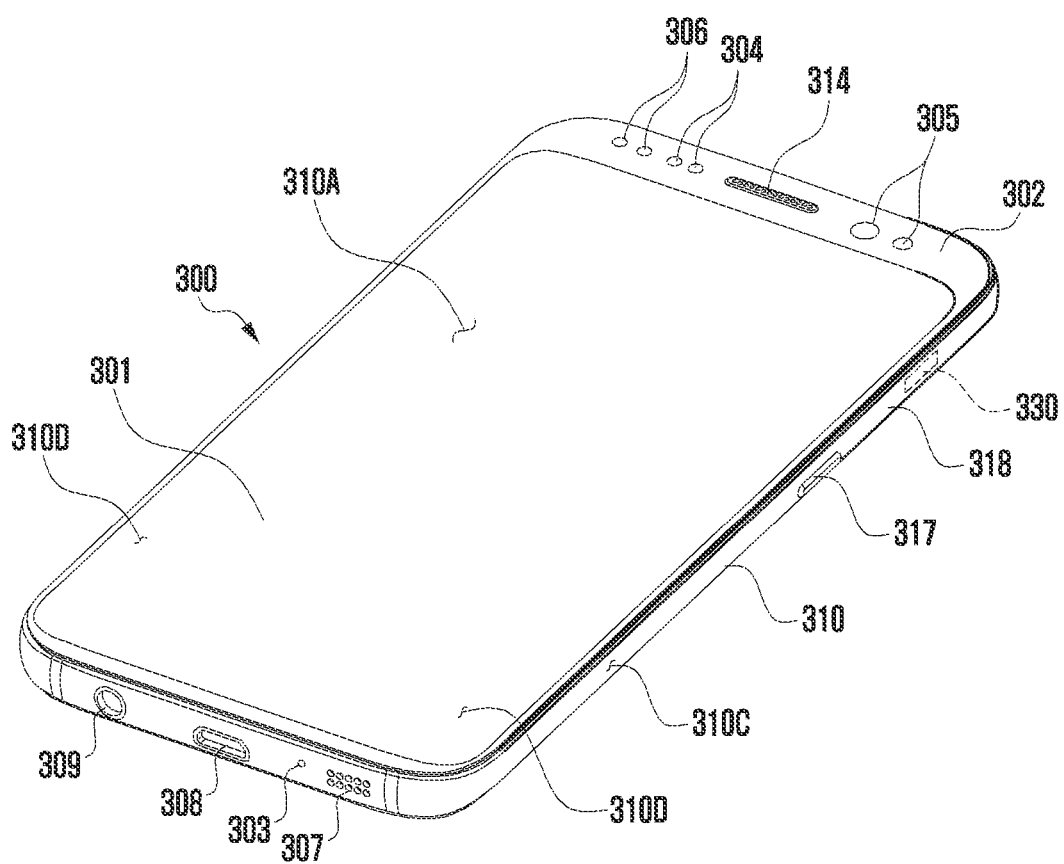
FIG. 3A is a perspective view illustrating a mobile electronic device according to an embodiment of the disclosure.

FIG. 3A is a front perspective view illustrating a mobile electronic device according to an embodiment of the disclosure.

Figure 3B:
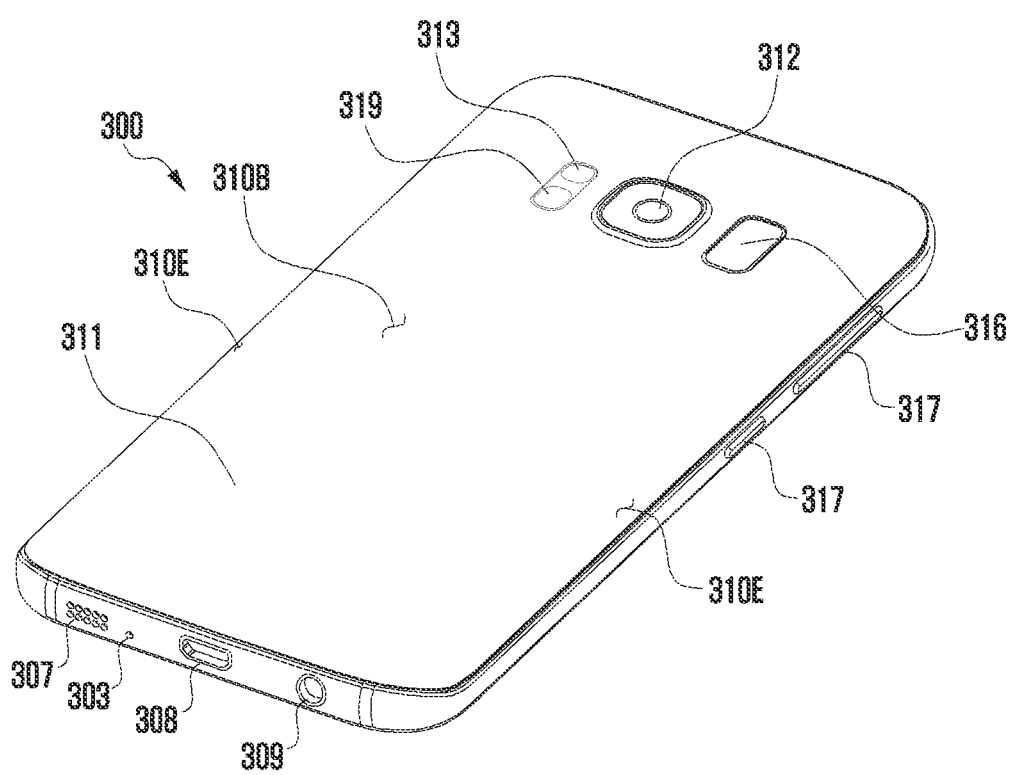
FIG. 3B is a perspective view illustrating a rear surface of a mobile electronic device according to an embodiment of the disclosure.

FIG. 3B is a rear perspective view illustrating a mobile electronic device according to an embodiment of the disclosure.

Referring to FIGS. 3A and 3B, a mobile electronic device 300 (e.g., the electronic device 101 of FIG. 1) according to various embodiments may include a housing 310 including a first surface (or front surface) 310A, a second surface (or rear surface) 310B, and a side surface 310C enclosing a space between the first surface 310A and the second surface 310B. In one embodiment (not illustrated), the housing may refer to a structure forming some of the first surface 310A, the second surface 310B, and the side surface 310C. According to one embodiment, the first surface 310A may be formed by an at least partially substantially transparent front plate 302 (e.g., a polymer plate or a glass plate including various coating layers). The second surface 310B may be formed by a substantially opaque rear plate 311. The rear plate 311 may be formed by, for example, coated or colored glass, ceramic, polymer, metal (e.g., aluminum, stainless steel (STS), or magnesium), or a combination of at least two of the above materials. The side surface 310C may be coupled to the front plate 302 and the rear plate 311 and be formed by a side bezel structure (or "side member") 318 including a metal and/or a polymer. In some embodiments, the rear plate 311 and the side bezel structure 318 may be integrally formed and include the same material (e.g., metal material such as aluminum).

In the illustrated embodiment, the front plate 302 may include two first regions 310D bent and extended seamlessly from the first surface 310A toward the rear plate 311 at both ends of a long edge of the front plate 302. In the illustrated embodiment (see FIG. 3B), the rear plate 311 may include two second regions 310E bent and extended seamlessly from the second surface 310B towards the front plate 302 at both ends of a long edge. In some embodiments, the front plate 302 (or the rear plate 311) may include only one of the first regions 310D (or the second regions 310E). In one embodiment, a portion of the first regions 310D or the second regions 310E may not be included. In the above embodiments, when viewed from the side surface of the mobile electronic device 300, the side bezel structure 318 may have a first thickness (or width) at a side surface in which the first region 310D or the second region 310E is not included and have a second thickness smaller than the first thickness at a side surface including the first region 310D or the second region 310E.

According to one embodiment, the mobile electronic device 300 may include at least one of a display 301; audio modules 303, 307, and 314; sensor modules 304, 316, and 319; camera modules 305, 312, and 313; key input device 317; light emitting element 306; and connector holes 308 and 309. In some embodiments, the mobile electronic device 300 may omit at least one (e.g., the key input device 317 or the light emitting element 306) of the components or may further include other components.

The display 301 may be exposed through, for example, a substantial portion of the front plate 302. In some embodiments, at least part of the display 301 may be exposed through the front plate 302 forming the first region 310D of the side surface 310C and the first surface 310A. In some embodiments, an edge of the display 301 may be formed to be substantially the same as an adjacent outer edge shape of the front plate 302. In one embodiment (not illustrated), in order to enlarge an area where the display 301 is exposed, a distance between an outer edge of the display 301 and an outer edge of the front plate 302 may be formed to be substantially the same.

In an embodiment (not illustrated), in a portion of a screen display area of the display 301, a recess or an opening may be formed, and at least one of the audio module 314 and the sensor module 304, the camera module 305, and the light emitting element 306 aligned with the recess or the opening may be included. In one embodiment (not illustrated), at a rear surface of a screen display area of the display 301, at least one of the audio module 314, the sensor module 304, the camera module 305, the fingerprint sensor module 316, and the light emitting element 306 may be included. In one embodiment (not illustrated), the display 301 may be coupled to or disposed adjacent to a touch detection circuit, a pressure sensor capable of measuring intensity (pressure) of the touch, and/or a digitizer for detecting a stylus pen of a magnetic field method. In some embodiments, at least part of the sensor modules 304 and 319 and/or at least part of the key input device 317 may be disposed in a first region 310D and/or a second region 310E.

The audio modules 303, 307, and 314 may include a microphone hole 303 and speaker holes 307 and 314. The microphone hole 303 may dispose a microphone for obtaining an external sound therein; and, in some embodiments, a plurality of microphones may be disposed to detect a direction of a sound. The speaker holes 307 and 314 may include an external speaker hole 307 and a call receiver hole 314. In some embodiments, the speaker holes 307 and 314 and the microphone hole 303 may be implemented into one hole, or the speaker may be included without the speaker holes 307 and 314 (e.g., piezo speaker).

The sensor modules 304, 316, and 319 may generate an electrical signal or a data value corresponding to an operating state inside the mobile electronic device 300 or an environment state outside the mobile electronic device 300. The sensor modules 304, 316, and 319 may include, for example, a first sensor module 304 (e.g., proximity sensor) and/or a second sensor module (not illustrated) (e.g., fingerprint sensor), disposed at the first surface 310A of the housing 310, and/or a third sensor module 319 (e.g., a heart rate monitor (FIRM) sensor) and/or a fourth sensor module 316 (e.g., fingerprint sensor), disposed at the second surface 310B of the housing 310. The fingerprint sensor may be disposed at the second surface 310B as well as the first surface 310A (e.g., the display 301) of the housing 310. The mobile electronic device 300 may further include a sensor module (not illustrated), for example, at least one of a gesture sensor, gyro sensor, air pressure sensor, magnetic sensor, acceleration sensor, grip sensor, color sensor, IR sensor, biometric sensor, temperature sensor, humidity sensor, and illumination sensor 304.

The camera modules 305, 312, and 313 may include a first camera device 305 disposed at the first surface 310A of the mobile electronic device 300, a second camera device 312 disposed at the second surface 310B thereof, and/or a flash 313. The camera modules 305 and 312 may include one or a plurality of lenses, an image sensor, and/or an image signal processor. The flash 313 may include, for example, a light emitting diode or a xenon lamp. In some embodiments, two or more lenses (infrared camera, wide angle and telephoto lens) and image sensors may be disposed at one surface of the mobile electronic device 300.

The key input device 317 may be disposed at the side surface 310C of the housing 310. In one embodiment, the mobile electronic device 300 may not include some or all of the above-described key input devices 317, and the key input device 317 that is not included may be implemented in other forms such as a soft key on the display 301. In some embodiments, the key input device 317 may include a sensor module 316 disposed at the second surface 310B of the housing 310.

The light emitting element 306 may be disposed at, for example, the first surface 310A of the housing 310. The light emitting element 306 may provide, for example, status information of the mobile electronic device 300 in an optical form. In one embodiment, the light emitting element 306 may provide, for example, a light source interworking with an operation of the camera module 305. The light emitting element 306 may include, for example, a light emitting diode (LED), an IR LED, and a xenon lamp.

The connector ports 308 and 309 may include a first connector port 308 that may receive a connector (e.g., a USB connector) for transmitting and receiving power and/or data to and from an external electronic device and/or a second connector hole (e.g., earphone jack) 309 that can receive a connector for transmitting and receiving audio signals to and from an external electronic device.

Figure 3C:
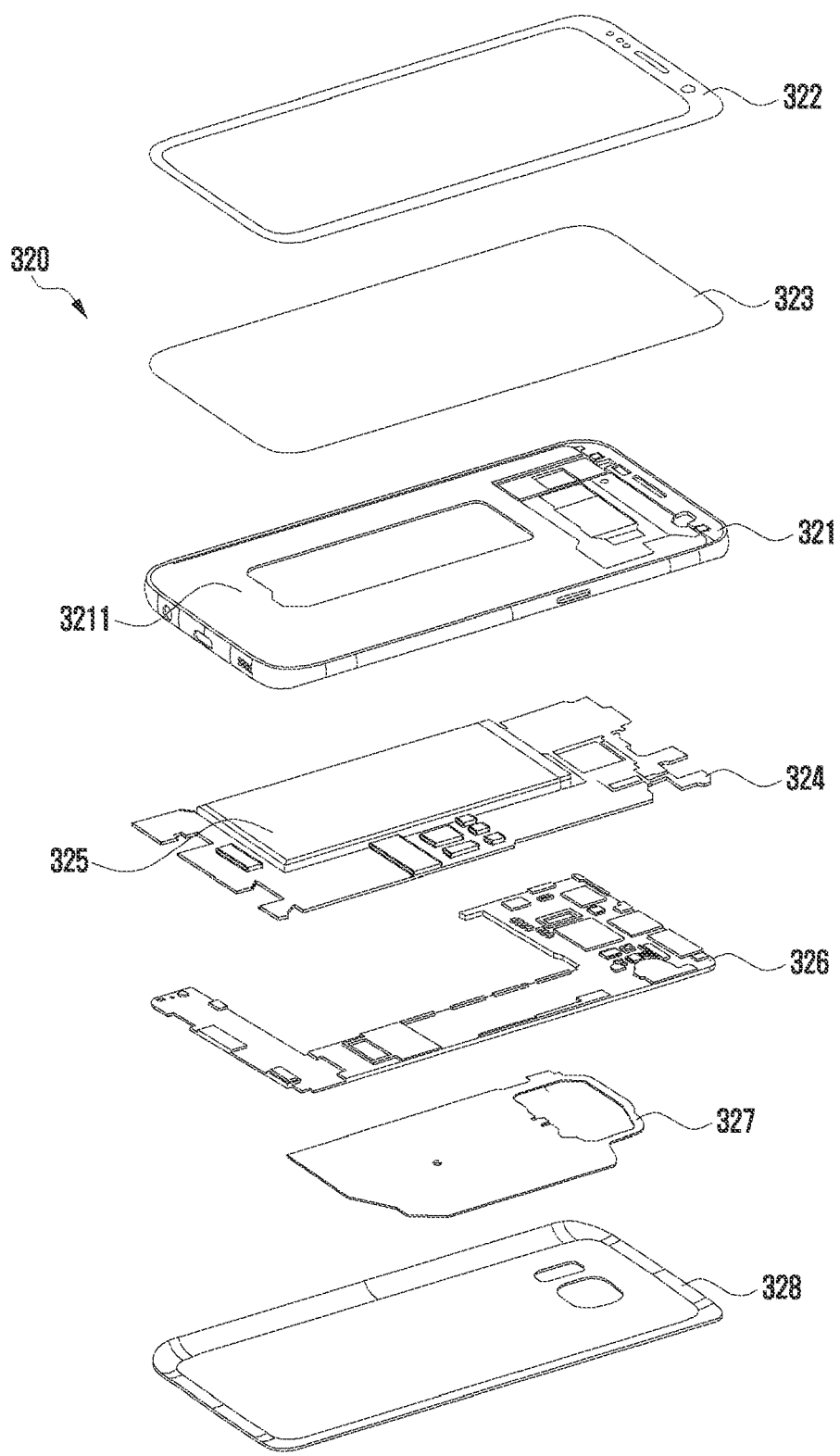
FIG. 3C is an exploded perspective view illustrating a mobile electronic device according to an embodiment of the disclosure.

FIG. 3C is an exploded perspective view illustrating a mobile electronic device according to an embodiment of the disclosure.

Referring to FIG. 3C, a mobile electronic device 320 (e.g., the mobile electronic device 300 of FIG. 3A) may include a side bezel structure 321, first support member 3211 (e.g., bracket), front plate 322, display 323, printed circuit board 324, battery 325, second support member 326 (e.g., rear case), antenna 327, and rear plate 328. In some embodiments, the electronic device 320 may omit at least one (e.g., the first support member 3211 or the second support member 326) of the components or may further include other components. At least one of the components of the electronic device 320 may be the same as or similar to at least one of the components of the mobile electronic device 300 of FIG. 3A or 3B and a duplicated description is omitted below.

The first support member 3211 may be disposed inside the electronic device 320 to be connected to the side bezel structure 321 or may be integrally formed with the side bezel structure 321. The first support member 3211 may be made of, for example, a metal material and/or a non-metal (e.g., polymer) material. In the first support member 3211, the display 323 may be coupled to one surface thereof, and the printed circuit board 324 may be coupled to the other surface thereof. In the printed circuit board 324, a processor, a memory, and/or an interface may be mounted. The processor may include, for example, one or more of a central processing unit, application processor, graphic processing unit, image signal processor, sensor hub processor, or communication processor.

The memory may include, for example, a volatile memory or a nonvolatile memory.

The interface may include, for example, a HDMI, USB interface, SD card interface, and/or audio interface. The interface may, for example, electrically or physically connect the electronic device 320 to an external electronic device and include a USB connector, an SD card/multimedia card (MMC) connector, or an audio connector.

The battery 325 is a device for supplying power to at least one component of the electronic device 320 and may include, for example, a non-rechargeable primary battery, a rechargeable secondary battery, or a fuel cell. At least part of the battery 325 may be disposed, for example, on substantially the same plane as that of the printed circuit board 324. The battery 325 may be integrally disposed inside the electronic device 320 or may be detachably disposed in the electronic device 320.

The antenna 327 may be disposed between the rear plate 328 and the battery 325. The antenna 327 may include, for example, a near field communication (NFC) antenna, wireless charging antenna, and/or magnetic secure transmission (MST) antenna. The antenna 327 may perform, for example, short range communication with an external device or may wirelessly transmit and receive power required for charging. In one embodiment, an antenna structure may be formed by some or a combination of the side bezel structure 321 and/or the first support member 3211.

According to one embodiment, the electronic device (e.g., an electronic device (300) of FIG. 3A) may include at least one through hole (e.g., a through hole (330) of FIG. 3A) disposed in at least a portion of the side bezel structure 321. The through hole (e.g., a through hole (330) of FIG. 3A) may be filled with non-conductive material. The through hole (e.g., a through hole (330) of FIG. 3A) exposed to the outside of the side bezel structure 321 may be filled with the non-conductive material and be processed not to be visually identified by opaque paint.

Figure 4A:
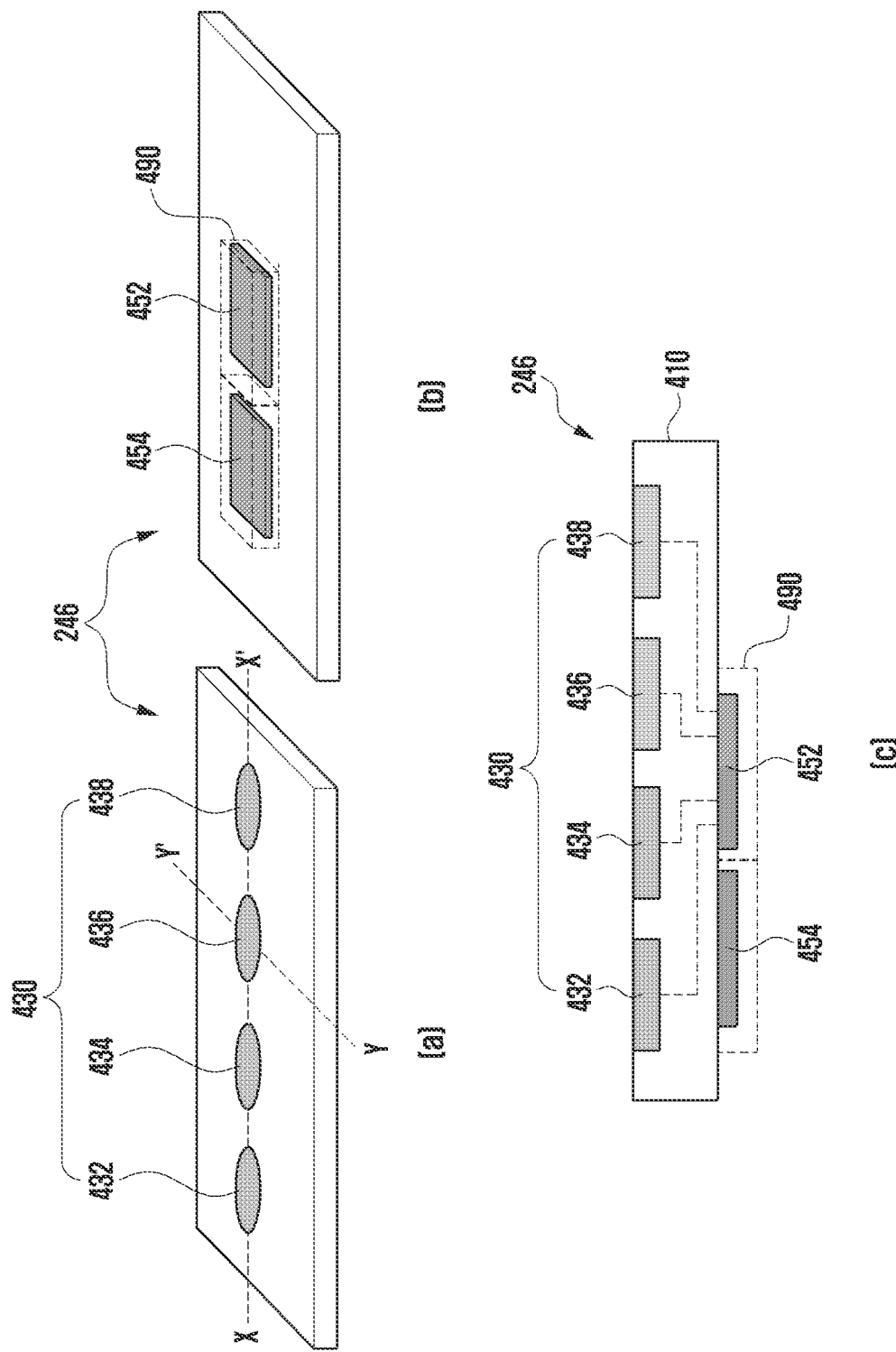
FIG. 4A is a diagram illustrating an embodiment of a structure of a third antenna module described with reference to FIG. 2 according to an embodiment of the disclosure.

FIG. 4A is a diagram illustrating a structure of, for example, a third antenna module described with reference to FIG. 2 according to an embodiment of the disclosure.

Referring to FIG. 4A, (a) is a perspective view illustrating the third antenna module 246 viewed from one side, and (b) is a perspective view illustrating the third antenna module 246 viewed from the other side. Further, (c) is a cross-sectional view illustrating the third antenna module 246 taken along line X-X' of FIG. 4A.

With reference to FIG. 4A, in one embodiment, the third antenna module 246 may include a printed circuit board 410, an antenna array 430, an RFIC 452, and a PMIC 454. Alternatively, the third antenna module 246 may further include a shield member 490. In other embodiments, at least one of the above-described components may be omitted or at least two of the components may be integrally formed.

The printed circuit board 410 may include a plurality of conductive layers and a plurality of non-conductive layers stacked alternately with the conductive layers. The printed circuit board 410 may provide electrical connections between the printed circuit board 410 and/or various electronic components disposed outside using wirings and conductive vias formed in the conductive layer.

The antenna array 430 (e.g., 248 of FIG. 2) may include a plurality of antenna elements 432, 434, 436, or 438 disposed to form a directional beam. As illustrated, the antenna elements 432, 434, 436, or 438 may be formed at a first surface of the printed circuit board 410. According to another embodiment, the antenna array 430 may be formed inside the printed circuit board 410. According to the embodiment, the antenna array 430 may include the same or a different shape or kind of a plurality of antenna arrays (e.g., dipole antenna array and/or patch antenna array).

The RFIC 452 (e.g., the third RFIC 226 of FIG. 2) may be disposed at another area (e.g., a second surface opposite to the first surface) of the printed circuit board 410 spaced apart from the antenna array. The RFIC 452 is configured to process signals of a selected frequency band transmitted/received through the antenna array 430. According to one embodiment, upon transmission, the RFIC 452 may convert a baseband signal obtained from a communication processor (not shown) to an RF signal of a designated band. Upon reception, the RFIC 452 may convert an RF signal received through the antenna array 430 to a baseband signal and transfer the baseband signal to the communication processor.

According to another embodiment, upon transmission, the RFIC 452 may up-convert an IF signal (e.g., about 9 GHz to about 11 GHz) obtained from an intermediate frequency integrate circuit (IFIC) (e.g., 228 of FIG. 2) to an RF signal of a selected band. Upon reception, the RFIC 452 may down-convert the RF signal obtained through the antenna array 430, convert the RF signal to an IF signal, and transfer the IF signal to the IFIC.

The PMIC 454 may be disposed in another partial area (e.g., the second surface) of the printed circuit board 410 spaced apart from the antenna array 430. The PMIC 454 may receive a voltage from a main PCB (not illustrated) to provide power necessary for various components (e.g., the RFIC 452) on the antenna module.

The shielding member 490 may be disposed at a portion (e.g., the second surface) of the printed circuit board 410 so as to electromagnetically shield at least one of the RFIC 452 or the PMIC 454. According to one embodiment, the shield member 490 may include a shield can.

Although not shown, in various embodiments, the third antenna module 246 may be electrically connected to another printed circuit board (e.g., main circuit board) through a module interface. The module interface may include a connecting member, for example, a coaxial cable connector, board to board connector, interposer, or flexible printed circuit board (FPCB). The RFIC 452 and/or the PMIC 454 of the antenna module may be electrically connected to the printed circuit board through the connection member.

Figure 4B:
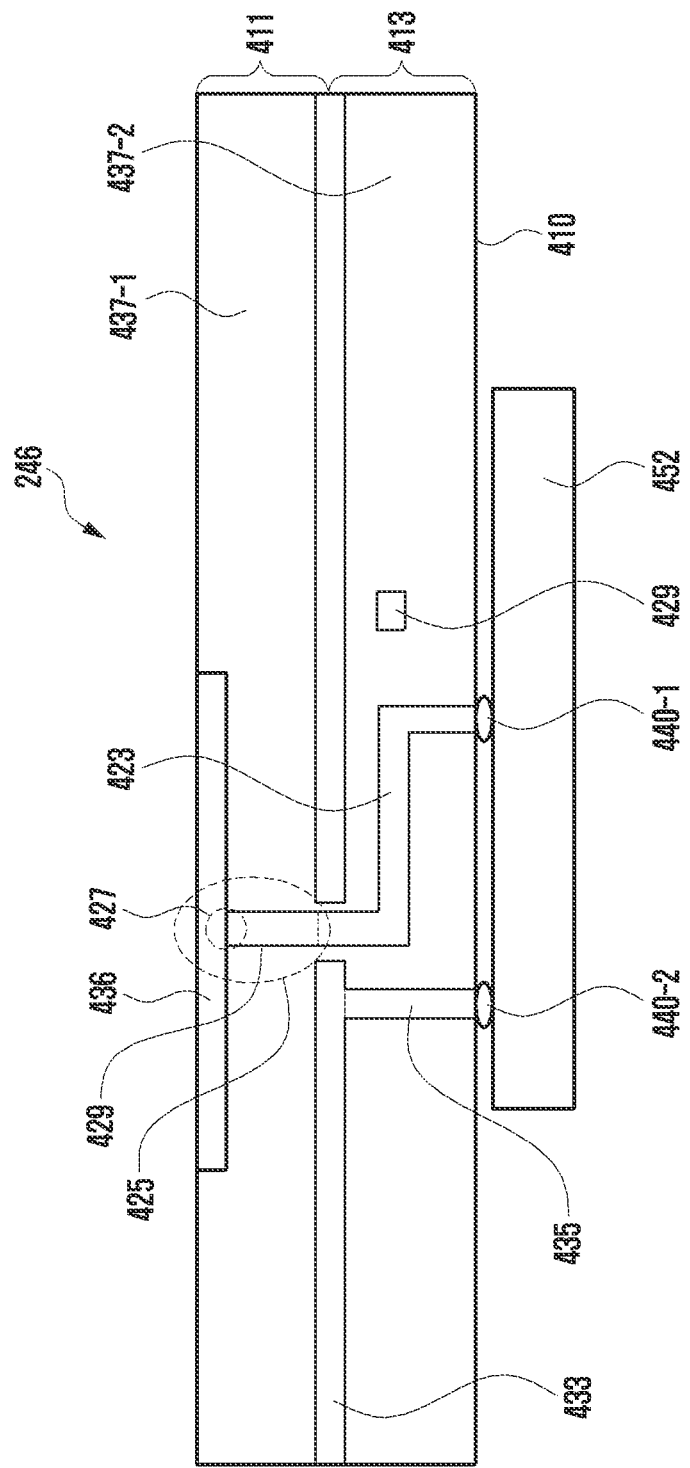
FIG. 4B is a cross-sectional view illustrating the third antenna module taken along line Y-Y' of FIG. 4A according to an embodiment of the disclosure.

FIG. 4B is a cross-sectional view illustrating the third antenna module taken along line Y-Y' of FIG. 4A according to an embodiment of the disclosure.

The printed circuit board 410 of the illustrated embodiment may include an antenna layer 411 and a network layer 413 according to an embodiment of the disclosure.

Referring to FIG. 4B, the antenna layer 411 may include at least one dielectric layer 437-1, and the antenna element 436 and/or a power feeding portion 425 formed on or inside an outer surface of a dielectric layer. The power feeding portion 425 may include a power feeding point 427 and/or a power feeding line 429.

The network layer 413 may include at least one dielectric layer 437-2, at least one ground layer 433, at least one conductive via 435, a transmission line 423, and/or a power feeding line 429 formed on or inside an outer surface of the dielectric layer.

Further, in the illustrated embodiment, the RFIC 452 (e.g., the third RFIC 226 of FIG. 2) of (c) may be electrically connected to the network layer 413 through, for example, first and second solder bumps 440-1 and 440-2. In other embodiments, various connection structures (e.g., solder or ball grid array (BGA)) instead of the solder bumps may be used. The RFIC 452 may be electrically connected to the antenna element 436 through the first solder bump 440-1, the transmission line 423, and the power feeding portion 425. The RFIC 452 may also be electrically connected to the ground layer 433 through the second solder bump 440-2 and the conductive via 435. Although not illustrated, the RFIC 452 may also be electrically connected to the above-described module interface through the power feeding line 429.

Figure 8:
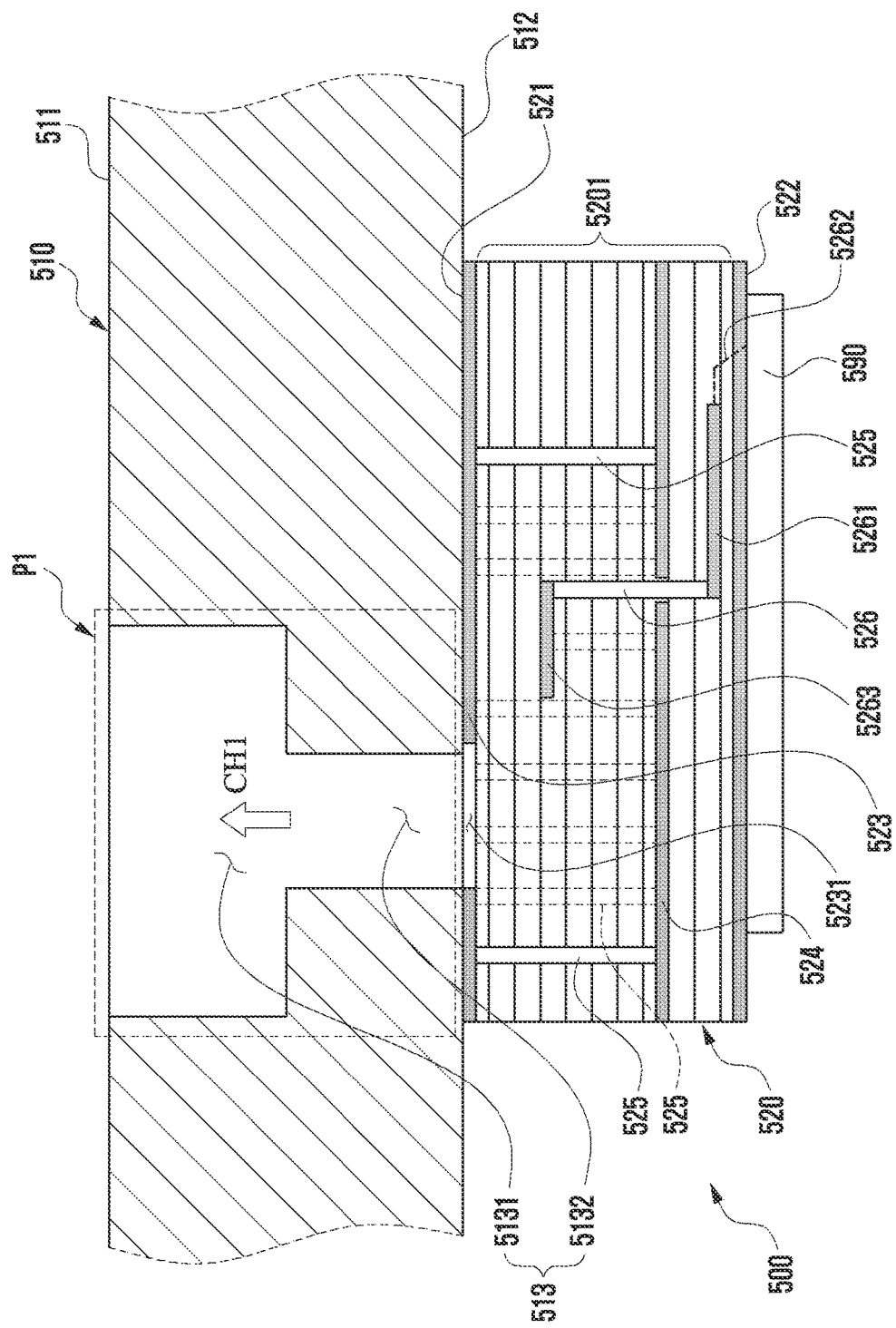
FIG. 8 is a cross-sectional view illustrating a coupled state of an antenna module according to an embodiment of the disclosure.

According to various embodiments, at least some components of the third antenna module 246 of FIGS. 4A and 4B may be designed to a structure substantially corresponding to at least some components of an antenna module 500 of FIG. 8 according to an embodiment of the disclosure. For example, the antenna array 430 of FIG. 4A may correspond to a horn structure including a through hole 513 of FIG. 8, and in order to include a conductive line 526 of FIG. 8, a feeding portion 425 of FIG. 4B may correspond to a substrate integrated waveguide (SIW) structure formed by a plurality of conductive vias 525.

Figure 5A:
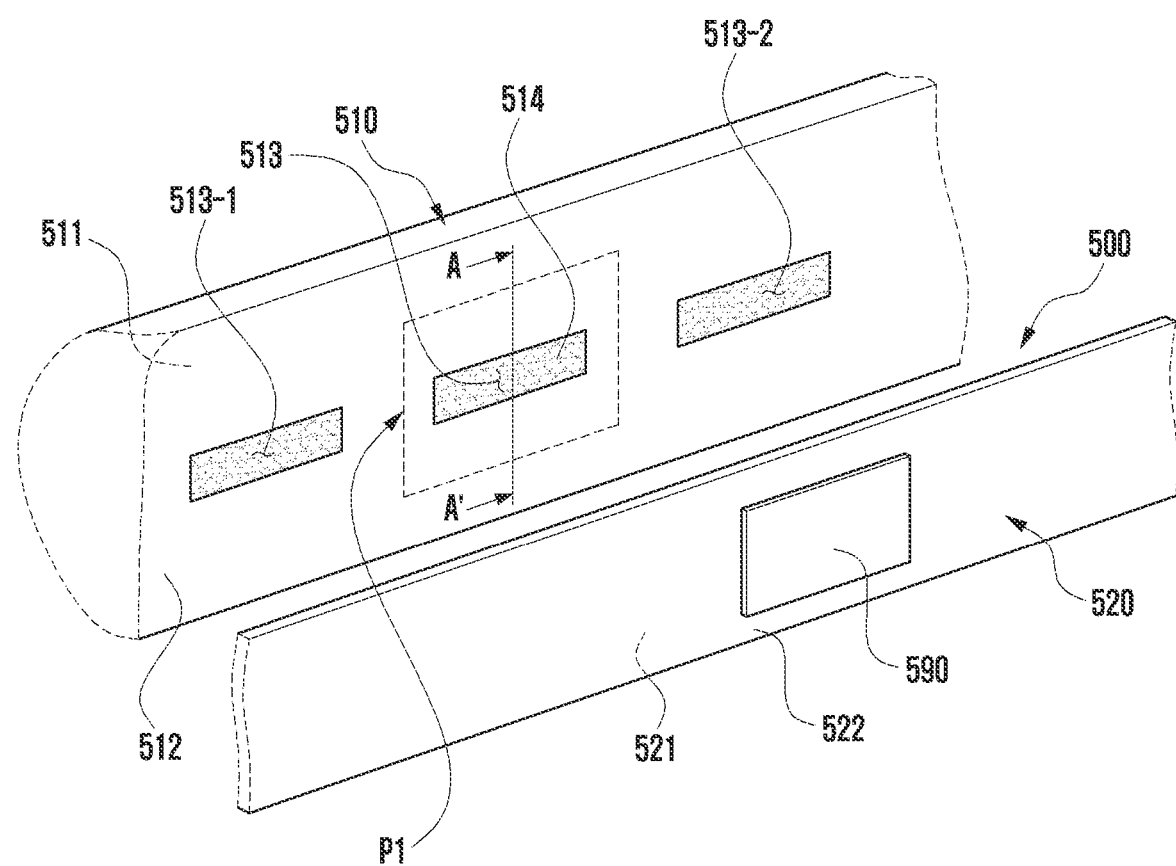
FIG. 5A is a diagram illustrating a separated state of an antenna module according to an embodiment of the disclosure.

FIG. 5A is a diagram illustrating a separated state of an antenna module according to an embodiment of the disclosure.

Figure 5B:
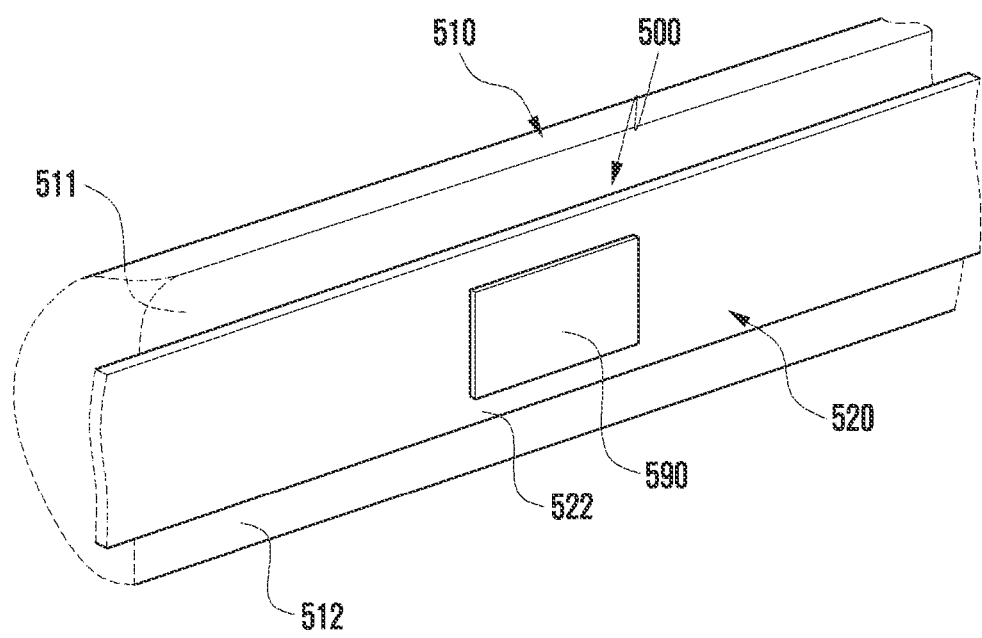
FIG. 5B is a diagram illustrating a coupled state of an antenna module according to an embodiment of the disclosure.

FIG. 5B is a diagram illustrating a coupled state of an antenna module according to an embodiment of the disclosure.

An antenna module 500 of FIG. 5A may be at least partially similar to the third antenna module 246 of FIG. 2 or may further include other components.

With reference to FIGS. 5A and 5B, an electronic device (e.g., the electronic device 300 of FIG. 3A) may include a side member 510 having at least a portion made of a conductive material and an antenna module 500 disposed to face the side member 510 in an internal space of the electronic device (e.g., the electronic device 300 of FIG. 3A). According to one embodiment, the side member 510 may include a first surface 511 facing the outside (e.g., the outside of the electronic device) of a housing (e.g., the housing 310 of FIG. 3A) and a second surface 512 facing in a direction (e.g., an internal space of the electronic device) opposite to that of the first surface 511. According to an embodiment, the side member 510 may include a plurality of through holes 513, 513-1, and 513-2 extended from the first surface 511 to the second surface 512 and disposed at regular intervals. According to one embodiment, the through holes 513, 513-1, and 513-2 are illustrated in three locations, but may be disposed at two or four or more locations.

Hereinafter, for convenience of description, one through hole 513 disposed in a first portion P1 of the side member 510 is described, but the remaining through holes 513-1 and 513-2 and a feeding structure of the antenna module 500 corresponding thereto may also have substantially the same configuration.

According to various embodiments, the through hole 513 may include a first opening (e.g., a first opening 5131 of FIG. 6A) formed on the first surface 511 and having a first size when the housing (e.g., the housing 310 of FIG. 3A) is viewed from the outside and a second opening (e.g., a second opening 5132 of FIG. 6A) formed on the second surface 512 and having a second size smaller than the first size when the housing (e.g., the housing 310 of FIG. 3A) is viewed from the outside. According to one embodiment, the through hole 513 may be filled with a first non-conductive material 514. According to an embodiment, the first non-conductive material 514 may include a dielectric material (e.g., polycarbonate (PC)) in which a liquid or semi-solid material is filled and solidified in the through hole 513. According to one embodiment, the through hole 513 exposed to the outside of the side member 510 may be filled with the first non-conductive material 514 and be processed not to be visually identified by opaque paint.

According to various embodiments, the antenna module 500 may be disposed at an internal space of an electronic device (e.g., the electronic device 300 of FIG. 3A). According to an embodiment, the antenna module 500 may be disposed such that a beam pattern is formed in a direction of a side surface (e.g., the side surface 310C of FIG. 3A) of the electronic device (e.g., the electronic device 300 of FIG. 3A). In another embodiment, the antenna module 500 may be disposed so that a beam pattern is formed toward at least a portion of a rear plate (e.g., the rear plate 311 of FIG. 3B) (e.g., second plate) or a front plate (e.g., the front plate 302 of FIG. 3A) (e.g., first plate) of the electronic device (e.g., the electronic device 300 of FIG. 3A). According to an embodiment, the antenna module 500 may include a printed circuit board 520 (e.g., structure) disposed at an internal space of the electronic device (e.g., the electronic device 300 of FIG. 3A) and a wireless communication circuit 590 disposed in the printed circuit board 520. According to an embodiment, the antenna module 500 may be disposed to face at least a first portion P1 having a wireless signal waveguide structure through the through hole 513 of the side member 510 including a conductive material.

According to various embodiments, the printed circuit board 520 may include a third surface 521 facing the second surface 512 and a fourth surface 522 facing in a direction opposite to that of the third surface 521. According to an embodiment, when the printed circuit board 520 is disposed at the side member 510, the second surface 512 and the third surface 521 may be disposed to face each other.

According to various embodiments, a wireless communication circuit 590 may be disposed at the fourth surface 522 of the printed circuit board 520. According to one embodiment, the wireless communication circuit 590 may be disposed inside the electronic device (e.g., the electronic device 300 of FIG. 3A) instead of the printed circuit board 520 and be electrically connected to the printed circuit board 520 through a conductive cable (e.g., flexible printed circuit board (FPCB)). According to an embodiment, the wireless communication circuit 590 may be configured to transmit and/or receive a signal having a frequency in the range of 3 GHz to 100 GHz through the antenna module 500 and the through hole 513. According to an embodiment, the printed circuit board 520 may include a slot (e.g., a slot 5231 of FIG. 7A) disposed at the third surface 521 and facing the through hole 513. According to an embodiment, although not shown, the electronic device (e.g., the electronic device 300 of FIG. 3A) may have a coupling structure in which a slot (e.g., the slot 5231 of FIG. 7A) of the printed circuit board 520 faces the through hole 513 of the side member 510. For example, the printed circuit board 520 may include a plurality of slots that may face each other at positions corresponding to the plurality of through holes 513, 513-1, and 513-2, respectively, disposed at the side member 510. In another embodiment, the electronic device may include at least two printed circuit boards having at least one slot so as to correspond to each of the plurality of through holes 513, 513-1, and 513-2 disposed in the side member 510. In another embodiment, in an area including the through hole 513 of the second surface 512 of the side member 510, a stepped recess lower than the second surface 512 may be formed, and by only an operation of seating the printed circuit board 520 in the recess, the slot (e.g., the slot 5231 of FIG. 7A) may be guided to face the through hole 513. In another embodiment, when a feeding structure is disposed at a structure (e.g., dielectric structure) instead of the printed circuit board 520, by forming a protruding portion in at least one of the structure and the side member 510 and by forming a recess in a relative member corresponding thereto, the slot (e.g., the slot 5231 of FIG. 7A) and may be guided to face the through hole 513 only by an operation of inserting the protruding portion into the recess.

FIGS. 6A, 6B, 6C, 6D, 6E, 6F, 6G and 6H are cross-sectional views illustrating various shapes of a through hole viewed from line A-A' of FIG. 5A according to various embodiments of the disclosure.

Figure 6A:
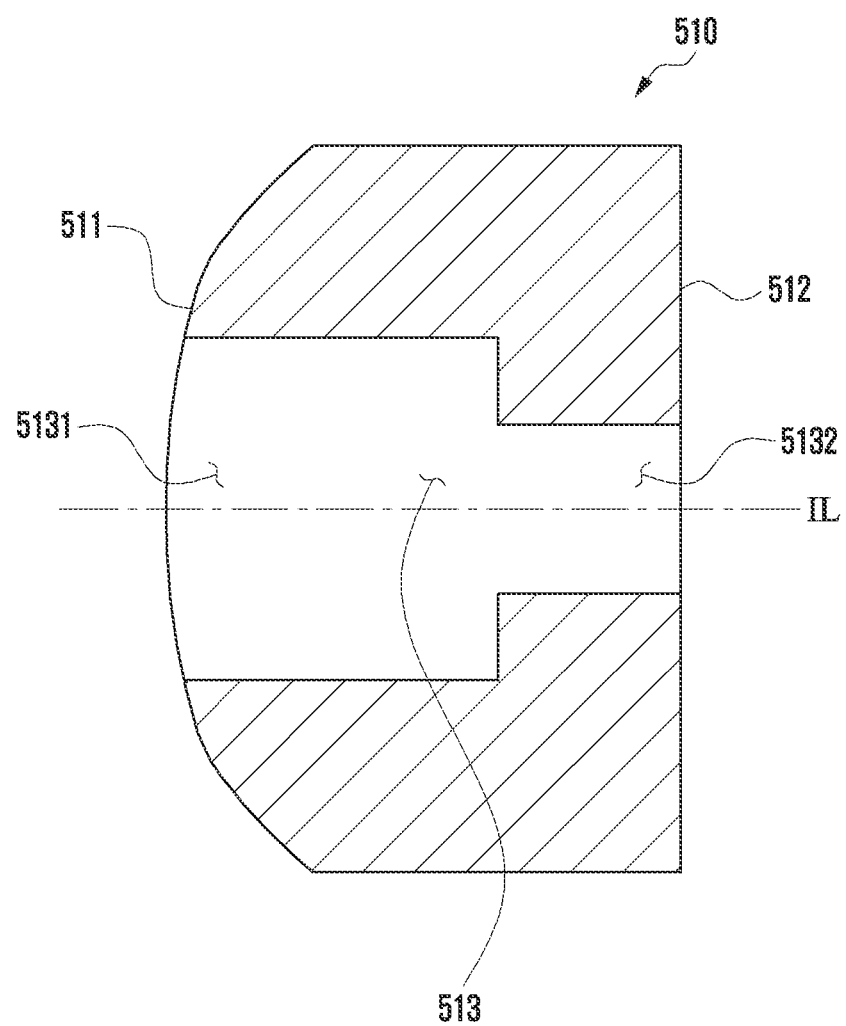
FIGS. 6A, 6B, 6C, 6D, 6E, 6F, 6G and 6H are cross-sectional views illustrating various shapes of a through hole viewed from line A-A' of FIG. 5A according to various embodiments of the disclosure.

Referring to FIG. 6A, the side member 510 may include a through hole 513 formed from the first surface 511 to the second surface 512. According to one embodiment, the through hole 513 may include the first opening 5131 close to the first surface 511 and having a first size and a second opening 5132 extended from the first opening 5131 and close to the second surface 512 and having a second size smaller than the first size. According to an embodiment, the through hole 513 may be formed in a stepped shape at a boundary portion between the first opening 5131 and the second opening 5132. According to one embodiment, the through hole 513 may be formed symmetrically based on a virtual center line IL.

Figure 6B:
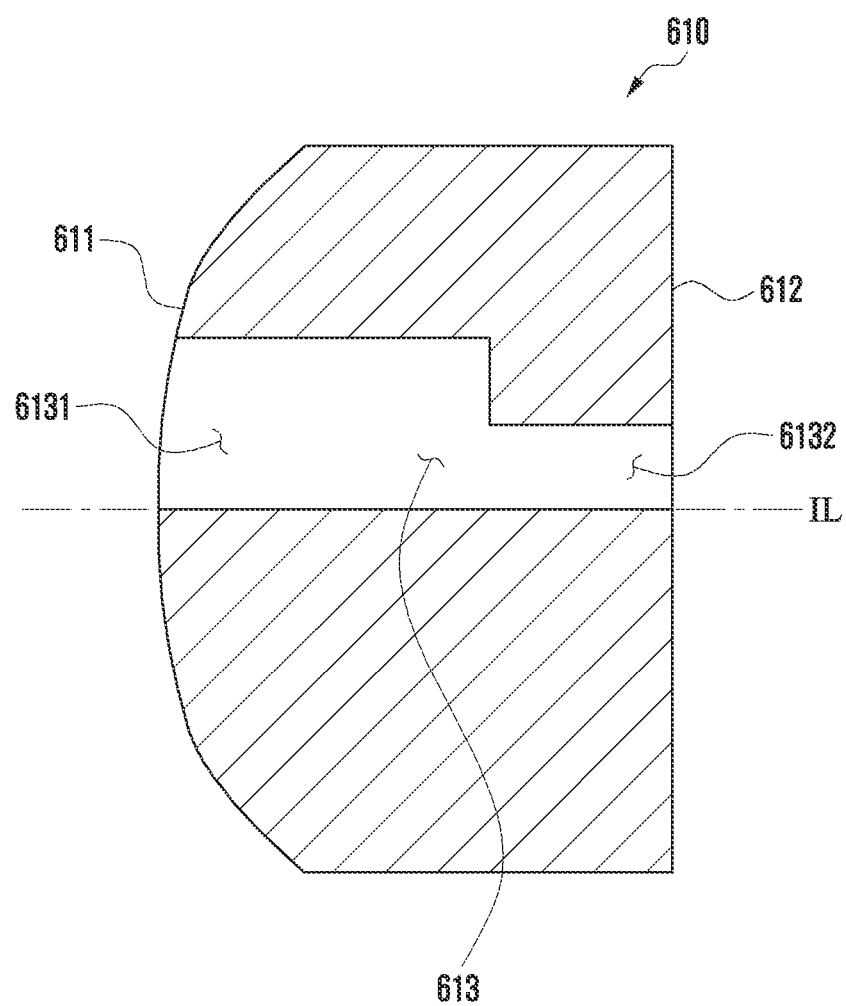

Referring to FIG. 6B, a side member 610 may include a through hole 613 formed from a first surface 611 to a second surface 612. According to one embodiment, the through hole 613 may include a first opening 6131 close to the first surface 611 and having a first size and a second opening 6132 extended from the first opening 6131 and close to the second surface 612 and having a second size smaller than the first size. According to an embodiment, the through hole 613 may be formed in only one side surface based on a virtual center line IL from the same shape as that of the through hole 513 of FIG. 6A.

Figure 6C:
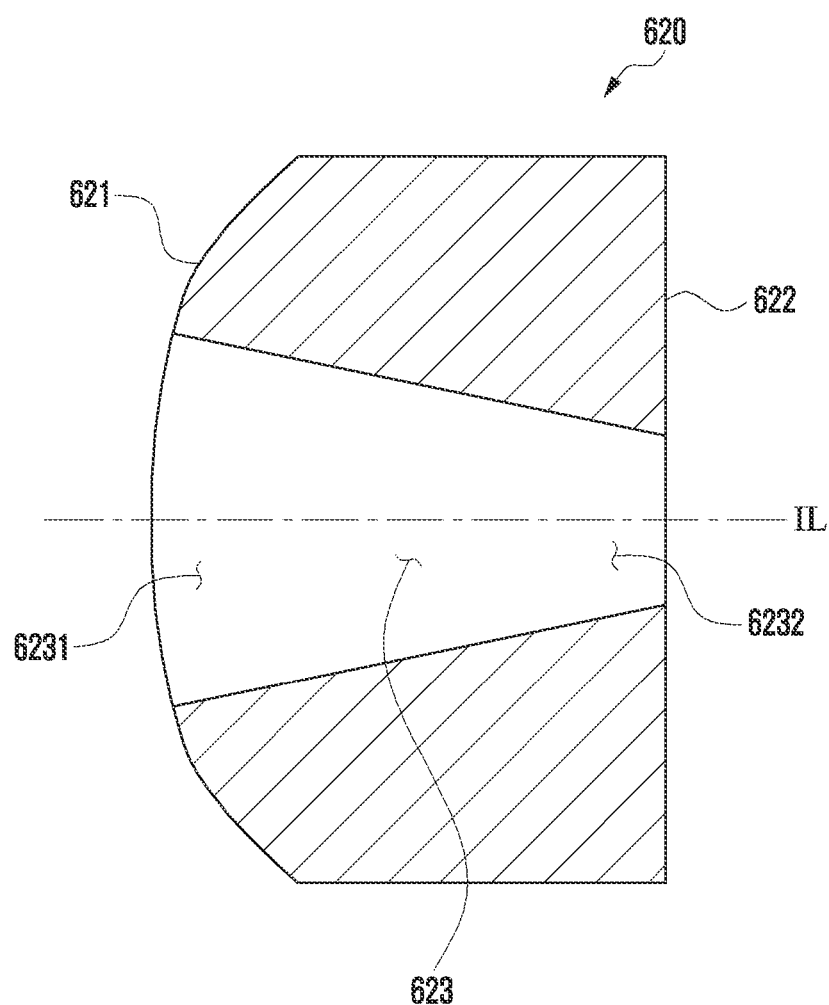

Referring to FIG. 6C, a side member 620 may include a through hole 623 formed from a first surface 621 to a second surface 622. According to one embodiment, the through hole 623 may include a first opening 6231 close to the first surface 621 and having a first size and a second opening 6232 extended from the first opening 6231 and close to the second surface 622 and having a second size smaller than the first size. According to an embodiment, the through hole 623 may be formed in a tapered shape having a gradually reducing width as advancing from the first opening 6231 to the second opening 6232. According to one embodiment, the through hole 623 may be formed symmetrically based on a virtual center line IL.

Figure 6D:
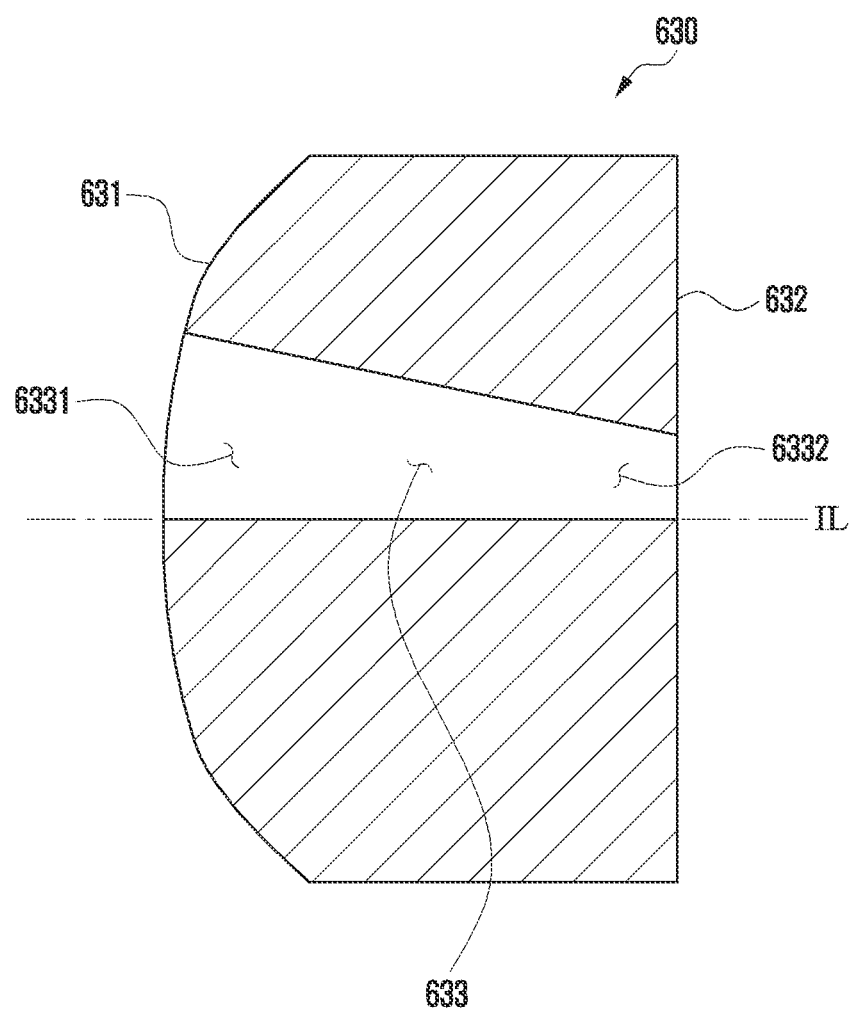

Referring to FIG. 6D, a side member 630 may include a through hole 633 formed from a first surface 631 to a second surface 632. According to one embodiment, the through hole 633 may include a first opening 6331 close to the first surface 631 and having a first size and a second opening 6332 extended from the first opening 6331 and close to a second surface 632 and having a second size smaller than the first size. According to an embodiment, the through hole 633 may be formed in only one side based on a virtual center line IL from the same shape as that of the through hole 623 of FIG. 6C.

Figure 6E:
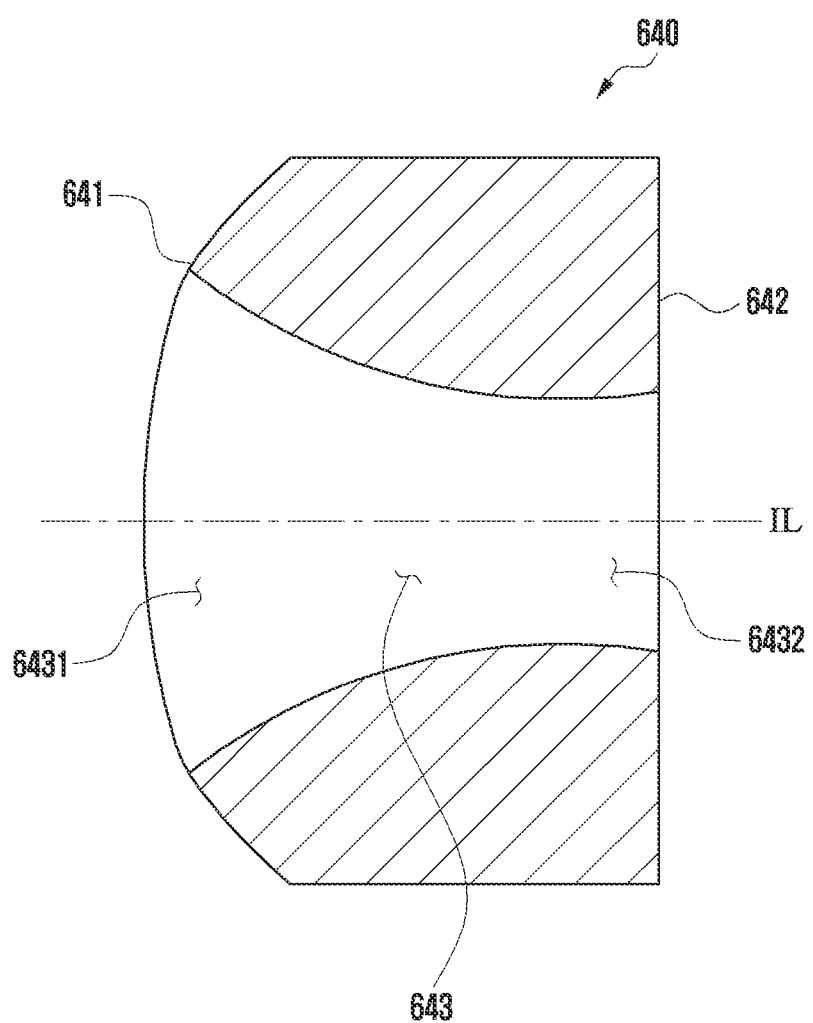

Referring to FIG. 6E, a side member 640 may include a through hole 643 formed from a first surface 641 to a second surface 642. According to one embodiment, the through hole 643 may include a first opening 6431 close to the first surface 641 and having a first size and a second opening 6432 extended from the first opening 6431 and close to the second surface 642 and having a second size smaller than the first size. According to an embodiment, the through hole 643 may be formed in a curved shape having a gradually reducing width as advancing from the first opening 6431 to the second opening 6432. According to an embodiment, the through hole 643 may be formed symmetrically based on a virtual center line IL.

Figure 6F:
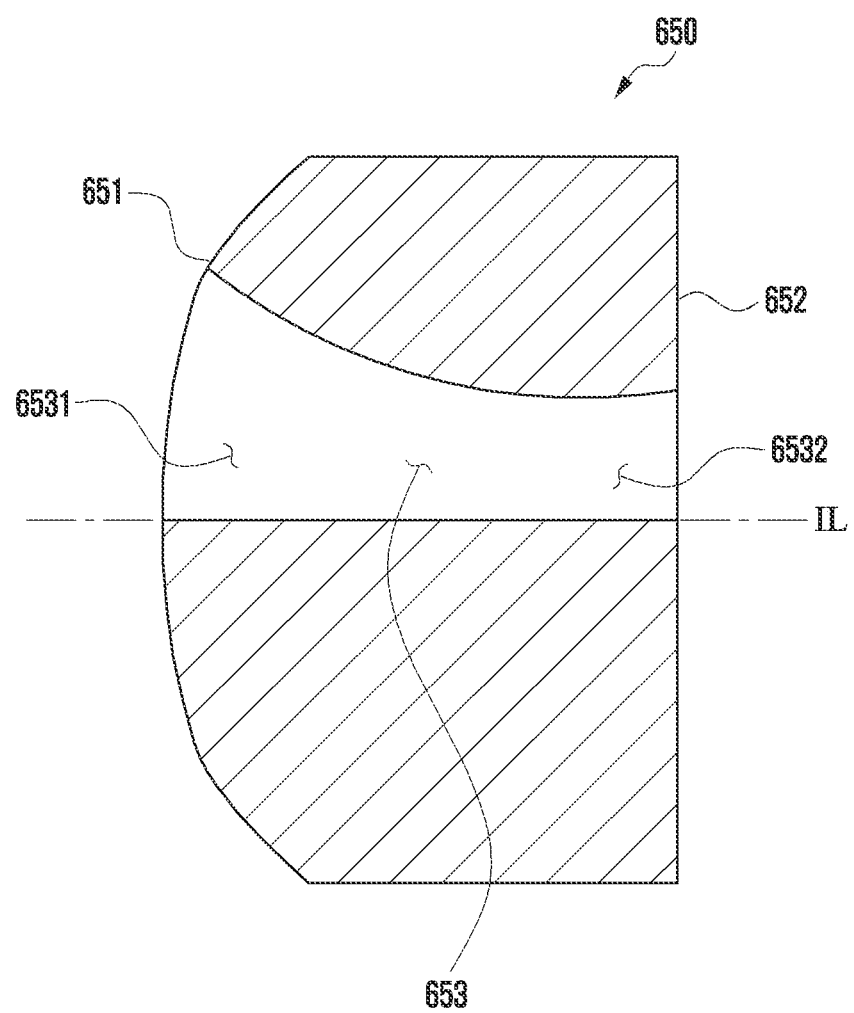

Referring to FIG. 6F, a side member 650 may include a through hole 653 formed from a first surface 651 to a second surface 652. According to an embodiment, the through hole 653 may include a first opening 6531 close to the first surface 651 and having a first size and a second opening 6532 extended from the first opening 6531 and close to the second surface 652 and having a second size smaller than the first size. According to an embodiment, the through hole 653 may be formed in only one side based on a virtual center line IL in the same shape as that of the through hole 643 of FIG. 6E.

Figure 6G:
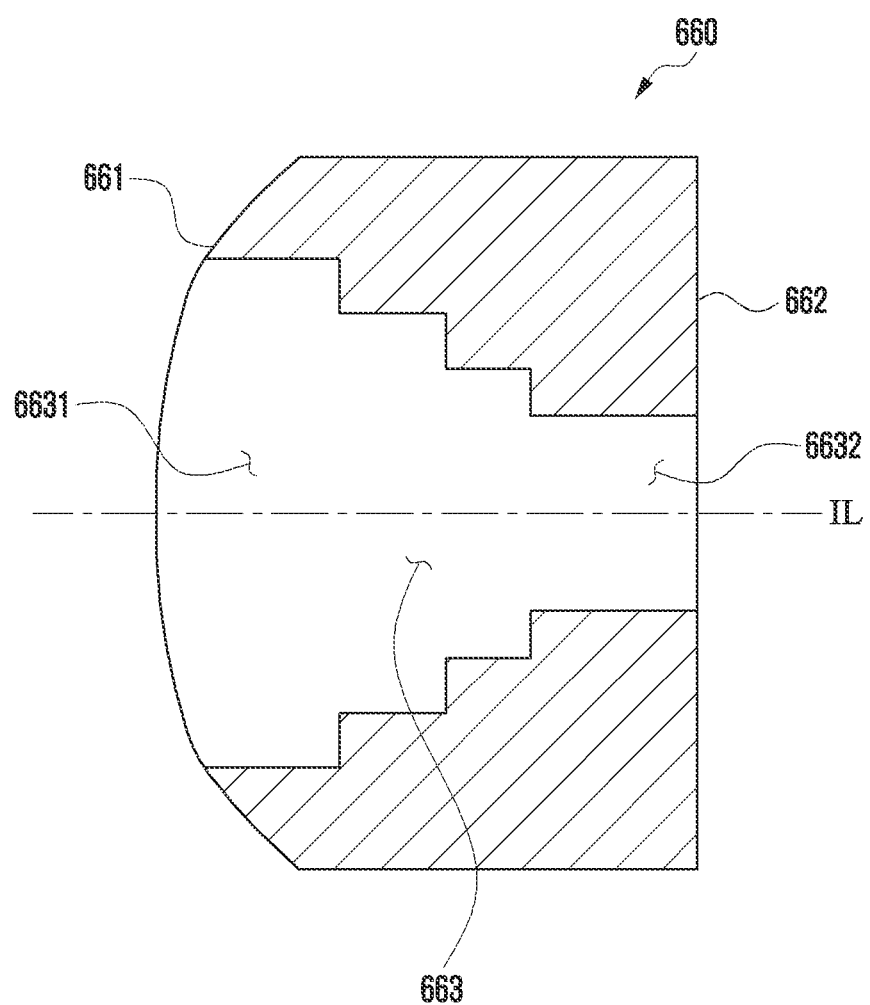

Referring to FIG. 6G, a side member 660 may include a through hole 663 formed from a first surface 661 to a second surface 662. According to one embodiment, the through hole 663 may include a first opening 6631 close to the first surface 661 and having a first size and a second opening 6632 extended from the first opening 6631 and close to the second surface 662 and having a second size smaller than the first size. According to an embodiment, the through hole 663 may be formed in a multiple stepped shape having a gradually reducing width as advancing from the first opening 6631 to the second opening 6632. According to an embodiment, the through hole 663 may be formed symmetrically based on a virtual center line IL.

Figure 6H:
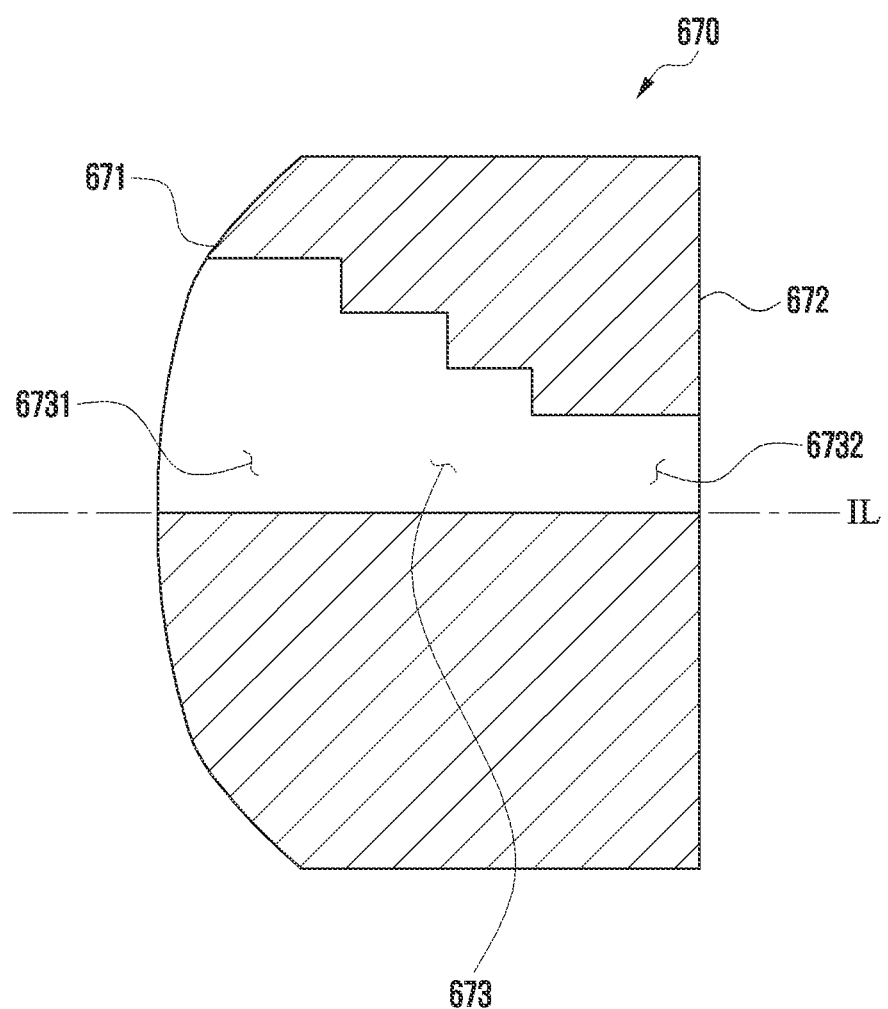

Referring to FIG. 6H, a side member 670 may include a through hole 673 formed from a first surface 671 to a second surface 672. According to an embodiment, the through hole 673 may include a first opening 6731 close to the first surface 671 and having a first size and a second opening 6732 extended from the first opening 6731 and close to the second surface 672 and having a second size smaller than the first size. According to an embodiment, the through hole 673 may be formed in only one side based on a virtual center line IL in the same shape as that of the through hole 663 of FIG. 6G.

According to various embodiments, although not illustrated, the through hole may be formed by mixing the above-described various shapes. For example, the side member may include various through holes having a shape that gradually decreases in size as advancing from the first opening to the second opening.

Figure 7A:
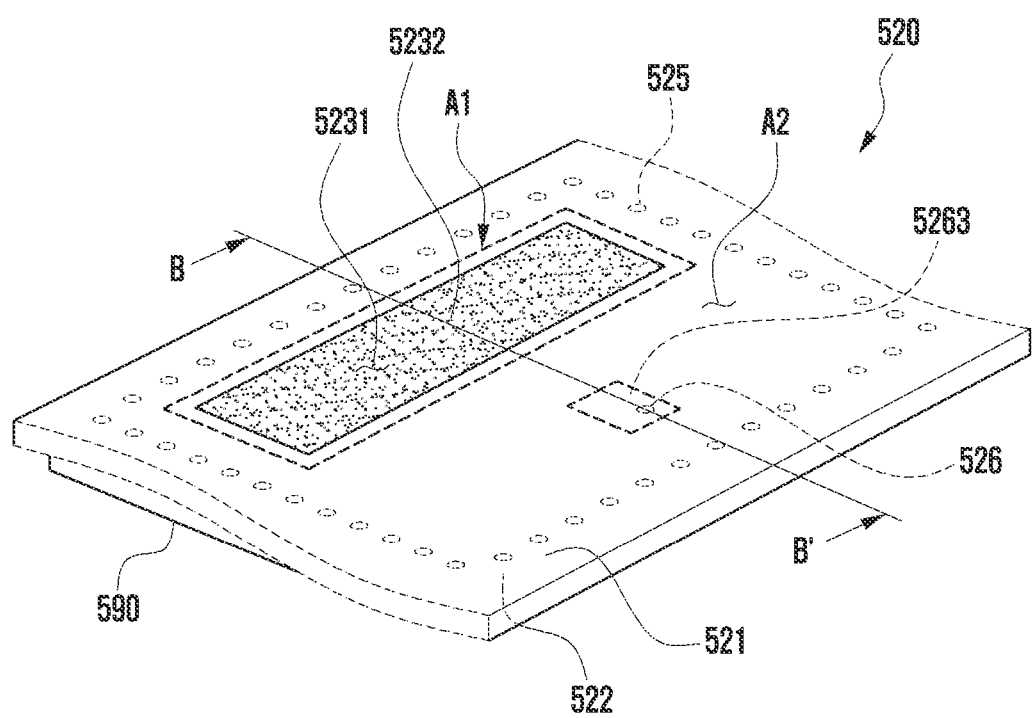
FIG. 7A is a perspective view illustrating a printed circuit board (e.g., structure) according to an embodiment of the disclosure.

FIG. 7A is a perspective view illustrating a printed circuit board (e.g., structure) according to an embodiment of the disclosure.

Figure 7B:
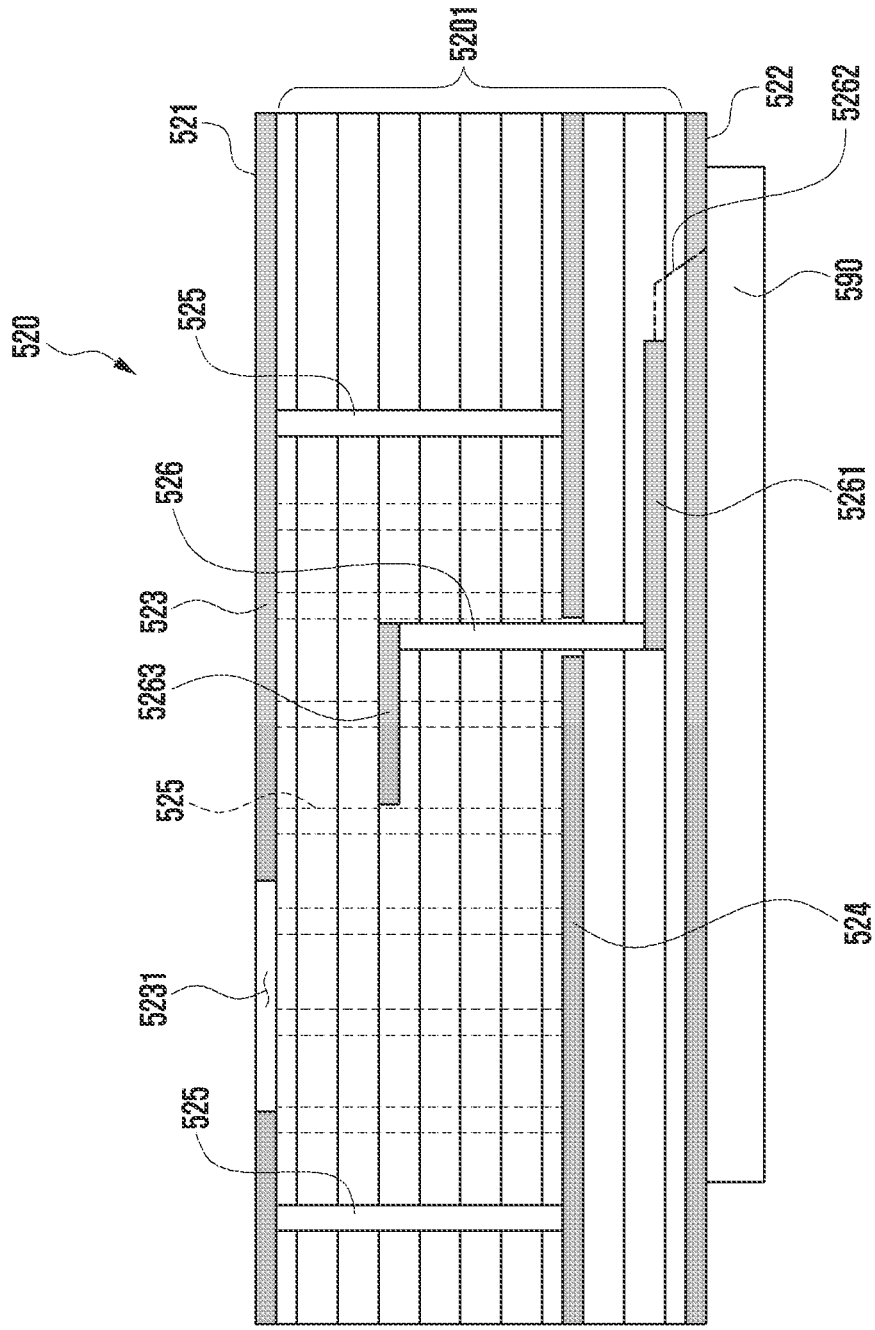
FIG. 7B is a cross-sectional view illustrating a stacked structure of a printed circuit board viewed from line B-B' of FIG. 7A according to an embodiment of the disclosure.

FIG. 7B is a cross-sectional view illustrating a stacked structure of the printed circuit board viewed from line B-B' of FIG. 7A according to an embodiment of the disclosure.

Referring to FIGS. 7A and 7B, the printed circuit board 520 may include the third surface 521 facing the second surface 512 of the side member 510 and the fourth surface 522 facing in a direction opposite to that of the third surface 521. According to an embodiment, the printed circuit board 520 may be formed in a structure in which a plurality of insulating layers 5201 is stacked. According to an embodiment, the printed circuit board 520 may include conductive layers 523 and 524 disposed through at least two separated layers. According to an embodiment, the printed circuit board 520 may include a first conductive layer 523 and a second conductive layer 524 facing the first conductive layer 523 and spaced apart from the first conductive layer 523. According to an embodiment, the first conductive layer 523 may be disposed to be exposed to at least a portion of the third surface 521 of the printed circuit board 520. In another embodiment, the first conductive layer 523 may be disposed through any one insulating layer inside the printed circuit board 520. According to one embodiment, the second conductive layer 524 may be disposed through any one insulating layer inside the printed circuit board 520.

According to various embodiments, the printed circuit board 520 may include a first area A1 disposed on the third surface 521 and a second area A2 disposed at a periphery of the first area A1. According to an embodiment, the first area A1 may include the slot 5231 at least partially overlapped with a second opening (e.g., the opening 5132 of FIG. 8) when viewed from above the first surface 511. According to an embodiment, the slot 5231 may be formed by an omitted portion of the first conductive layer 523. According to an embodiment, the slot 5231 of the first area A1 may include a second non-conductive material 5232. According to one embodiment, the second non-conductive material 5232 may include an insulating layer.

According to various embodiments, the second area A2 may include a plurality of conductive vias 525 and a conductive line 526 disposed at a periphery of the first area A1. According to an embodiment, the plurality of conductive vias 525 may be disposed at regular intervals so as to form the second area A2. According to an embodiment, the plurality of conductive vias 525 may electrically connect the first conductive layer 523 and the second conductive layer 524 through an insulating layer of the printed circuit board 520. For example, the second area A2 may include an SIW structure formed through the plurality of conductive vias 525. According to an embodiment, the conductive line 526 may be disposed between the first conductive layer 523 and the second conductive layer 524. According to an embodiment, an end portion of the conductive line 526 may be disposed between the first conductive layer 523 and the second conductive layer 524 or may be electrically connected to the first conductive layer 523. According to an embodiment, the conductive line 526 may be electrically connected to a feeding line 5261 disposed in an insulating layer of the printed circuit board 520. According to an embodiment, the conductive line 526 may include a conductive via of a predetermined length disposed through the plurality of insulating layers. According to an embodiment, the feeding line 5261 may be electrically connected to a wireless communication circuit 590 through a feeding line 5262. According to one embodiment, the printed circuit board 520 may include a conductive pattern 5263 of a predetermined size disposed between the first conductive layer 523 and the second conductive layer 524 of the second area A2 and electrically connected to an end portion of the conductive line 526. According to an embodiment, the conductive line 526 and/or the conductive pattern 5263 may be disposed at a position capacitively coupled to the first conductive layer 523. According to an embodiment, the conductive pattern 5263 may be omitted.

According to various embodiments, when viewed from above the third surface 521, the plurality of conductive vias 525 may have a waveguide structure of a radio signal enclosing the first area A1 in a closed loop shape. According to an embodiment, the plurality of conductive vias 525 may include an SIW structure enclosing the first area A1 and the conductive line 526. According to one embodiment, the antenna module 500 is connected to a waveguide horn structure by the through hole 513 having a channel CH1 formed between the first opening 5131 and the second opening 5132 of the side member 510, thereby transmitting and/or receiving a radio signal through the waveguide horn structure.

FIG. 8 is a cross-sectional view illustrating a coupled state of an antenna module according to an embodiment of the disclosure.

Referring to FIG. 8, the printed circuit board 520 may be disposed at the side member 510. According to an embodiment, the second surface 512 of the side member 510 and the third surface 521 of the printed circuit board 520 may be disposed in a surface contact manner. In this case, the second opening 5132 of the through hole 513 of the side member 510 and the slot 5231 of the printed circuit board 520 may face each other. According to an embodiment, the slot 5231 may have substantially the same size and shape as those of the second opening 5132. According to one embodiment, the wireless communication circuit 590 may be configured to transmit and/or receive a signal having a frequency in the range of 3 GHz to 100 GHz through the conductive line 526 and through the slot 5231 electrically enclosed by a plurality of conductive vias 525 of the printed circuit board 520 and the through hole 513 of the side member 510 connected thereto.

Figure 9A:
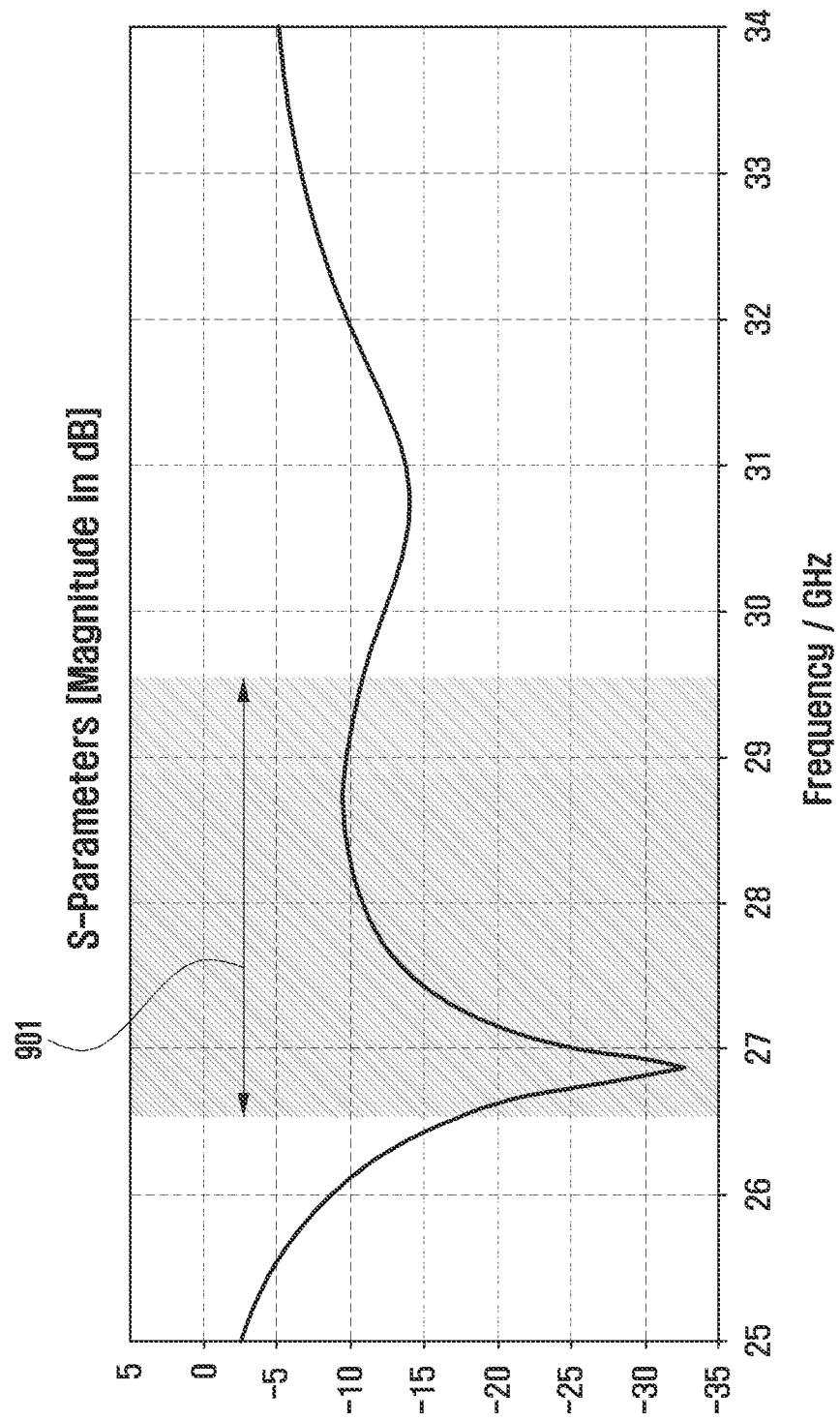
FIGS. 9A and 9B are graphs illustrating bandwidths according to impedance characteristics and gain characteristics of the antenna module of FIG. 8 according to various embodiments of the disclosure.
Figure 9B:
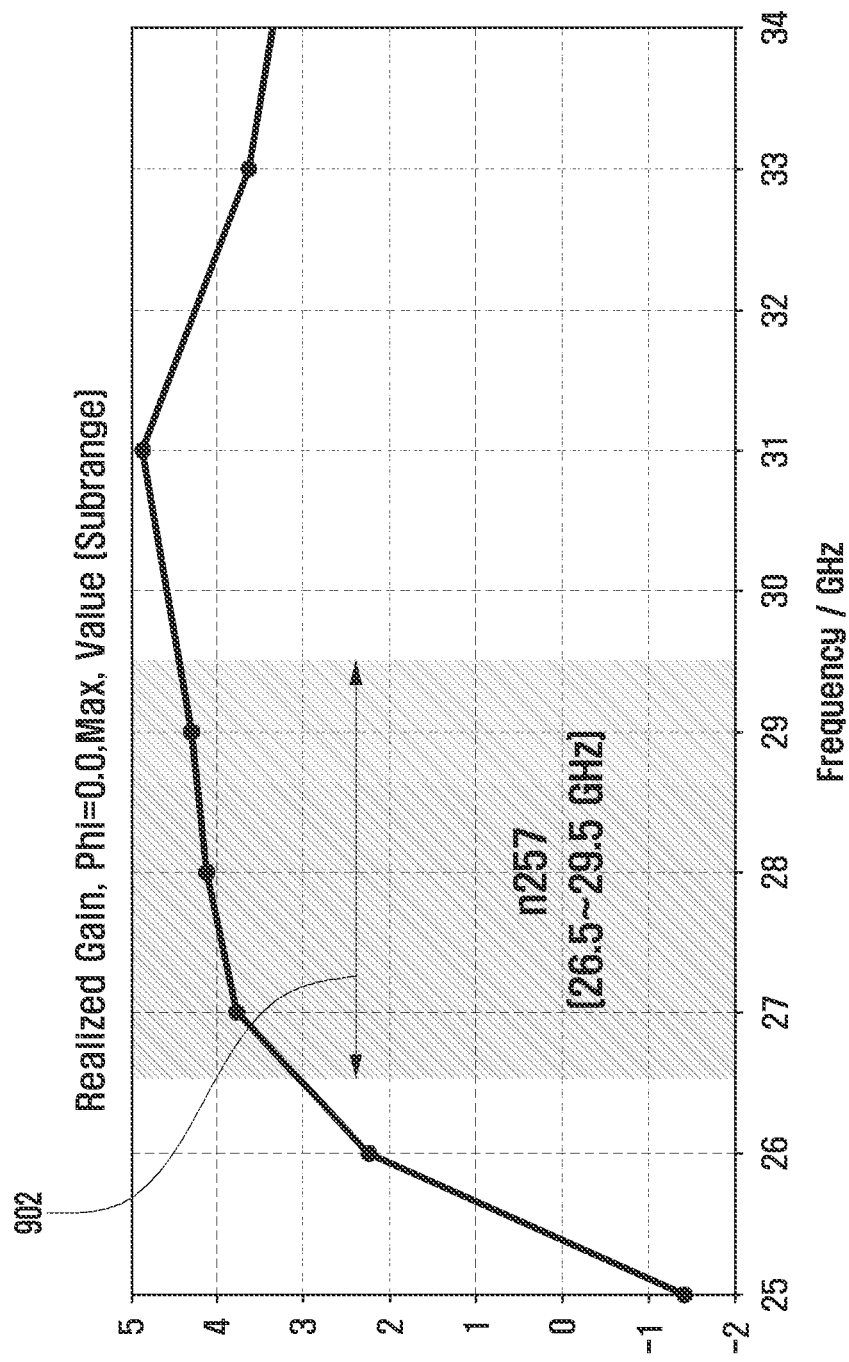

FIGS. 9A and 9B are graphs illustrating bandwidths according to impedance characteristics and gain characteristics of the antenna module of FIG. 8 according to various embodiments of the disclosure.

Figure 9C:
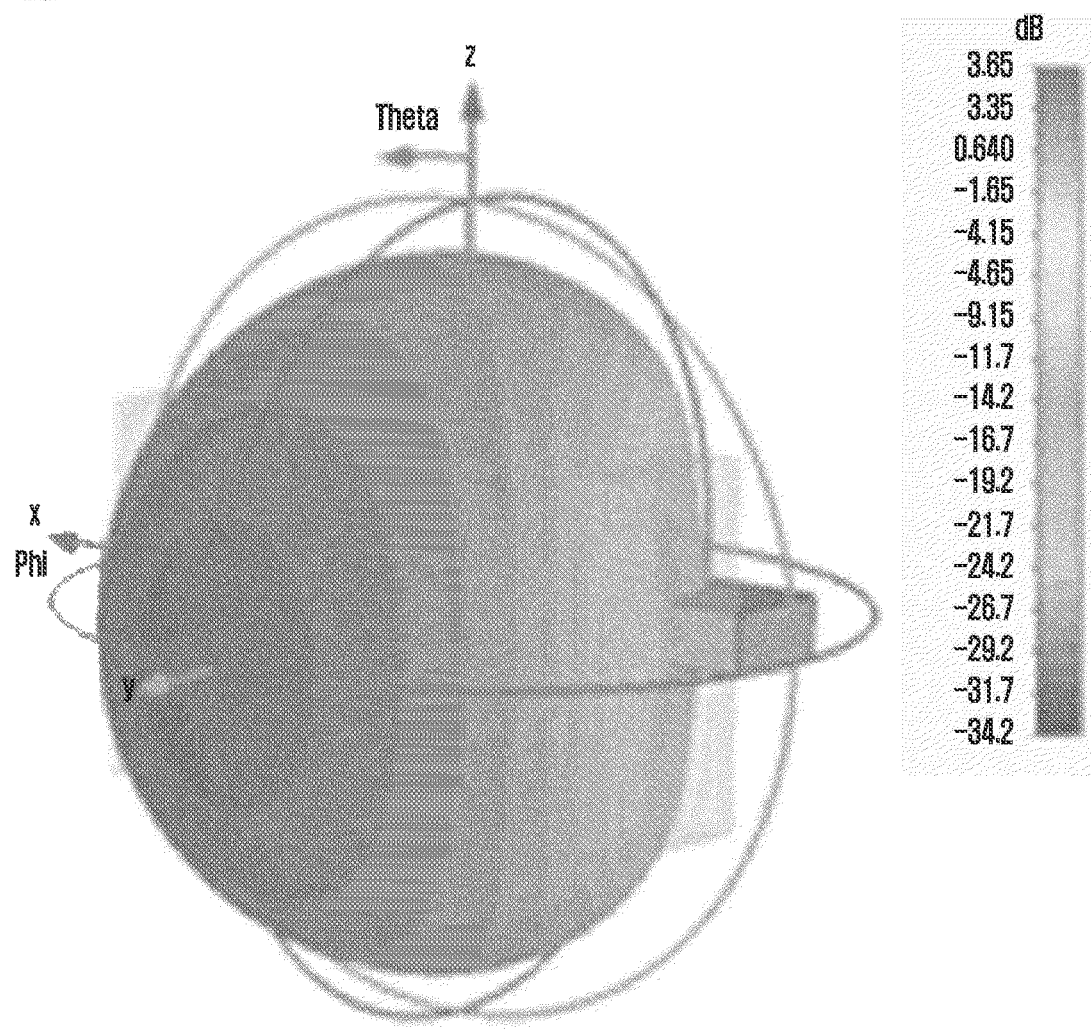
FIG. 9C is a diagram illustrating a radiation pattern of the antenna module of FIG. 8 according to an embodiment of the disclosure.

FIG. 9C is a diagram illustrating a radiation pattern of the antenna module of FIG. 8 according to an embodiment of the disclosure.

Referring to FIGS. 9A, 9B and 9C, it can be seen that an antenna module (e.g., the antenna module 500 of FIG. 8) including a slot (e.g., the slot 5231 of FIG. 8) having an SIW structure in a printed circuit board (e.g., the printed circuit board 520 of FIG. 8) connected to a horn structure through a through hole (e.g., the through hole 513 of FIG. 8) of a side member (e.g., the side member 510 of FIG. 8) operates smoothly with a bandwidth (a bandwidth 901 of FIG. 9A and a bandwidth 902 of FIG. 9B) of about 3 GHz in the range of about 26.5 GHz to 29.5 GHz. Although not illustrated, in the antenna module 500, an operating frequency or a bandwidth may be determined according to a shape or a size of the through hole 513, a size of the slot 5231, or a disposition position and/or a size of the conductive line (e.g., the conductive line 526 of FIG. 8).

Figure 10:
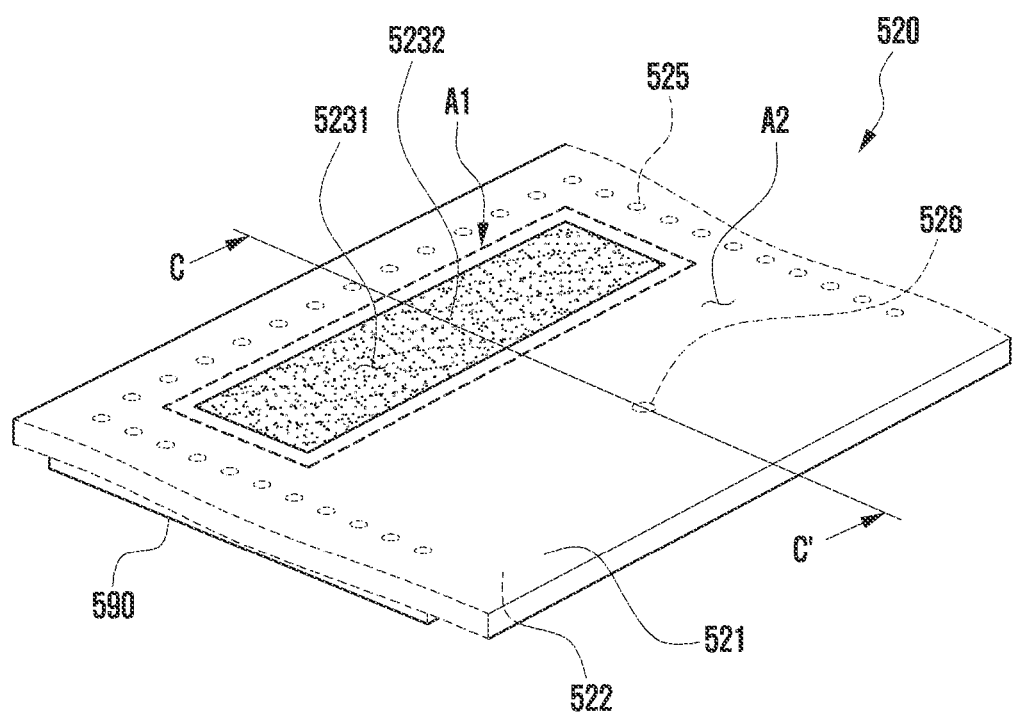
FIG. 10 is a perspective view illustrating a printed circuit board according to an embodiment of the disclosure.

FIG. 10 is a perspective view illustrating a printed circuit board according to an embodiment of the disclosure.

Figure 11:
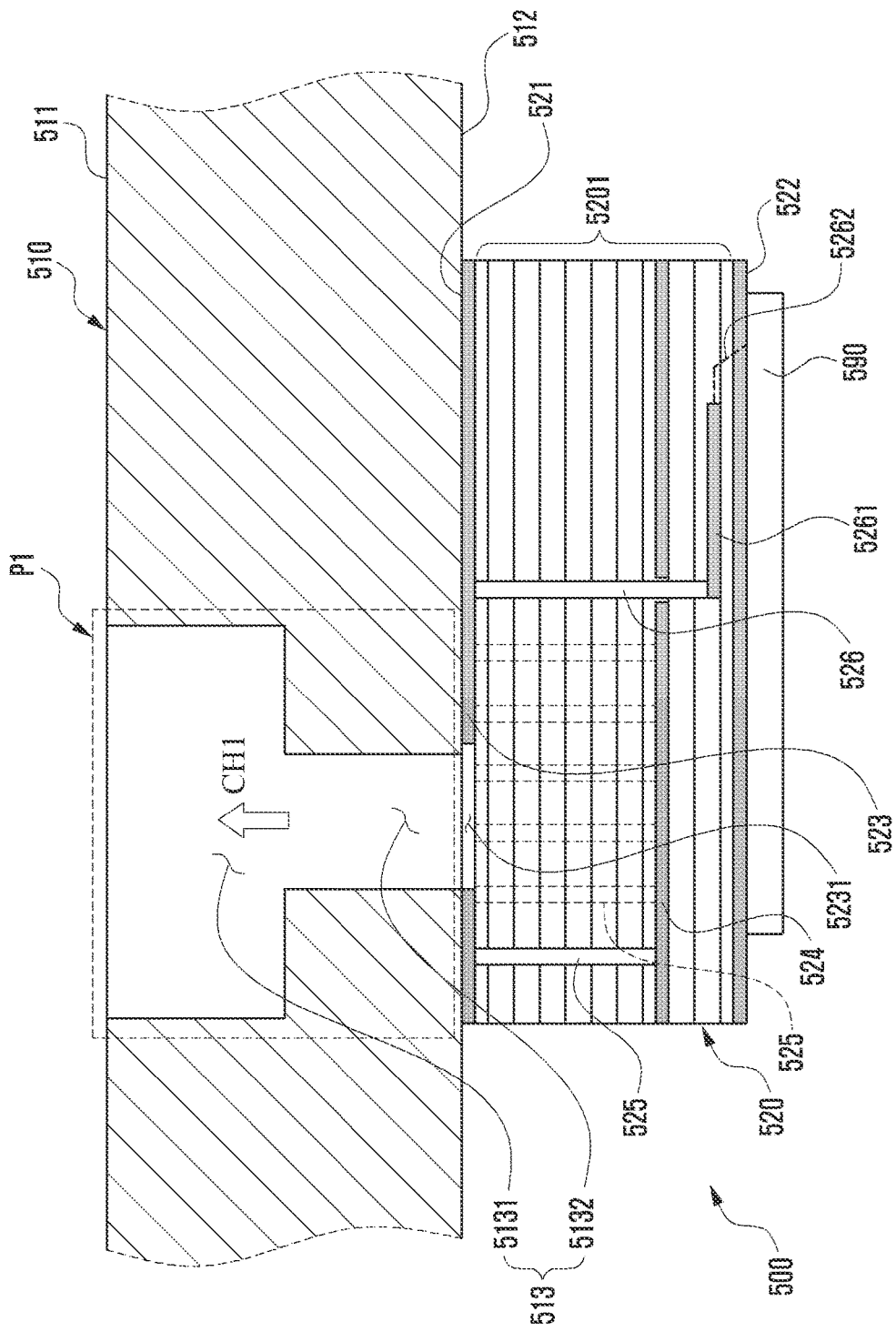
FIG. 11 is a cross-sectional view illustrating an antenna module in which a printed circuit board viewed from line C-C' of FIG. 10 is disposed at a side member according to an embodiment of the disclosure.

FIG. 11 is a cross-sectional view illustrating an antenna module in which a printed circuit board viewed from line C-C' of FIG. 10 is disposed at a side member according to an embodiment of the disclosure.

In describing embodiments of the disclosure, the same reference numerals are used for the same components as the above-described components, and a detailed description thereof may be omitted.

Referring to FIGS. 10 and 11, a plurality of conductive vias 525 is disposed to include a first area (e.g., the first area A1 of FIG. 7A) and the conductive line 526, but one side thereof may be disposed to be opened. In this case, the conductive line 526 may be electrically connected to the first conductive layer 523, and conductive vias may be omitted at one side of an SIW structure formed through the plurality of conductive vias 525 relatively far from the slot 5231 (non-resonant type).

Figure 12:
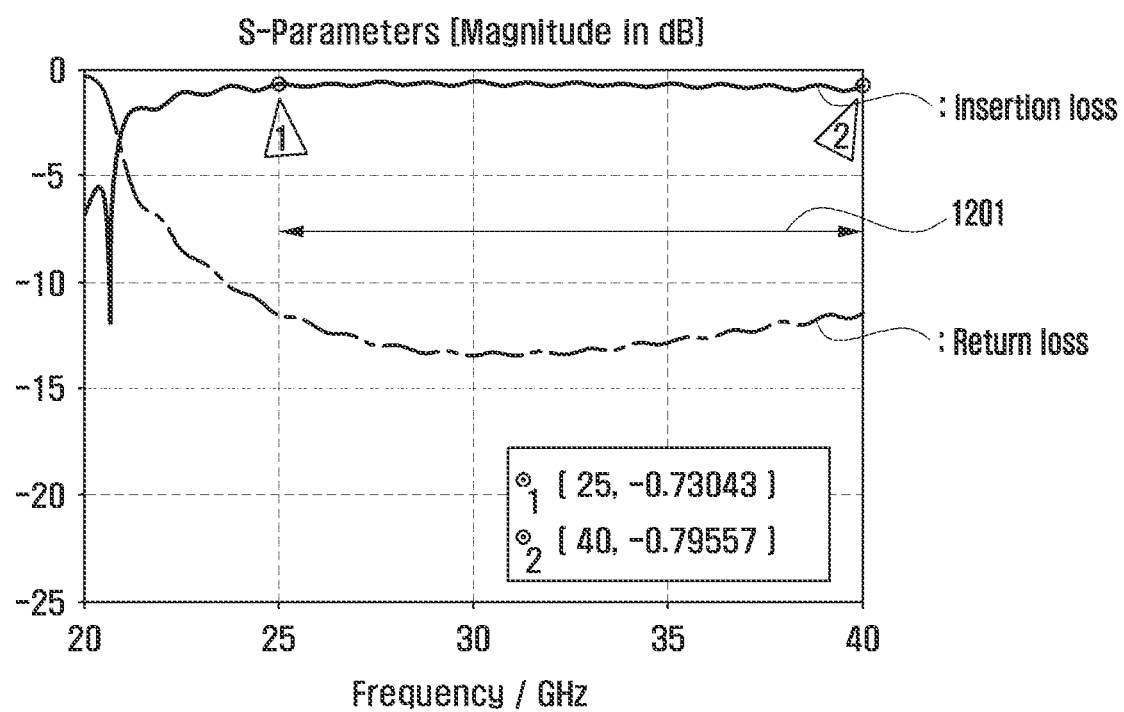
FIG. 12 is a diagram illustrating impedance characteristics of the antenna module of FIG. 11 according to an embodiment of the disclosure.

FIG. 12 is a diagram illustrating impedance characteristics of the antenna module of FIG. 11 according to an embodiment of the disclosure.

In FIG. 12, it can be seen that a loss (insertion loss and return loss) of an antenna module (e.g., the antenna module 500 of FIG. 11) disposed to open one side of a SIW structure formed by a plurality of conductive vias (e.g., the plurality of conductive vias 525 of FIG. 11) is slightly reduced, but a wide bandwidth (e.g., a bandwidth 1201 of FIG. 12) of about 15 GHz in the range of about 25 GHz to 40 GHz may be secured.

Figure 13A:
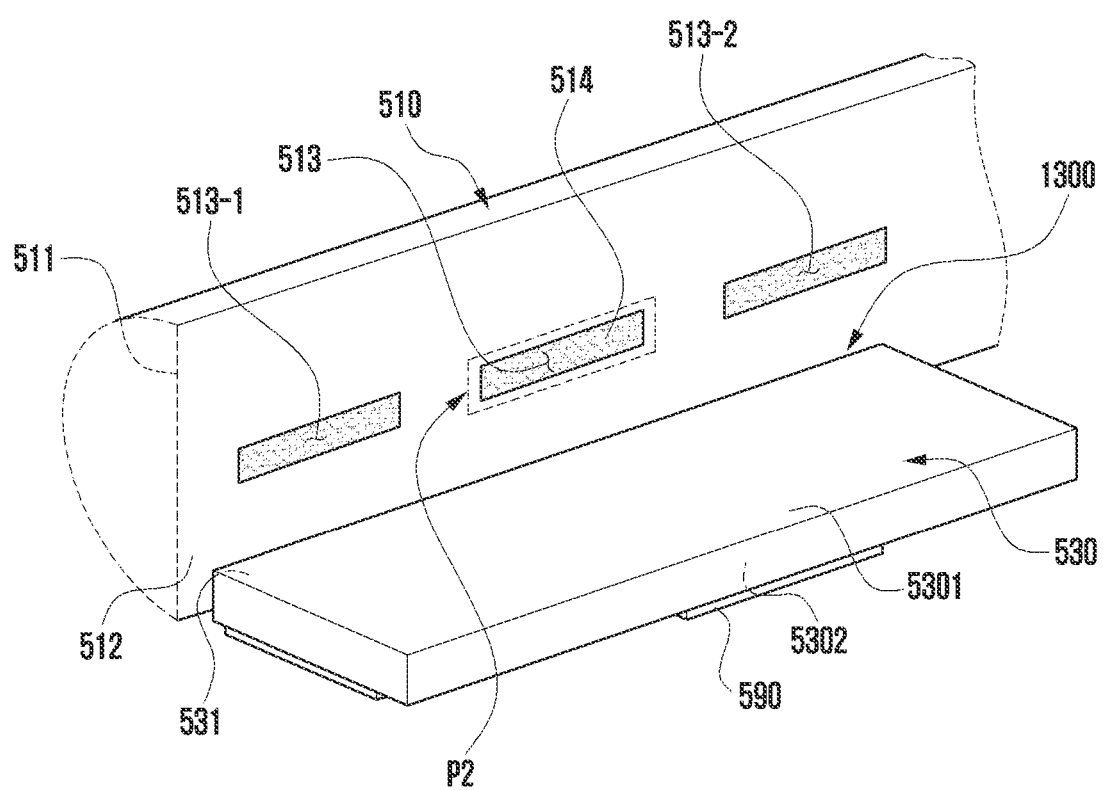
FIG. 13A is a diagram illustrating a separated state of an antenna module according to an embodiment of the disclosure.

FIG. 13A is a diagram illustrating a separated state of an antenna module according to an embodiment of the disclosure.

Figure 13B:
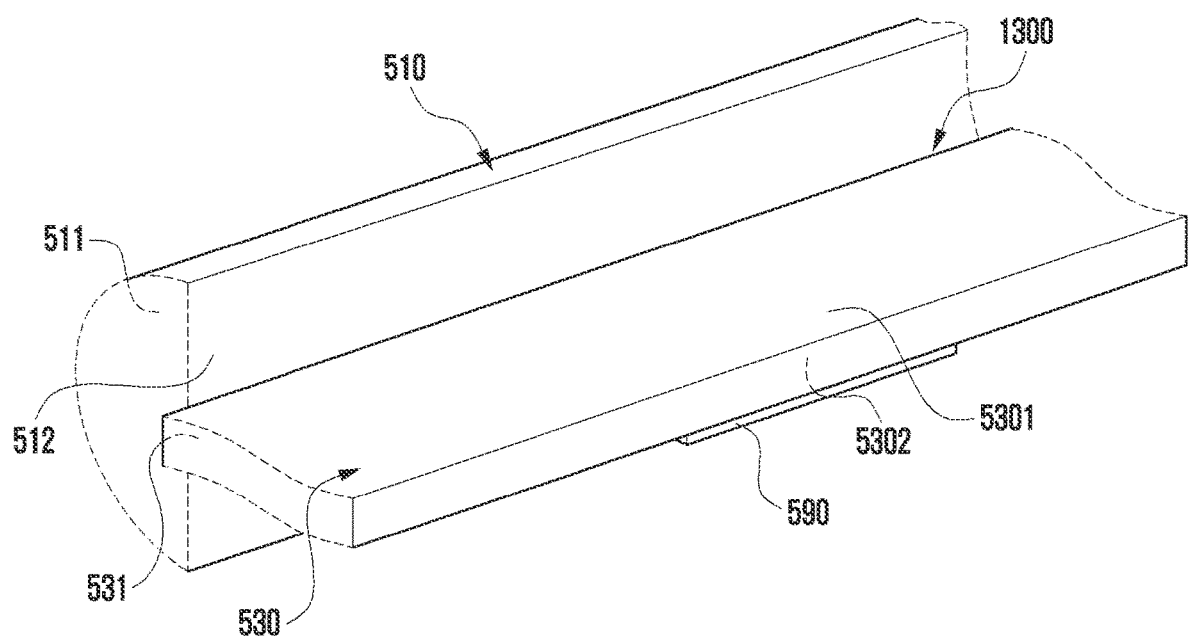
FIG. 13B is a diagram illustrating a coupled state of an antenna module according to an embodiment of the disclosure.

FIG. 13B is a diagram illustrating a coupled state of an antenna module according to an embodiment of the disclosure.

An antenna module 1300 of FIGS. 13A and 13B may be at least partially similar to the third antenna module 246 of FIG. 2 or may further include other components of the antenna module.

Referring to FIGS. 13A and 13B, the antenna module 1300 may include a printed circuit board 530 disposed to face the side member 510 including a plurality of through holes 513, 513-1, and 513-2 filled with the first non-conductive material 514 and the wireless communication circuit 590 mounted in the printed circuit board 530. According to one embodiment, the side member 510 may include the first surface 511 facing the outside (e.g., the outside of the electronic device) of the housing (e.g., the housing 310 of FIG. 3A) and the second surface 512 facing in a direction (e.g., an internal space of the electronic device) opposite to that of the first surface 511. According to one embodiment, the through holes 513, 513-1, and 513-2 may be extended from the first surface 511 to the second surface 512. According to one embodiment, the through holes 513, 513-1, and 513-2 are illustrated in three locations, but may be disposed in two or four or more locations. For example, a detailed structure of the through holes 513, 513-1, and 513-2 may be similar to a configuration of FIGS. 6A to 6H.

Hereinafter, for convenience of description, one through hole 513 disposed in a first portion P2 of the side member 510 is described, but the remaining through holes 513-1 and 513-2 and a feeding structure of the antenna module 1300 corresponding thereto may also have substantially the same configuration.

According to various embodiments, the printed circuit board 530 may include a first substrate surface 5301, a second substrate surface 5302 facing in a direction opposite to that of the first substrate surface 5301, and a substrate side surface 531 enclosing a space between the first substrate surface 5301 and the second substrate surface 5302. According to an embodiment, the antenna module 1300 may include a wireless communication circuit 590 disposed at the second substrate surface 5302 of the printed circuit board 530. According to one embodiment, the wireless communication circuit 590 may be disposed inside the electronic device (e.g., the electronic device 300 of FIG. 3A) instead of the printed circuit board 530 and be electrically connected through the printed circuit board 530 and the conductive cable (e.g., flexible printed circuit board (FPCB)). According to one embodiment, the wireless communication circuit 590 may be configured to transmit and/or receive a signal having a frequency in the range of 3 GHz to 100 GHz through the antenna module 1300.

According to various embodiments, the printed circuit board 530 may be disposed such that the substrate side surface 531 faces the second surface 512 of the side member 510. According to an embodiment, the printed circuit board 530 may include an area (e.g., a first area A3 of FIG. 14) disposed at the substrate side surface 531 and facing the through hole 513. According to an embodiment, although not illustrated, the electronic device (e.g., the electronic device 300 of FIG. 3A) may have a coupling structure in which the first area A3 of the printed circuit board 530 faces the through hole 513 of the side member 510. For example, a stepped recess lower than the second surface 512 may be formed in an area including the through hole 513 of the second surface 512 of the side member 510, and the first area A3 (e.g., the first area A3 of FIG. 14) may guide to face the through hole 513 by only an operation in which at least a portion of the substrate side surface 531 of the printed circuit board 530 is seated in the recess.

Figure 14:
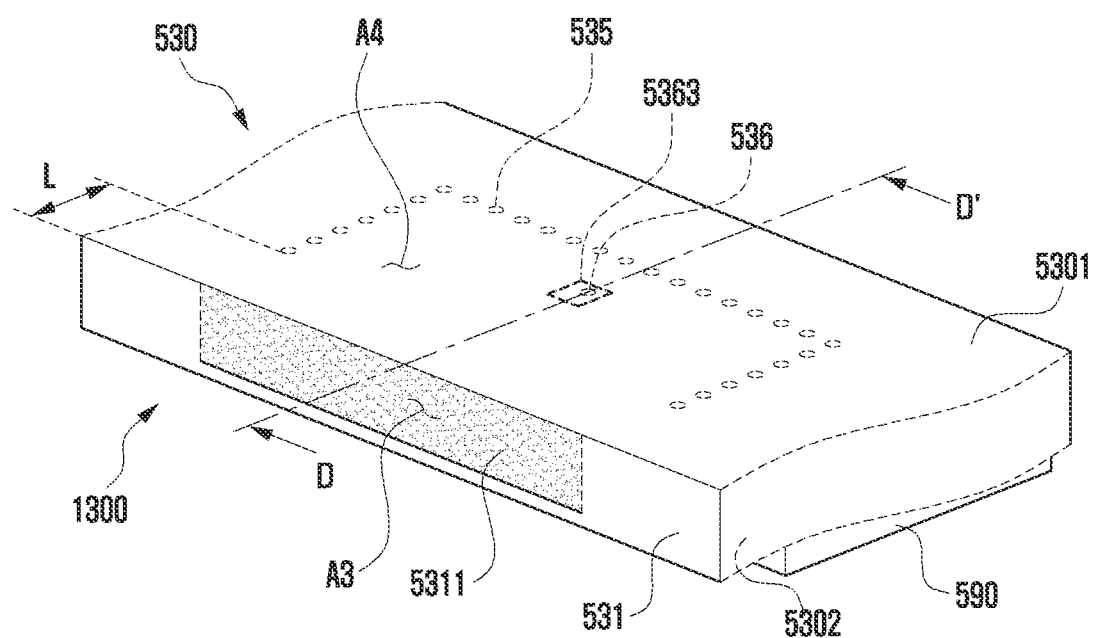
FIG. 14 is a perspective view illustrating a printed circuit board according to an embodiment of the disclosure.

FIG. 14 is a perspective view illustrating a printed circuit board according to an embodiment of the disclosure.

Figure 15:
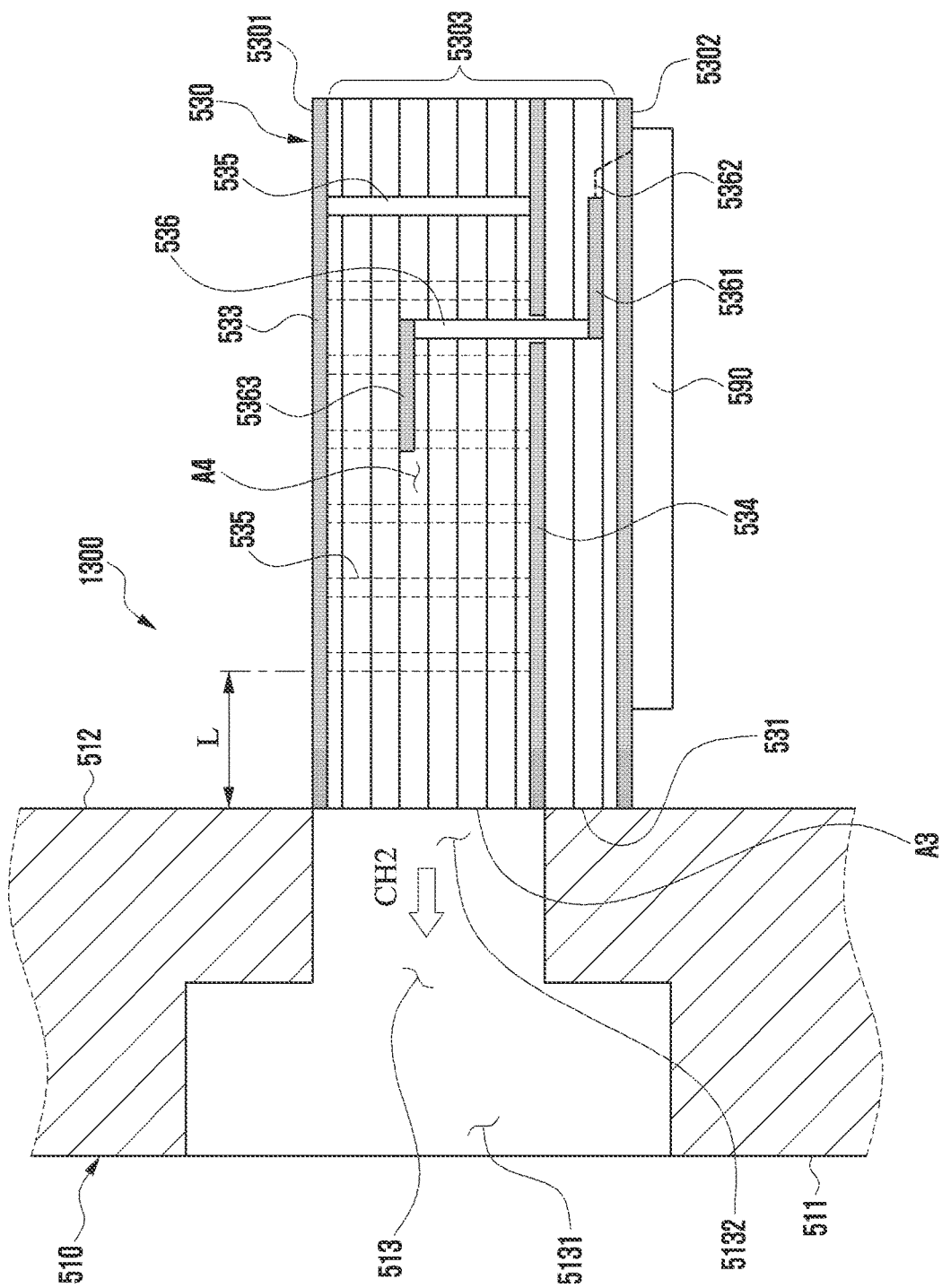
FIG. 15 is a cross-sectional view illustrating an antenna module in which a printed circuit board viewed from line D-D' of FIG. 14 is disposed at a side member according to an embodiment of the disclosure.

FIG. 15 is a cross-sectional view illustrating an antenna module in which a printed circuit board viewed from line D-D' of FIG. 14 is disposed at a side member according to an embodiment of the disclosure.

Referring to FIGS. 14 and 15, the printed circuit board 530 of the antenna module 1300 may include the first substrate surface 5301, the second substrate surface 5302 facing in a direction opposite to that of the first substrate surface 5301, and the substrate side surface 531 enclosing a space between the first substrate surface 5301 and the second substrate surface 5302 and facing the second surface 512 of the side member 510. According to an embodiment, the printed circuit board 530 may be formed in a structure in which insulating layers 5303 are stacked. According to an embodiment, the printed circuit board 530 may include conductive layers 533 and 534 disposed in parallel to the first substrate surface 5301 and disposed through at least two layers spaced apart from each other. According to an embodiment, the printed circuit board 530 may include a first conductive layer 533 and a second conductive layer 534 facing the first conductive layer 533 and spaced apart from the first conductive layer 533. According to an embodiment, the first conductive layer 533 may be disposed to expose at least a portion of the first substrate surface 5301 of the printed circuit board 530. In another embodiment, the first conductive layer 533 may be disposed inside the printed circuit board 530 through any one insulating layer closer to the first substrate surface 5301 rather than the second substrate surface 5302. According to an embodiment, the second conductive layer 534 may be disposed inside the printed circuit board 530 through any one insulating layer closer to the second substrate surface 5302 rather than the first substrate surface 5301.

According to various embodiments, the printed circuit board 530 may include a first area A3 including a second non-conductive material 5311 disposed at the substrate side surface 531 and a second area A4 disposed at the first substrate surface 5301. According to one embodiment, when the substrate side surface 531 of the printed circuit board 530 is disposed at the second surface 512 of the side member 510, the first area A3 may face the through hole 513 disposed in a first portion (e.g., the first portion P2 of FIG. 13A) of the side member 510. According to an embodiment, the first area A3 may be formed in substantially the same size and shape as those of the second opening 5132 of the through hole 513.

According to various embodiments, the printed circuit board 530 may include a plurality of conductive vias 535 disposed in a predetermined gap in order to form a second area A4 having a U-type conductive closed structure opened toward the side member 510 in the first substrate surface 5301. According to one embodiment, the plurality of conductive vias 535 may be disposed up to near the substrate side surface 531. According to one embodiment, the plurality of conductive vias 535 may be formed in a direction from the first substrate surface 5301 to the second substrate surface 5302 of the printed circuit board 530 and may electrically connect the first conductive layer 533 and the second conductive layer 534. According to an embodiment, the printed circuit board 530 may include a conductive line 536 disposed in the second area A4. According to an embodiment, the conductive line 536 may be electrically connected to a feeding line 5361 disposed in the insulating layer of the printed circuit board 530. According to one embodiment, the conductive lines 536 may include conductive vias of a predetermined length disposed through the plurality of insulating layers. According to an embodiment, the feeding line 5361 may be electrically connected to the wireless communication circuit 590 through a feeding line 5362. According to an embodiment, the printed circuit board 530 may include a conductive pattern 5363 of a predetermined size disposed between the first conductive layer 533 and the second conductive layer 534 of the second area A4 and electrically connected to an end portion of the conductive line 536. According to an embodiment, the conductive line 536 and/or the conductive pattern 5363 may be disposed at positions capacitively coupled to the first conductive layer 533. According to an embodiment, the conductive pattern 5363 may be omitted.

According to various embodiments, the plurality of conductive vias 535 may form a conductive closed structure in which the printed circuit board 530 is generally closed together with the second surface 512 of the conductive side member 510. Accordingly, the antenna module 1300 may include a conductive closed structure having an SIW structure formed by the first conductive layer 533, the second conductive layer 534, and the plurality of conductive vias 535. According to an embodiment, in the SIW structure by the first conductive layer 533, the second conductive layer 534, and the plurality of conductive vias 535, when viewed from above the first substrate surface 5301, at least some of the plurality of conductive vias 535 disposed at one side adjacent to the substrate side surface 531 may be omitted.

According to various embodiments, the antenna module 1300 may be connected to a waveguide horn structure by the through hole 513 having a channel CH2 formed between the first opening 5131 and the second opening 5132 of the side member 510, thereby transmitting and/or receiving a radio signal through the waveguide horn structure.

According to various embodiments, a SIW structure by the first conductive layer 533, the second conductive layer 534, and the plurality of conductive vias 535 may be close to the substrate side surface 531, but may be disposed so as not to contact, and bandwidth characteristics of the antenna module 1300 may be adjusted according to a transition length L between the substrate side surface 531 and the SIW structure.

Figure 16:
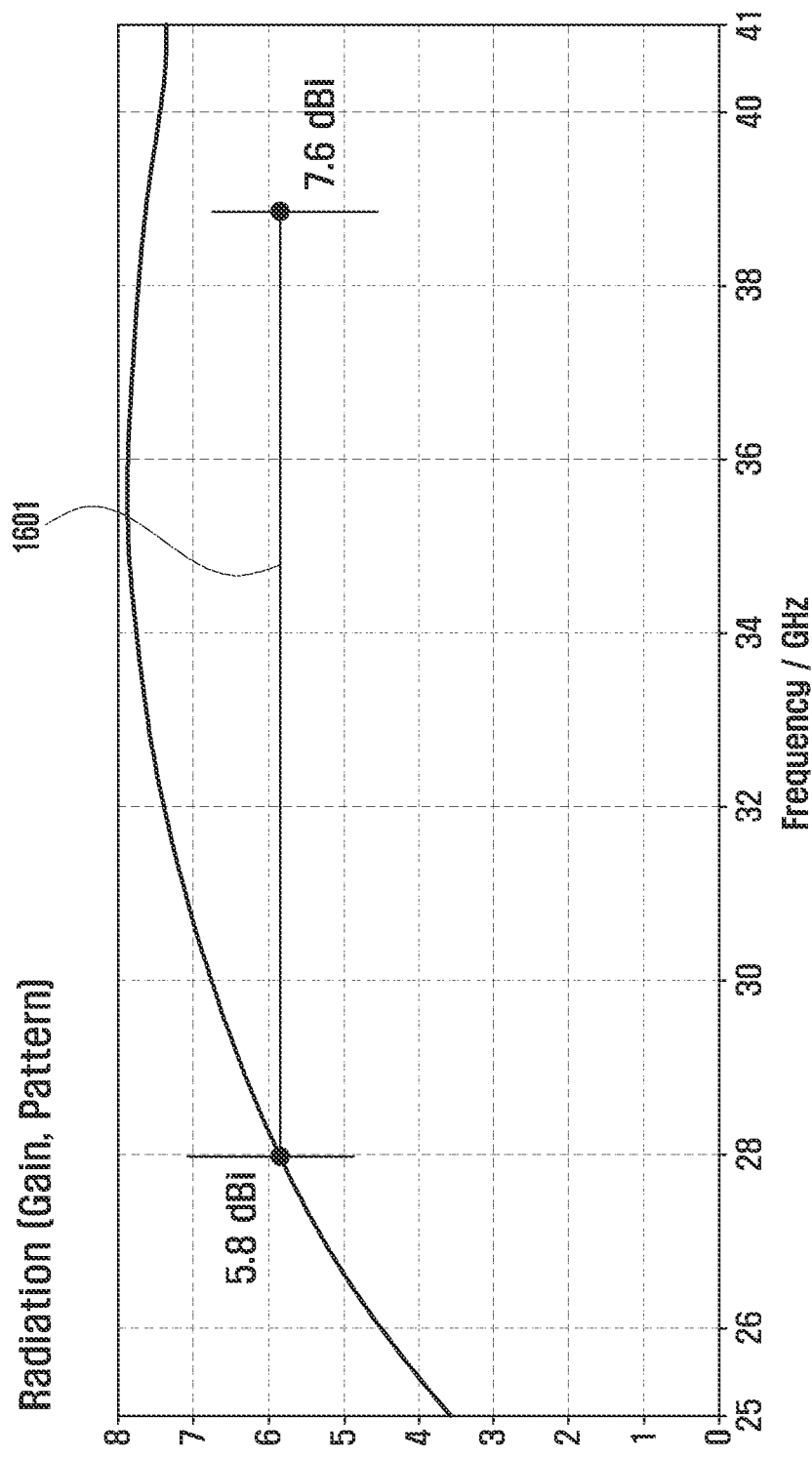
FIG. 16 is a graph illustrating gain characteristics of the antenna module of FIG. 15 according to an embodiment of the disclosure.

FIG. 16 is a graph illustrating gain characteristics of the antenna module of FIG. 15 according to an embodiment of the disclosure.

Referring to FIG. 16, it can be seen that an antenna module (e.g., the antenna module 1300 of FIG. 15) including a first conductive layer (e.g., the first conductive layer 533 of FIG. 15), a second conductive layer (e.g., the second conductive layer 534 of FIG. 15), a plurality of conductive vias (e.g., a plurality of conductive vias 535 of FIG. 15), and a conductive line (e.g., the conductive line 536 of FIG. 15) secures (e.g., 1601 of FIG. 16) a gain characteristic of about 5 dBi in about 28 GHz frequency band and 7.6 dBi in about 39 GHz frequency band through a signal waveguide structure by a through hole (e.g., the through hole 513 of FIG. 15), thereby operating smoothly in the frequency band.

Figure 17:
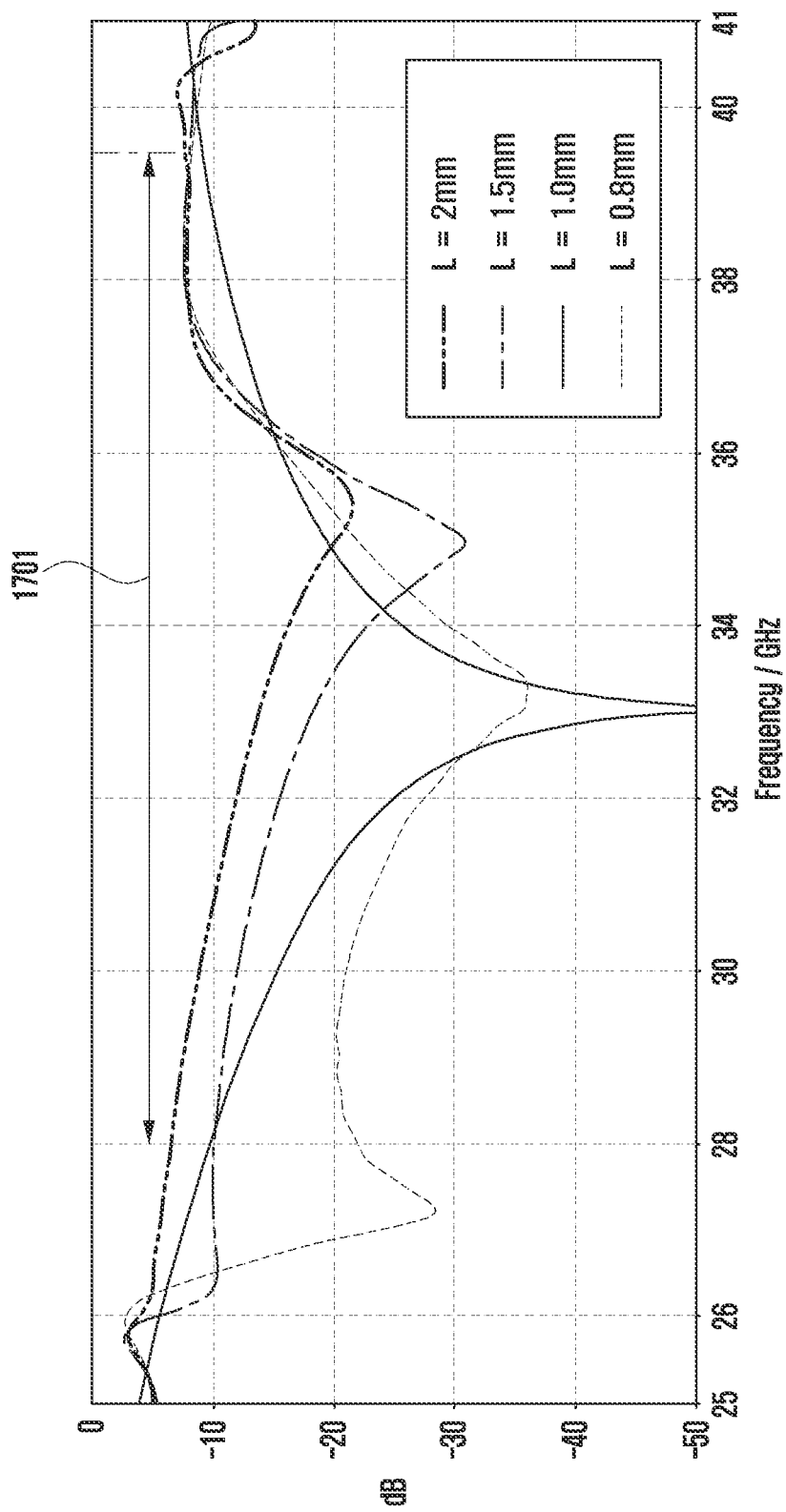
FIG. 17 is a graph illustrating impedance bandwidth characteristics according to a distance change from a plurality of conductive vias to a side member of the antenna module of FIG. 15 according to an embodiment of the disclosure.

FIG. 17 is a graph illustrating an impedance bandwidth characteristic according to a change in distance from the plurality of conductive vias of the antenna module to the side member of FIG. 15 according to an embodiment of the disclosure.

Referring to FIG. 17, in an antenna module (e.g., the antenna module 1300 of FIG. 15), an operating frequency band and/or a bandwidth of the antenna module (e.g., the antenna module 1300 of FIG. 15) may be determined by a transition length (e.g., the transition length L of FIG. 15) between (e.g., 1701 of FIG. 17) an end portion of a plurality of conductive vias (e.g., the plurality of conductive vias 535 of FIG. 15) forming a second area (e.g., the second area A4 of FIG. 15) and the side member (e.g., the side member 510 of FIG. 15). For example, as the transition length (e.g., the transition length L of FIG. 15) becomes shorter, it can be seen that an impedance characteristic is improved while shifting to a low frequency band. According to one embodiment, it can be seen that the antenna module (e.g., the antenna module 1300 of FIG. 15) may secure a wide bandwidth of about 10.8 GHz in the range of about 28.0 GHz to 38.8 GHz according to adjustment of the transition length (e.g., the transition length L of FIG. 15).

Figure 18A:
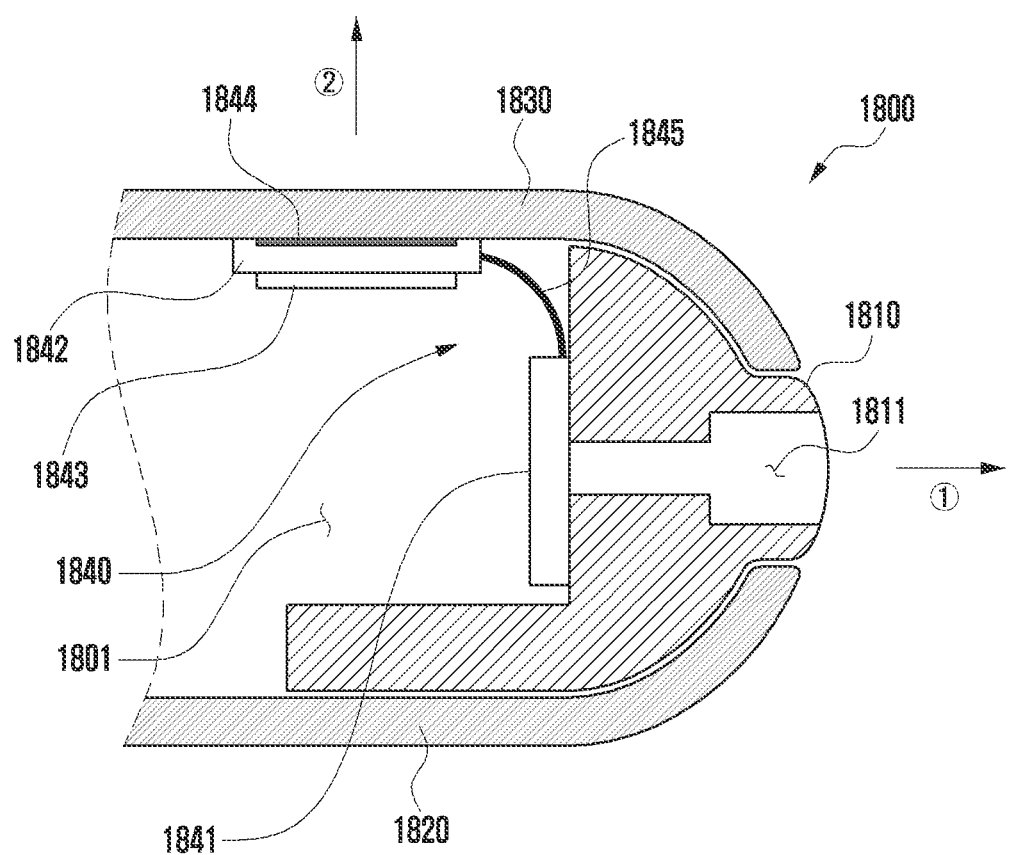
FIGS. 18A, 18B and 18C are cross-sectional views illustrating main components of a disposition configuration of an antenna module in an electronic device according to various embodiments of the disclosure.
Figure 18B:
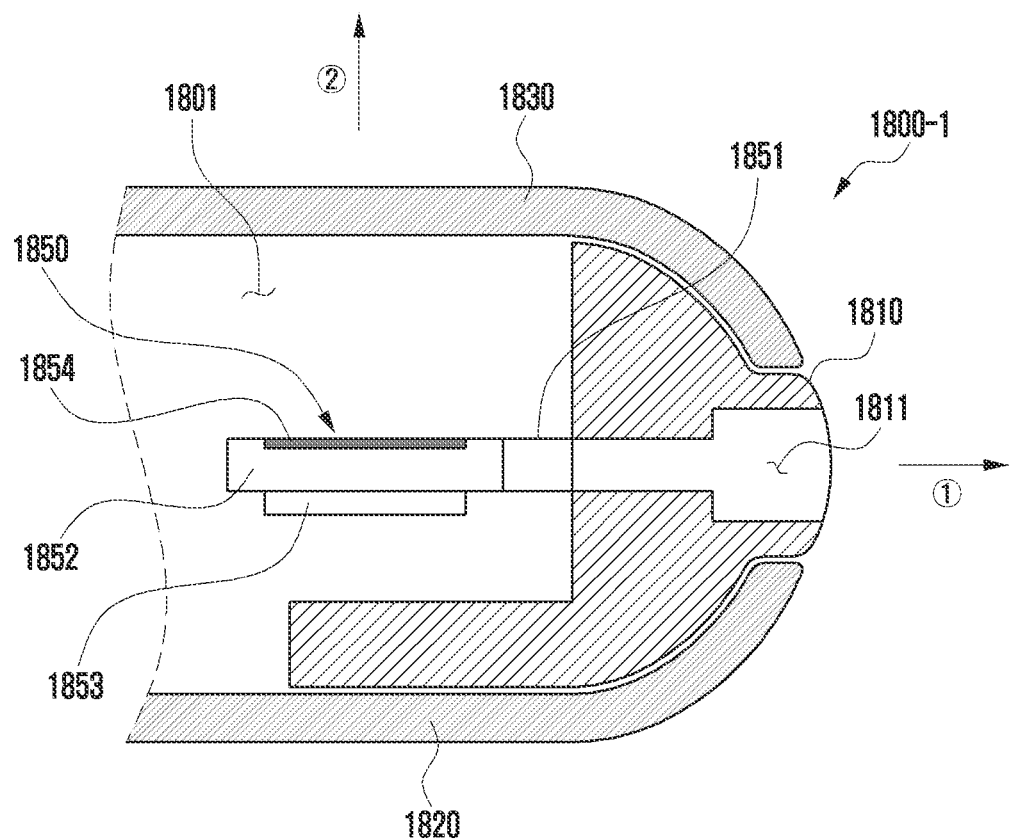
Figure 18C:
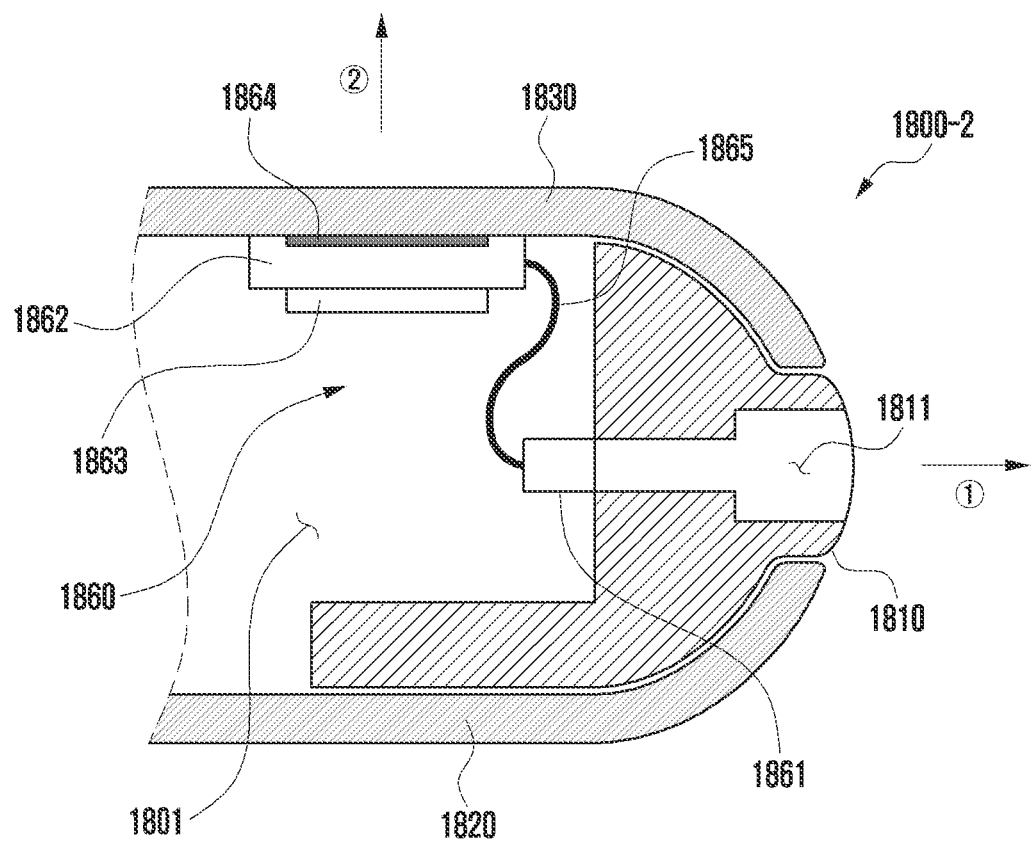

FIGS. 18A, 18B and 18C are cross-sectional views illustrating main components of a disposition configuration of antenna modules in electronic devices according to various embodiments of the disclosure.

Electronic devices 1800, 1800-1, and 1800-2 of FIGS. 18A, 18B and 18C may be at least partially similar to the electronic device 101 of FIG. 1 and the electronic device 300 of FIG. 3A and may further include other components of the electronic device.

Antenna modules 1840, 1850, and 1860 of FIGS. 18A, 18B and 18C may be at least partially similar to the antenna module 500 of FIG. 8 or the antenna module 1300 of FIG. 15 or may further include other components of the antenna module.

Referring to FIG. 18A, the electronic device 1800 may include a first plate 1820, a second plate 1830 facing in a direction opposite to that of the first plate 1820, and a side member 1810 enclosing a space 1801 between the first plate 1820 and the second plate 1830. According to an embodiment, the side member 1810 may include a through hole 1811 as a portion of the above-described horn waveguide structure.

According to various embodiments, the antenna module 1840 may include a first printed circuit board 1841 (e.g., structure) disposed to contact the side member 1810 in the internal space 1801 of the electronic device 1800, a second printed circuit board 1842 spaced apart from the printed circuit board 1841, and a conductive cable 1845 (e.g., flexible printed circuit board (FPCB)) for electrically connecting the second printed circuit board 1842 and the first printed circuit board 1841. According to one embodiment, at a third surface (e.g., the third surface 521 of FIG. 8) of the first printed circuit board 1841, a slot (e.g., the slot 5231 of FIG. 8) may be formed, and the first surface (e.g., the first surface 511 of FIG. 8) may contact the side member 1810 so that the slot (e.g., the slot 5231 of FIG. 8) faces the through hole 1811. According to an embodiment, the second printed circuit board 1842 may include a conductive patch antenna 1844 disposed at one surface and a wireless communication circuit 1843 disposed at another surface opposite to one surface. According to an embodiment, the second printed circuit board 1842 may be disposed in a direction parallel to the second plate 1830. Accordingly, the antenna module 1840 may form a beam pattern in a lateral direction (①) direction) through the through hole 1811 and a slot (e.g., the slot 5231 of FIG. 8) of the first printed circuit board 1841 and/or a direction (② direction) in which the second plate 1830 faces through the conductive patch antenna 1844.

Referring to FIG. 18B, the antenna module 1850 may include a first printed circuit board 1851 (e.g., structure) disposed to contact the side member 1810 in the internal space 1801 of an electronic device 1800-1 and a second printed circuit board 1852 extended in a direction parallel to a second plate 1830 from the first printed circuit board 1851. According to an embodiment, the first printed circuit board 1851 and the second printed circuit board 1852 may be formed into one printed circuit board. According to an embodiment, a first area (e.g., the first area A3 of FIG. 15) may be formed at a substrate side surface (e.g., the substrate side surface 531 of FIG. 15) of the first printed circuit board 1851, and the substrate side surface (e.g., the substrate side surface 531 of FIG. 15) may contact the side member 1810 such that the first area (e.g., the first area A3 of FIG. 15) faces the through hole 1811. According to an embodiment, the second printed circuit board 1852 may include a conductive patch antenna 1854 disposed at one surface and a wireless communication circuit 1853 disposed at another surface opposite to one surface. Accordingly, the antenna module 1850 may form a beam pattern in a lateral direction (① direction) through the through hole 1811 and a first area (e.g., the first area A3 of FIG. 15) of the first printed circuit board 1851 and/or a direction (② direction) in which the second plate 1830 faces through the conductive patch antenna 1854.

Referring to FIG. 18C, the antenna module 1860 may include a first printed circuit board 1861 (e.g., structure) disposed to contact the side member 1810 in the internal space 1801 of an electronic device 1800-2, a second printed circuit board 1862 spaced apart from the first printed circuit board 1861, and a conductive cable 1865 (e.g., flexible printed circuit (FPCB)) for electrically connecting the second printed circuit board 1862 and the first printed circuit board 1861. According to an embodiment, a first area (e.g., the first area A3 of FIG. 15) may be formed at a substrate side surface (e.g., the substrate side surface 531 of FIG. 15) of the first printed circuit board 1861, and the substrate side surface (e.g., the substrate side surface 531 of FIG. 15) may contact the side member 1810 such that the first area (e.g., the first area A3 of FIG. 15) faces the through hole 1811. According to one embodiment, the second printed circuit board 1862 may include a conductive patch antenna 1864 disposed at one surface and a wireless communication circuit 1863 disposed at another surface opposite to one surface. According to an embodiment, the second printed circuit board 1862 may be disposed in a direction parallel to a second plate 1830. Accordingly, the antenna module 1860 may form a beam pattern in a lateral direction (① direction) through the through hole 1811 and a first area (e.g., the first area A3 of FIG. 15) of the first printed circuit board 1861 and/or a direction (② direction) in which the second plate 1830 faces through the conductive patch antenna 1864.

Figure 19A:
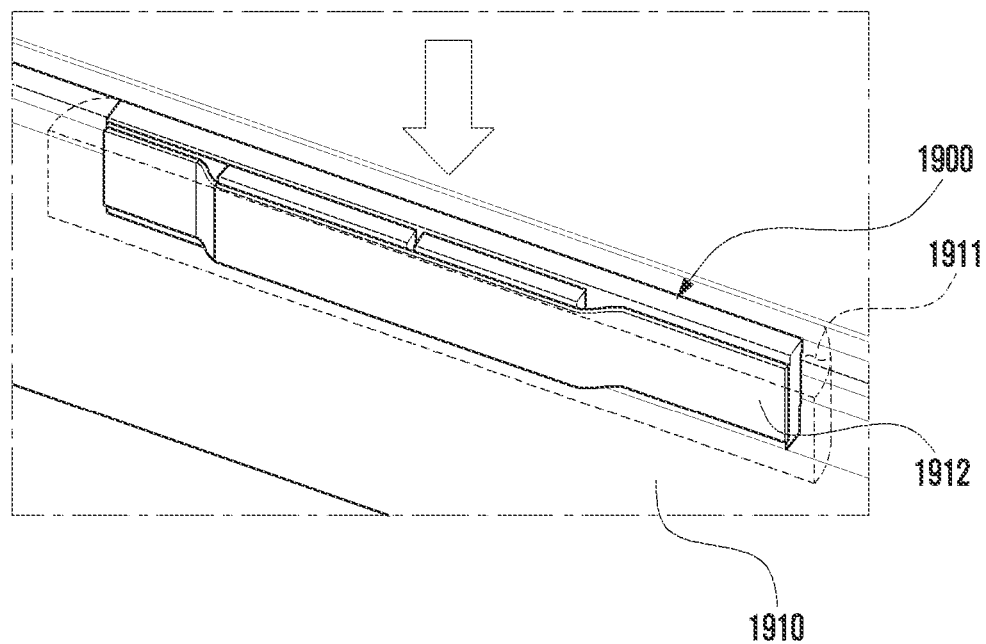
FIGS. 19A, 19B and 19C are diagrams illustrating a disposition configuration in which an antenna module is disposed at a side member according to various embodiments of the disclosure.
Figure 19B:
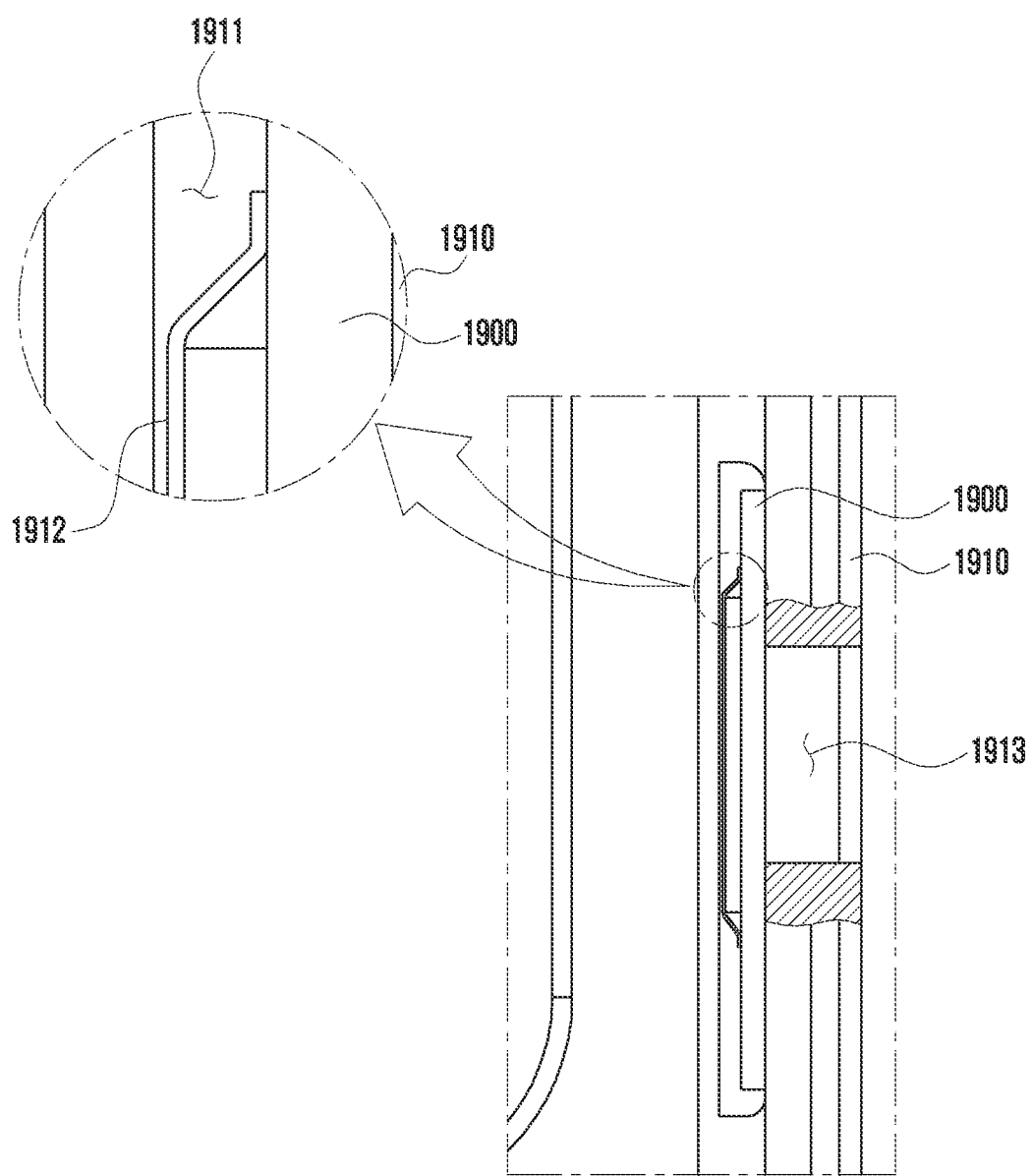
Figure 19C:
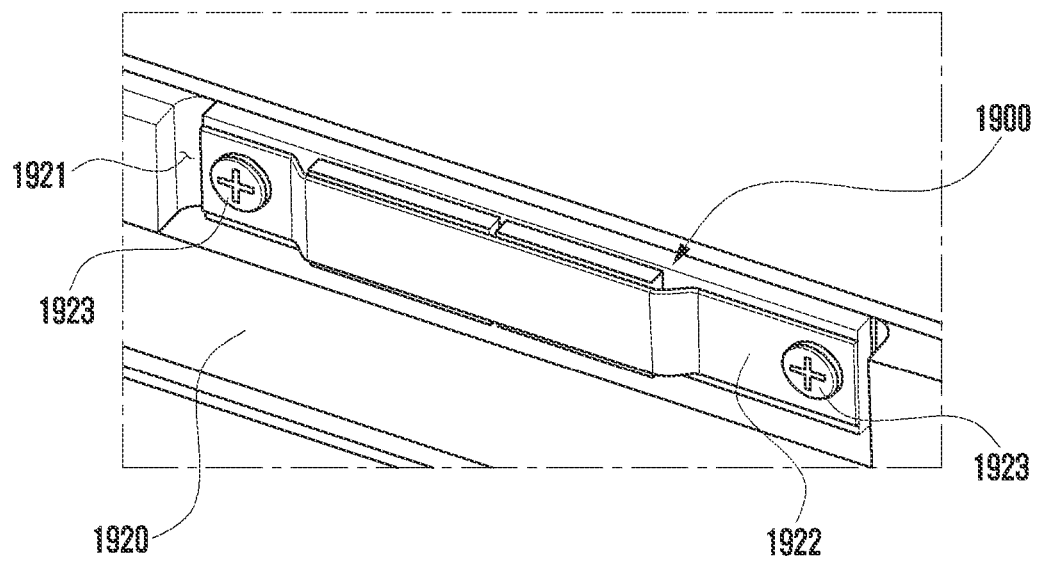

FIGS. 19A, 19B and 19C are diagrams illustrating a disposition structure in which an antenna module is disposed at side members according to various embodiments of the disclosure.

An antenna module 1900 of FIGS. 19A to 19C may be at least partially similar to the antenna module 500 of FIG. 8 or the antenna module 1300 of FIG. 15 or may further include other components of the antenna module.

Referring to FIGS. 19A and 19B, in a side member 1910, a seating groove 1911 of a predetermined depth may be formed, and the antenna module 1900 may be disposed in a manner to be at least partially seated in the seating groove 1911. In this case, the side member 1910 may further include a support member 1912 disposed to press the antenna module 1900 toward the side member 1910 in the seating groove 1911. According to an embodiment, the support member 1912 may guide so that a slot (e.g., the slot 5231 of FIG. 8) of the antenna module 1900 faces tightly a through hole 1913 (e.g., the through hole 513 of FIG. 8) of the side member 1910. According to an embodiment, the support member 1912 may include a plate-shaped spring made of a metal material.

Referring to FIG. 19C, a side member 1920 may include a recess 1921 formed to open at one side in a predetermined depth. According to an embodiment, the antenna module 1900 may be disposed in a manner to be seated in the recess 1921. In this case, in the recess 1921, the antenna module 1900 may be fixed to the side member 1920 through a support member 1922 fastened to the side member 1920 by a screw 1923.

Figure 20:
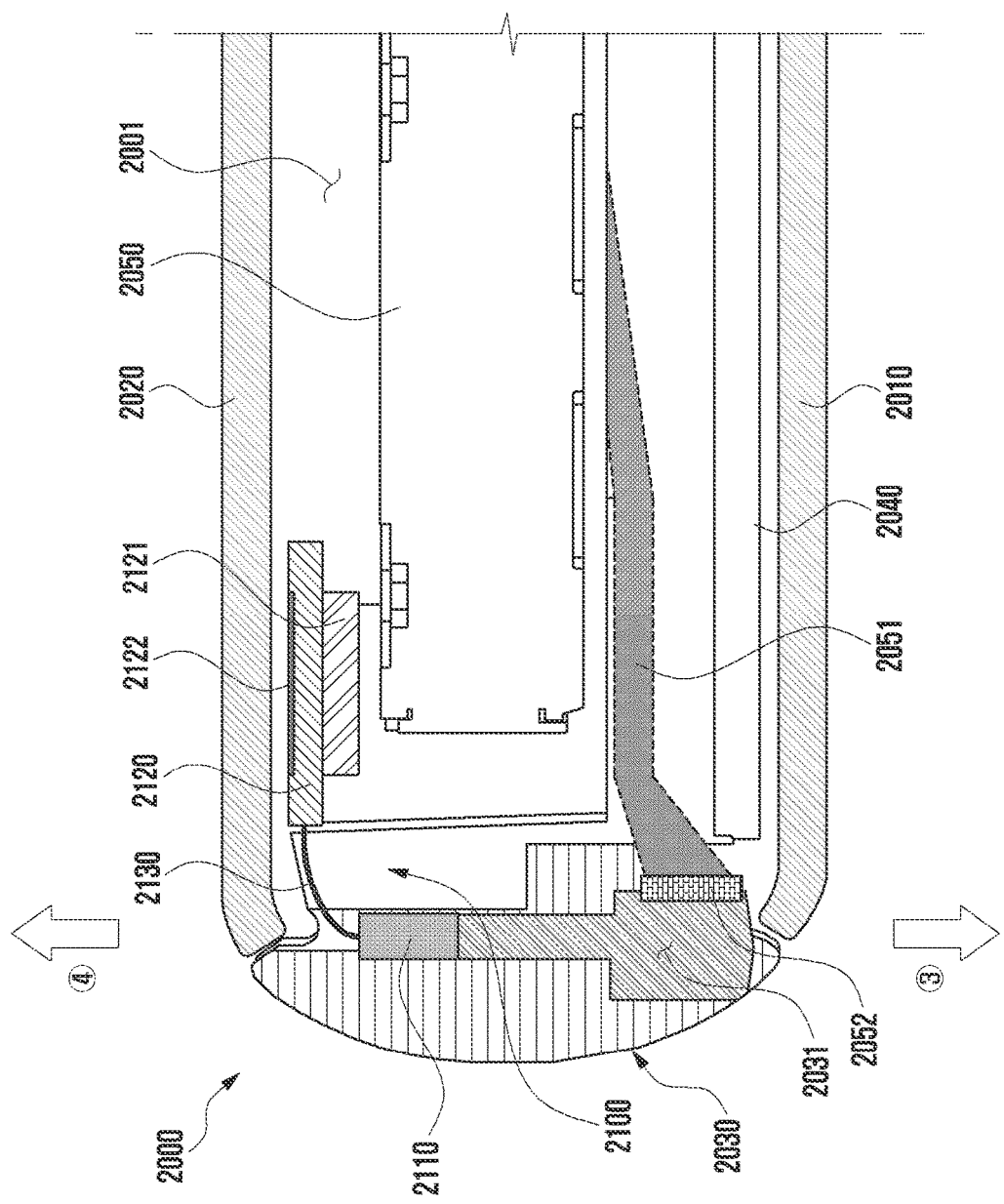
FIG. 20 is a cross-sectional view illustrating main components in a state in which an antenna module is disposed in an electronic device according to an embodiment of the disclosure.

FIG. 20 is a cross-sectional view illustrating main components in a state in which an antenna module is disposed in an electronic device according to an embodiment of the disclosure.

An electronic device 2000 of FIG. 20 may be at least partially similar to the electronic device 101 of FIG. 1 and the electronic device 300 of FIG. 3A or may further include other components of the electronic device.

Referring to FIG. 20, the electronic device 2000 may include a first plate 2010, a second plate 2020 facing in a direction opposite to that of the first plate 2010, and a side member 2030 enclosing a space 2001 between the first plate 2010 and the second plate 2020. According to an embodiment, the side member 2030 may include a through hole 2031 as a portion of the above-described horn waveguide structure. According to an embodiment, the through hole 2031 may be disposed to be exposed in a direction (③ direction) in which the first plate 2010 of the electronic device 2000 faces. According to an embodiment, the electronic device 2000 may include a display 2040 (e.g., flexible display) disposed in the internal space 2001 to be visible from the outside through at least a partial area of the first plate 2010. According to an embodiment, the electronic device 2000 may include an audio module 2050 therein. According to an embodiment, the audio module 2050 may include a microphone module for collecting a sound from the outside or a speaker module for emitting a sound to the outside.

According to various embodiments, the electronic device 2000 may include an antenna module 2100 disposed at the internal space 2001. According to an embodiment, the antenna module 2100 may include a first printed circuit board 2110 (e.g., structure) disposed to contact the side member 2030 in the internal space 2001 of the electronic device 2000, a second printed circuit board 2120 spaced apart from the printed circuit board 2110, and a conductive cable 2130 (e.g., flexible printed circuit (FPCB)) for electrically connecting the second printed circuit board 2120 and the first printed circuit board 2110. According to an embodiment, as described above, in the first printed circuit board 2110, a first area (e.g., the first area A3 of FIG. 15) may be formed in the substrate side surface (e.g., the substrate side surface 531 of FIG. 15), and the substrate side surface (e.g., the substrate side surface 531 of FIG. 15) may contact the side member 2030 so that the first area (e.g., the first area A3 of FIG. 15) faces the through hole 2031. According to an embodiment, the second printed circuit board 2120 may include a conductive patch antenna 2122 disposed at one surface and a wireless communication circuit 2121 disposed at another surface opposite to one surface. According to an embodiment, the second printed circuit board 2120 may be disposed in a direction parallel to the second plate 2020. Accordingly, the antenna module 2100 may form a beam pattern in the direction (③ direction) in which the front plate 2010 faces through the through hole 2031 and the first area (e.g., the first area A3 of FIG. 15) of the first printed circuit board 2110 and/or a direction (④ direction) in which the second plate 2020 faces through the conductive patch antenna 2122.

According to various embodiments, the through hole 2031 may be used as an external sound collecting hole by the audio module 2050 and/or a discharge hole for emitting a sound. Therefore, the electronic device 2000 may include an audio waveguide hole 2051 disposed in the internal space 2001 to extend from the audio module 2050 to the through hole 2031. According to an embodiment, the electronic device 2000 may include a mesh member 2052 disposed between the audio waveguide hole 2051 and the through hole 2031 to prevent inflow of a foreign material or moisture.

According to various embodiments, the through hole 2031 may be applied to an operation channel of at least one electronic component disposed inside the electronic device 2000 and disposed to detect an external environment. According to an embodiment, the electronic component may include at least one sensor. According to one embodiment, the sensor may include a temperature sensor, a humidity sensor, or an odor sensor. In another embodiment, the electronic component may include a camera device, illuminance sensor, ultrasonic sensor, indicator, or iris sensor.

Figure 21:
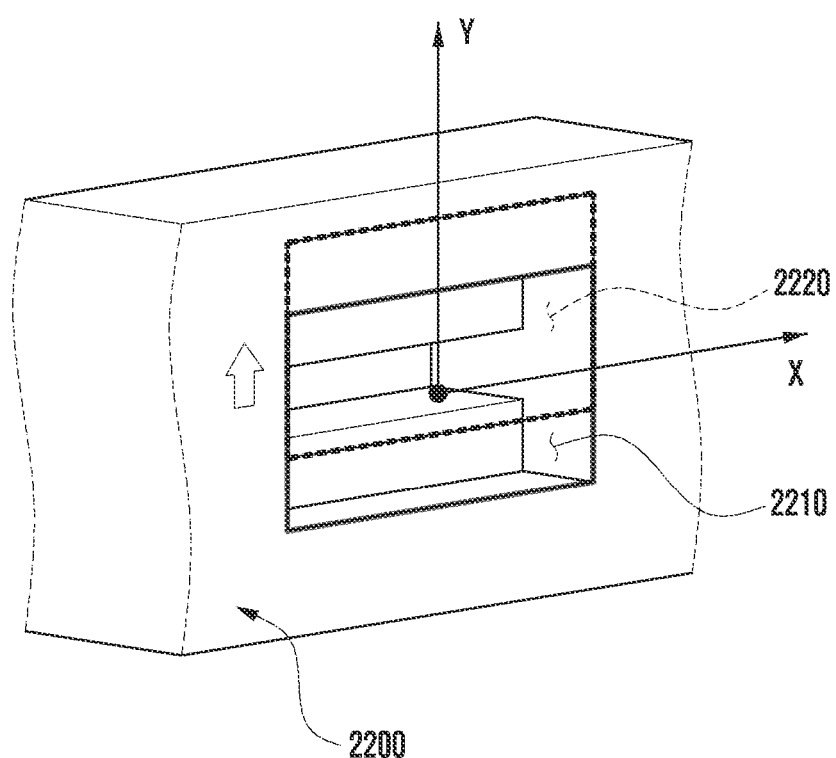
FIG. 21 is a diagram illustrating a position change of a through hole in a side member according to an embodiment of the disclosure.

FIG. 21 is a diagram illustrating a position change of a through hole in a side member according to an embodiment of the disclosure.

Figure 22:
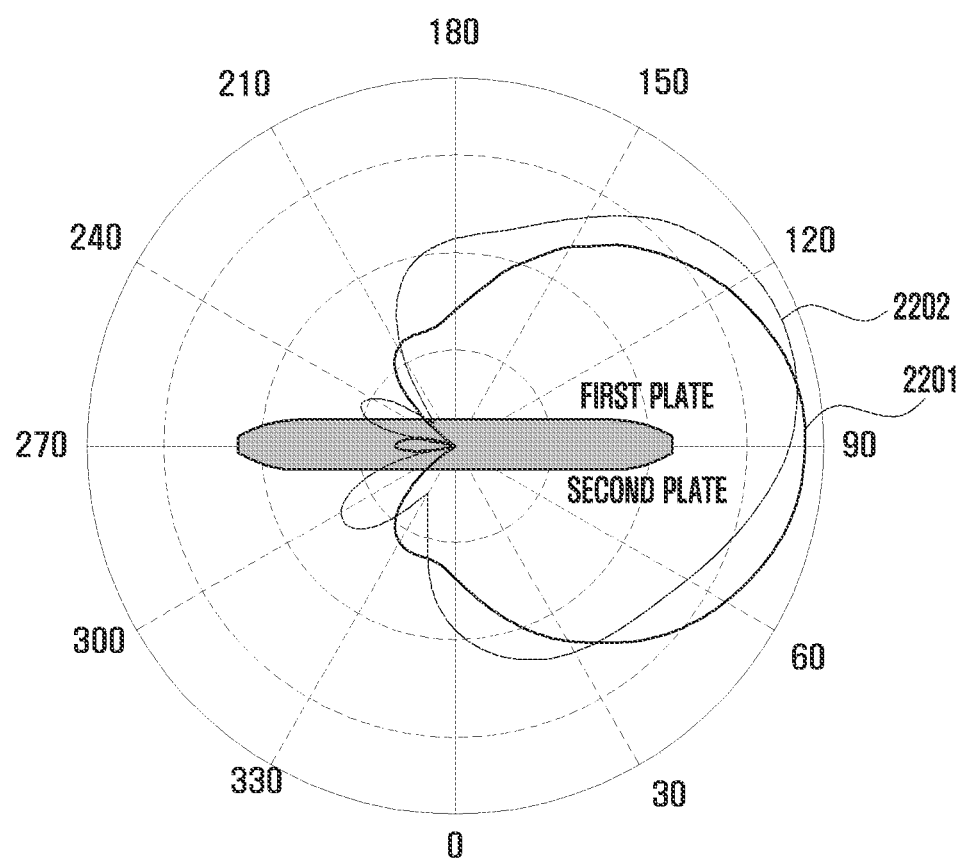
FIG. 22 is a diagram illustrating a radiation pattern of an antenna module according to a position change of the through hole of FIG. 21 according to an embodiment of the disclosure.

FIG. 22 is a diagram illustrating a radiation pattern of an antenna module according to a change in position of the through hole of FIG. 21 according to an embodiment of the disclosure.

Referring to FIGS. 21 and 22, a side member 2200 may include a through hole 2210 exposed to the outside. According to one embodiment, in a state in which a position of a printed circuit board (e.g., the printed circuit board 520 of FIG. 8) (e.g., structure) disposed at the side member 2200 is not changed, when a position of the through hole 2210 is changed, for example, when the position of the through hole 2210 is changed by a predetermined position (e.g., the position of illustrated through hole 2220) in a first plate direction (e.g., y direction), as illustrated in FIG. 22, a beam peak direction is changed from a pattern 2201 to a pattern 2202; thus, it can be determined that the beam peak direction is tilted in a direction of the first plate of the electronic device. This may mean that beam coverage may be enlarged in a direction of the first plate (e.g., the window of the electronic device).

Figure 23:
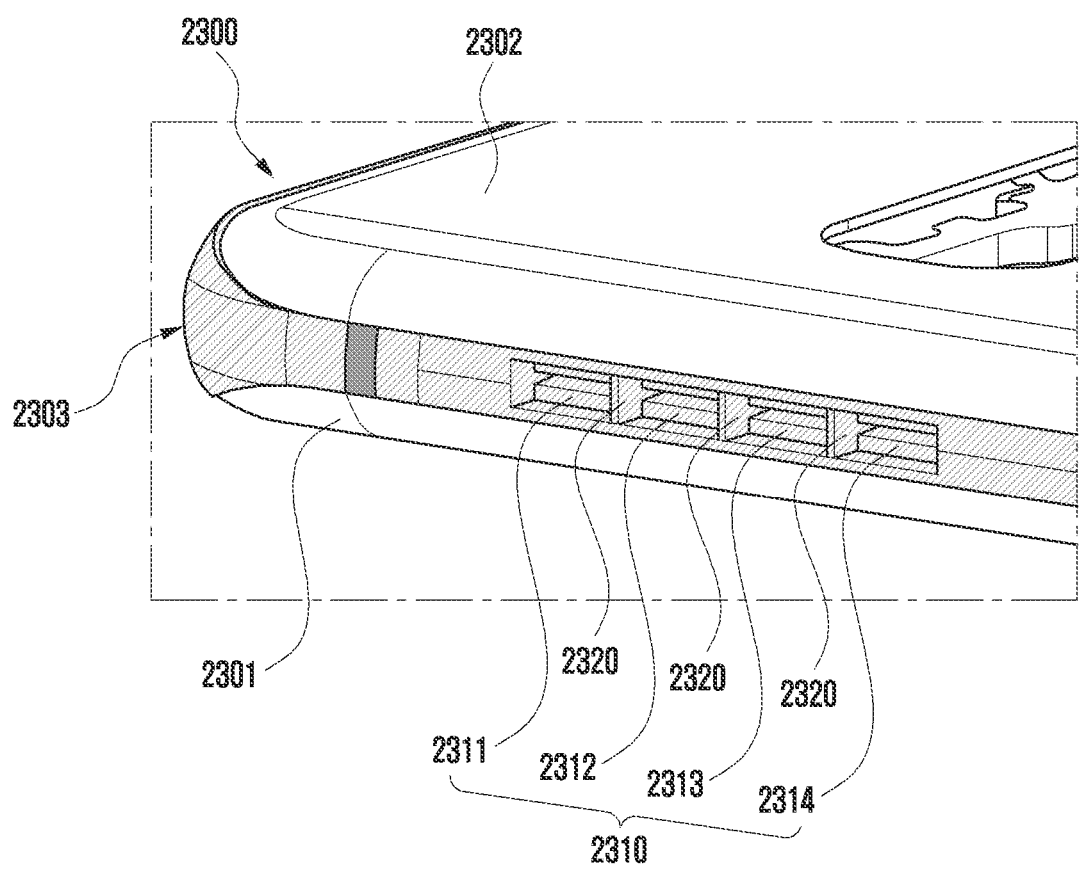
FIG. 23 is a diagram illustrating a through hole array disposed at a side member of an electronic device according to an embodiment of the disclosure.

FIG. 23 is a diagram illustrating a through hole array disposed at a side member of an electronic device according to an embodiment of the disclosure.

Figure 24A:
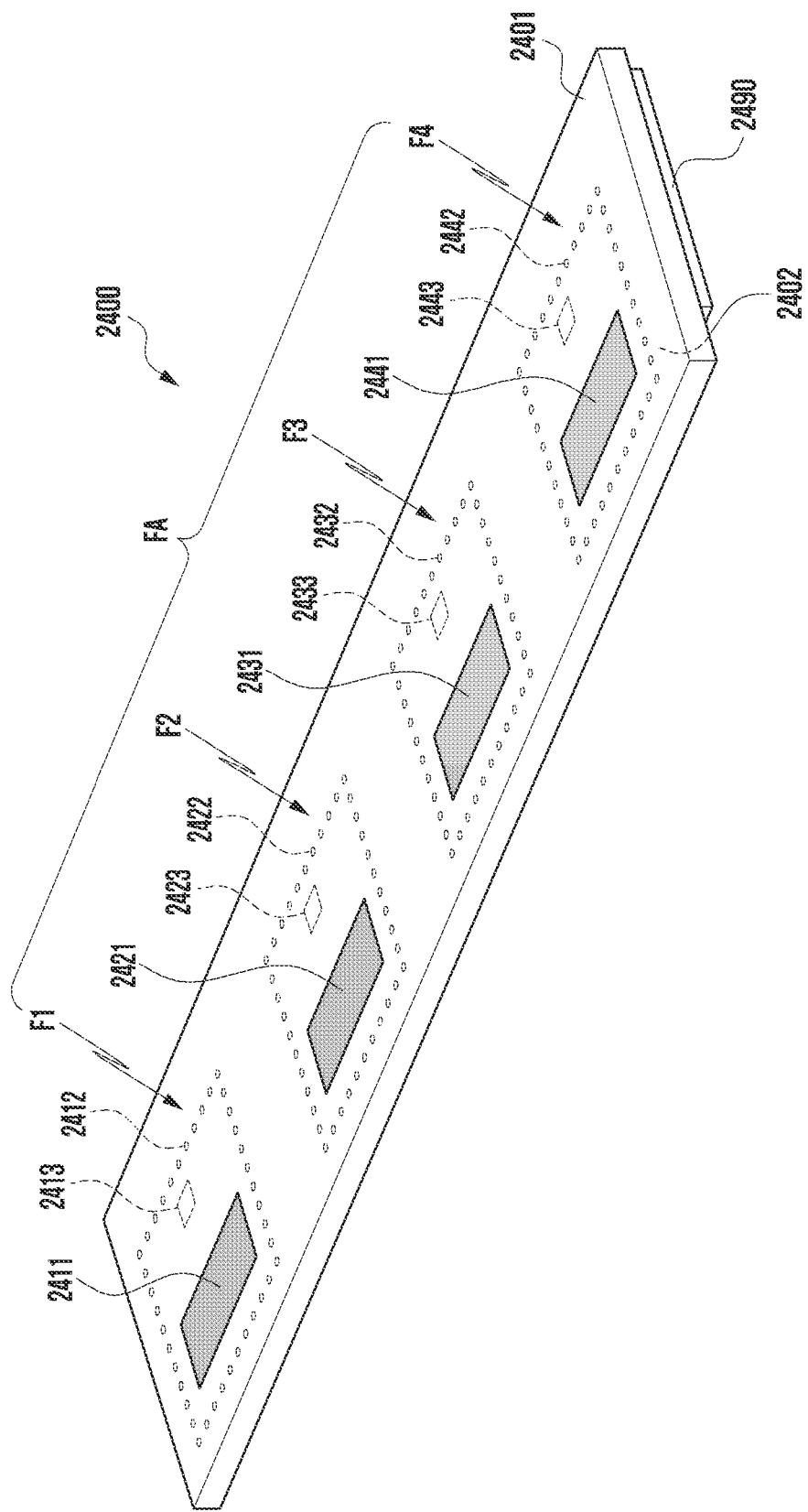
FIG. 24A is a perspective view illustrating a printed circuit board in an array feeding structure disposed to correspond to the through hole array of FIG. 23 according to an embodiment of the disclosure.

FIG. 24A is a perspective view illustrating a printed circuit board illustrating an array feeding structure FA disposed to correspond to the through hole array of FIG. 23 according to an embodiment of the disclosure.

Figure 24B:
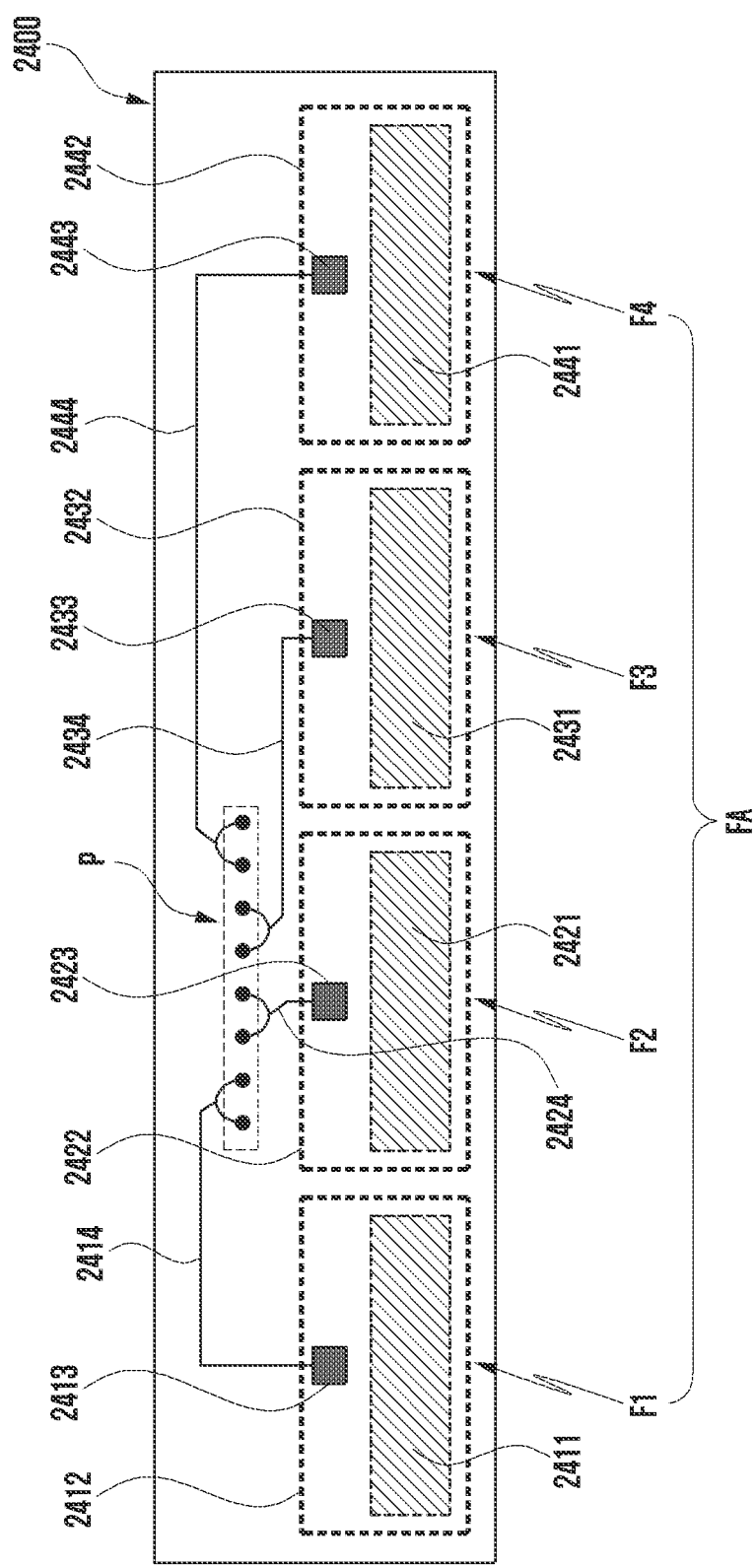
FIG. 24B is a diagram illustrating a disposition of the array feeding structure of FIG. 24A according to an embodiment of the disclosure.

FIG. 24B is a diagram illustrating a disposition structure of an array feeding structure of FIG. 24A according to an embodiment of the disclosure.

An electronic device 2300 of FIG. 23 may be at least partially similar to the electronic device 101 of FIG. 1 and the electronic device 300 of FIG. 3A or may further include other components of the electronic device.

Referring to FIG. 23, the electronic device 2300 may include a first plate 2301, a second plate 2302 facing in a direction opposite to that of the first plate 2301, and a side member 2303 enclosing a space between the first plate 2301 and the second plate 2302. According to an embodiment, in the side member 2303, a through hole array 2310 including a plurality of through holes 2311, 2312, 2313, and 2314 exposed in a facing direction of the side member 2303 may be disposed. According to an embodiment, the through hole array 2310 may include a first through hole 2311, a second through hole 2312, a third through hole 2313, and/or a fourth through hole 2314. According to an embodiment, the through holes 2311, 2312, 2313, and 2314 of the through hole array 2310 may be separated from each other by a partition wall 2320. According to an embodiment, the partition wall 2320 may be formed integrally with the side member 2303 or may include separate conductive members (e.g., reflecting plates) disposed at the side member 2303.

Referring to FIGS. 24A and 24B, an electronic device (e.g., the electronic device 2300 of FIG. 23) may include a printed circuit board 2400 disposed inside the electronic device 2300 so as to face the through hole array 2310 of the side member 2303. According to an embodiment, the printed circuit board 2400 may include a first surface 2401 facing the side member 2303 inside the electronic device 2300 and a second surface 2402 facing in a direction opposite to that of the first surface 2401. According to an embodiment, the printed circuit board 2400 may include an array feeding structure FA including a first feeding structure F1 disposed on the first surface 2401 and facing the first through hole 2311, a second feeding structure F2 facing the second through hole 2312, a third feeding structure F3 facing the third through hole 2313, and a fourth feeding structure F4 facing the fourth through hole 2314. As illustrated, the through hole array 2310 and the array feeding structure FA are formed in a 1×4 arrangement structure, but they are not limited thereto and may have various arrangement and disposition structures.

According to various embodiments, the first feeding structure F1 may include a first slot 2411 and a first conductive line 2413 facing the first through hole 2311 and disposed inside an area formed by the plurality of first conductive vias 2412, the second feeding structure F2 may include a second slot 2421 and a second conductive line 2423 facing the second through hole 2312 and disposed inside an area formed by the plurality of second conductive vias 2422, the third feeding structure F3 may include a third slot 2431 and a third conductive line 2433 facing the third through hole 2313 and disposed inside an area formed by a plurality of third conductive vias 2432, and the fourth feeding structure F4 may include a fourth slot 2441 and a fourth conductive line 2443 facing the fourth through hole 2314 and disposed inside an area formed by a plurality of fourth conductive vias 2442. According to an embodiment, the printed circuit board may include a plurality of ports P electrically connected to a wireless communication circuit. According to an embodiment, the first conductive line 2413 may be electrically connected to at least one of the plurality of ports P through a first electrical path 2414. According to an embodiment, the second conductive line 2423 may be electrically connected to at least one of the plurality of ports P through a second electrical path 2424. According to an embodiment, the third conductive line 2433 may be electrically connected to at least one of the plurality of ports P through a third electrical path 2434. According to an embodiment, the fourth conductive line 2443 may be electrically connected to at least one of the plurality of ports P through a fourth electrical path 2444.

Figure 25A:
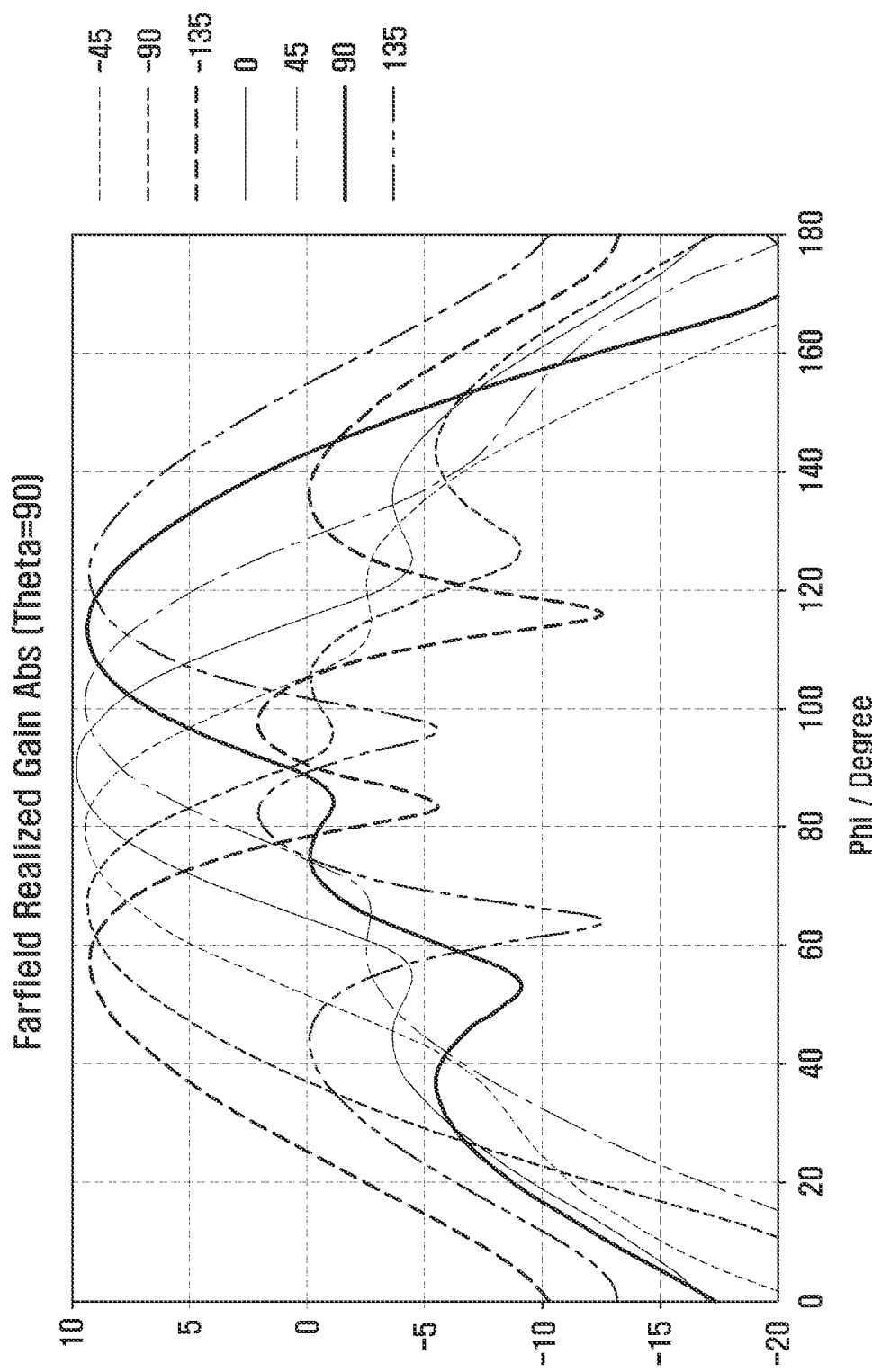
FIGS. 25A and 25B are diagrams illustrating beam scanning performances and radiation patterns according to phase differences of an antenna module formed with the side member of FIG. 23 and the printed circuit board of FIG. 24 according to various embodiments of the disclosure.
Figure 25B:
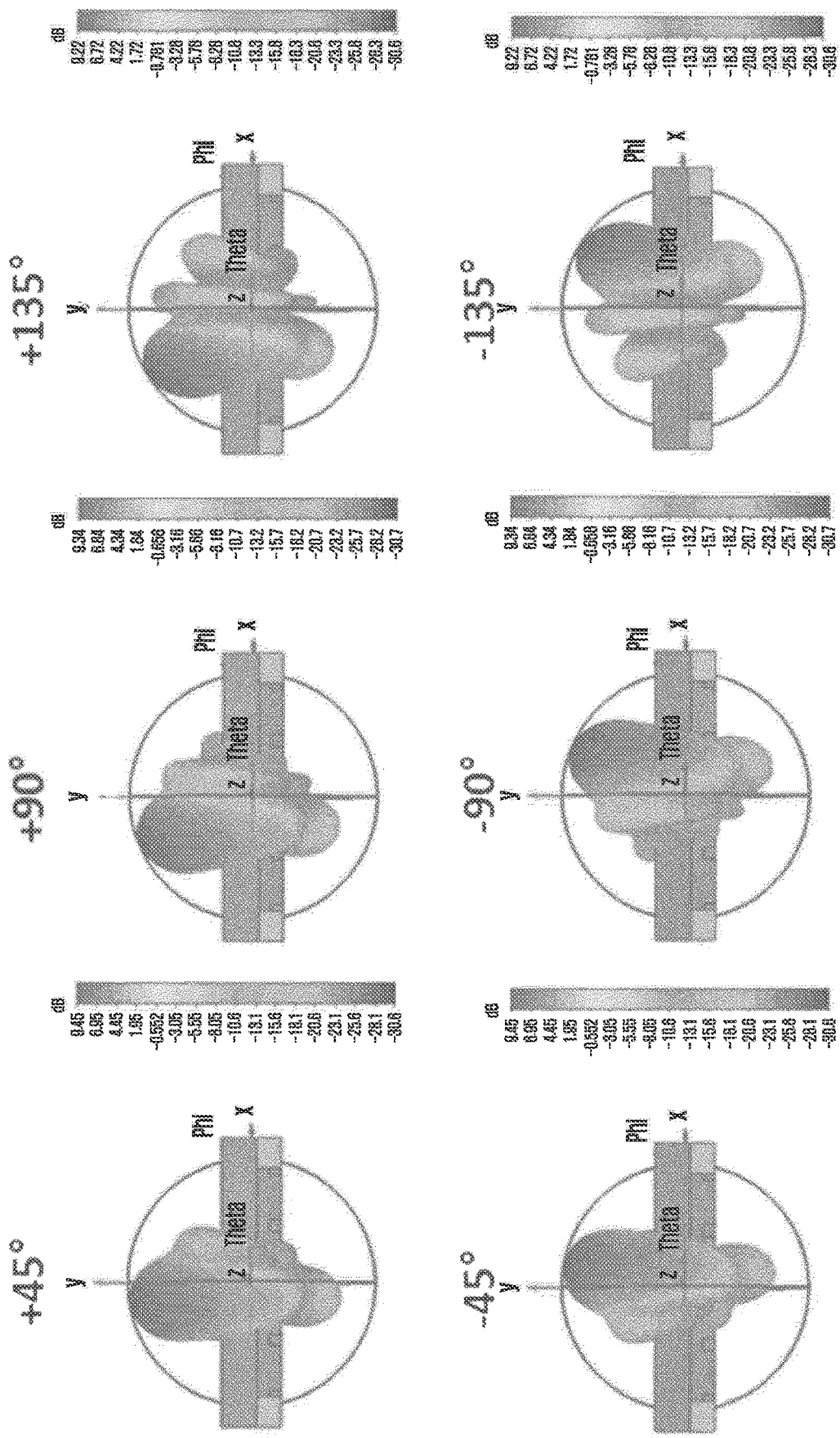

FIGS. 25A and 25B illustrate a beam scanning performance and a radiation pattern according to phase differences of an antenna module formed with the side member of FIG. 23 and the printed circuit board of FIGS. 24A and 24B according to various embodiments of the disclosure.

In a peak gain, when a phase is input in a unit of 45° by applying 10 dBi and 3 bit phase shifter, beam scanning (coverage of total 90°) of +/−45° is available and a scanning resolution may be adjusted according to the number of bits of the phase shifter and coverage may be extended.

Figure 26:
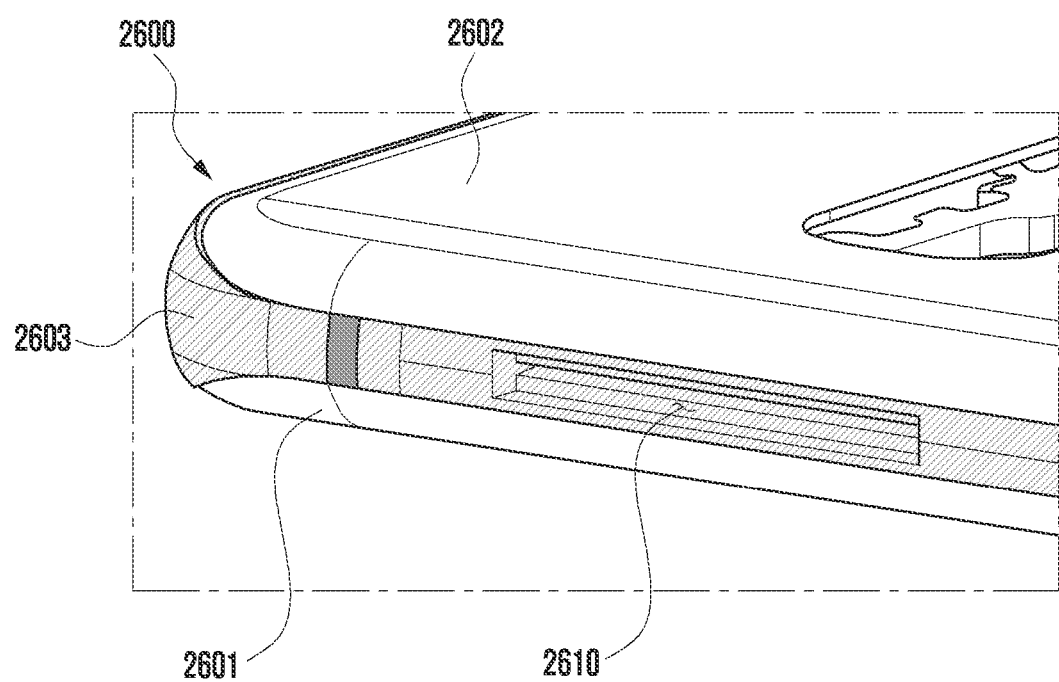
FIG. 26 is a diagram illustrating a structure of a through hole disposed at a side member of an electronic device according to an embodiment of the disclosure.

FIG. 26 is a diagram illustrating a structure of a through hole disposed at a side member of an electronic device according to an embodiment of the disclosure.

An electronic device 2600 of FIG. 26 may be at least partially similar to the electronic device 101 of FIG. 1 and the electronic device 300 of FIG. 3A or may further include other components of the electronic device.

Referring to FIG. 26, the electronic device 2600 may include a first plate 2601, a second plate 2602 facing in a direction opposite to that of the first plate 2601, and a side member 2603 enclosing a space between the second plate 2602 and the first plate 2601. According to an embodiment, the side member 2603 may include one through hole 2610 exposed in a direction in which the side member 2603 faces. According to an embodiment, in the side member 2603, a printed circuit board (e.g., the printed circuit board 2400 of FIG. 24) may be disposed such that an array feeding structure (e.g., the array feeding structure FA of FIG. 24) having a plurality of feeding structures (e.g., the feeding structures F1, F2, F3, and F4 of FIG. 24) of 1×4 arrangement of FIG. 24 faces in one through hole 2610 having no partition wall.

Figure 27:
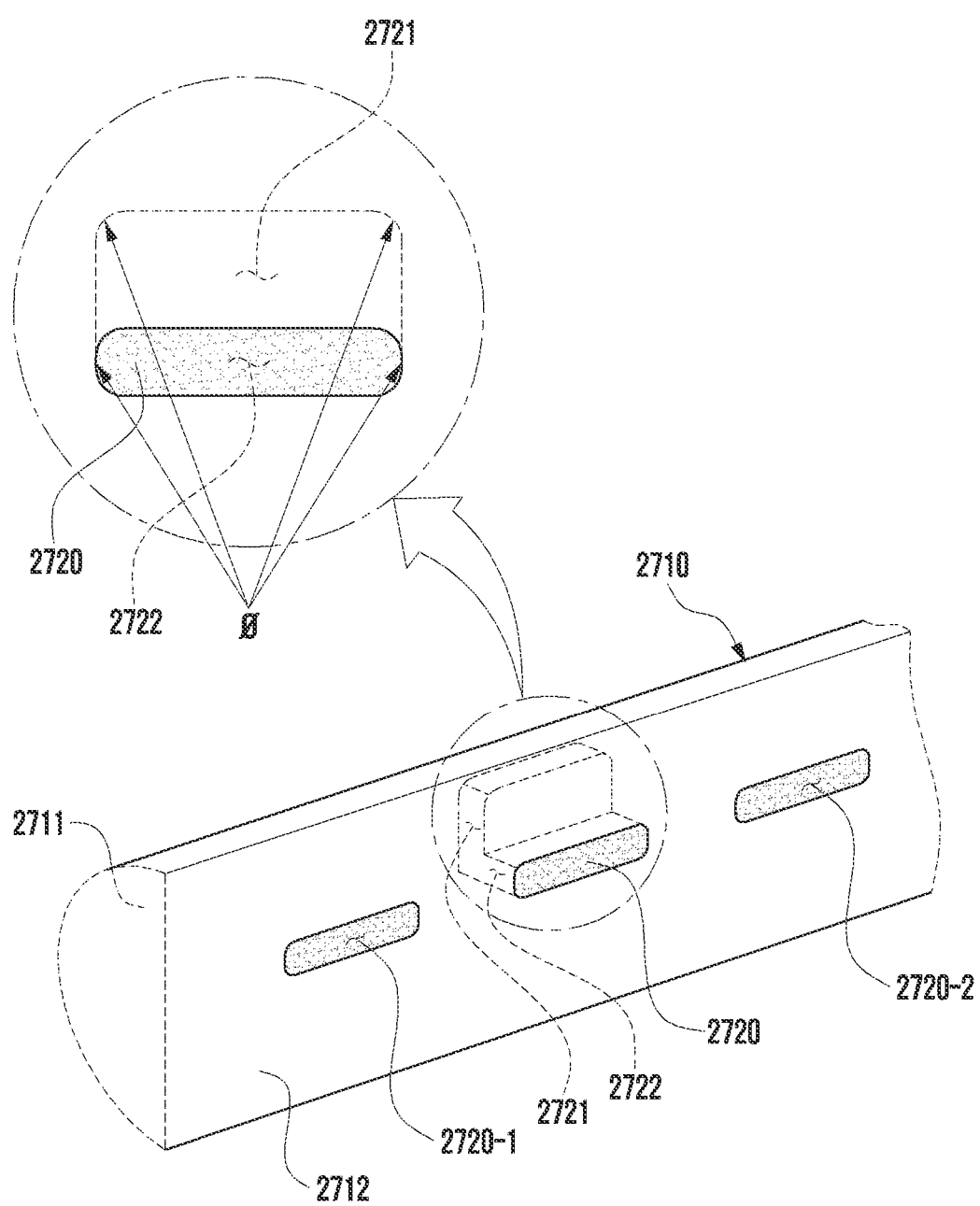
FIG. 27 is a diagram illustrating a curved edge of a through hole disposed at a side member according to an embodiment of the disclosure.

FIG. 27 illustrates a curved edge of a through hole disposed in a side member according to an embodiment of the disclosure.

Referring to FIG. 27, a side member 2710 may include a first surface 2711 facing outside the electronic device (e.g., the electronic device 300 of FIG. 3A) and a second surface 2712 facing in a direction opposite to that of the first surface 2711. According to an embodiment, the side member 2710 may include a plurality of through holes 2720, 2720-1, and 2720-2 disposed at regular intervals from the second surface 2712 through the first surface 2711. Hereinafter, a configuration of one through hole 2720 is described, but the remaining through holes 2720-1 and 2720-2 may also have substantially the same configuration. According to an embodiment, when the first surface 2711 is viewed from the outside, the through hole 2720 may include a first opening 2721 having a first size and a second opening 2722 smaller than the first size. According to an embodiment, when viewed from above the second surface 2712, left and right side surfaces and corners of the first opening 2721 and the second opening 2722 may be formed to have a specific radius of curvature φ. In this case, impedance characteristics of the antenna module may be changed by the through hole 2720 having a curved edge structure, unlike a right edge structure.

Figure 28:
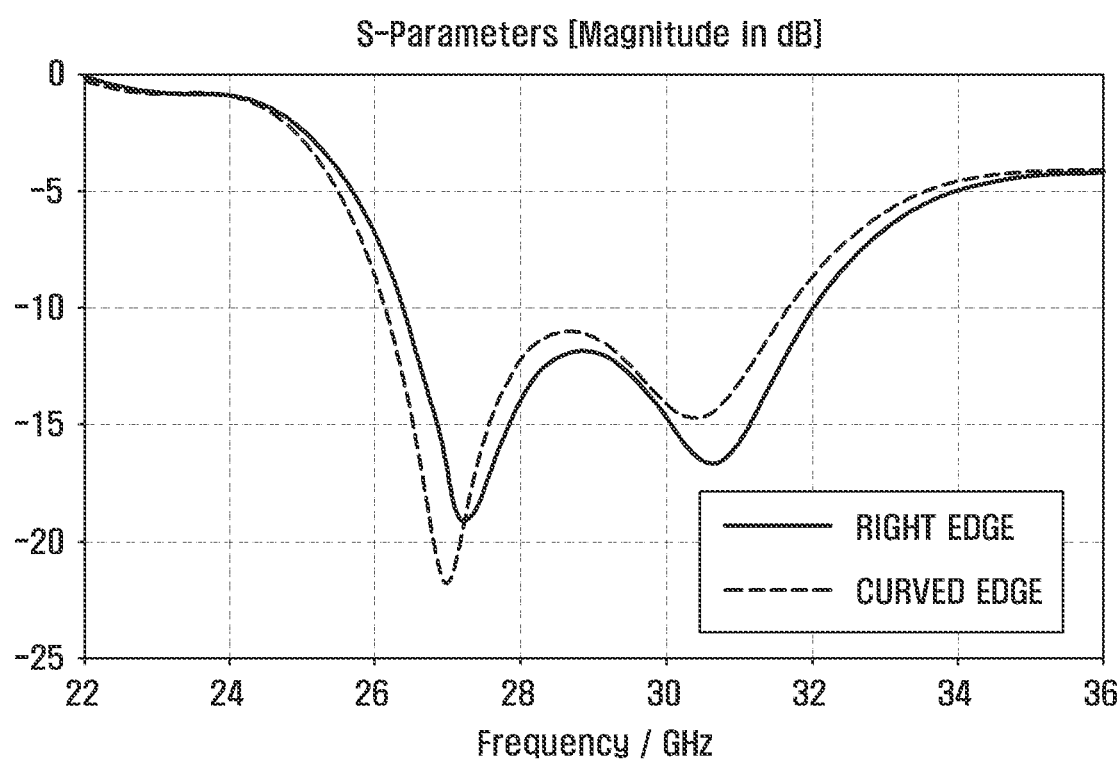
FIG. 28 is a diagram illustrating an impedance characteristic of an antenna module operating through the through hole of FIG. 27 according to an embodiment of the disclosure.

FIG. 28 is a diagram illustrating impedance characteristics of an antenna module operating through the through hole of FIG. 27 according to an embodiment of the disclosure.

With regard to FIG. 28, it may be determined that a frequency band of a through hole (e.g., the through hole 2720 of FIG. 27) having a curved edge was somewhat shifted to a low frequency band, compared with the through hole having a right edge.

According to various embodiments of the disclosure, by using a portion of a metal member of an electronic device as a signal waveguide structure of an antenna, beam coverage of the antenna can be secured in a desired direction; thus, an unnecessary mechanical design change of a metal member can be excluded.

According to various embodiments, the electronic device (e.g., the electronic device 300 of FIG. 3A) may include a housing (e.g., the housing 310 of FIG. 3A) including a first plate (e.g., the front plate 302 of FIG. 3A), a second plate (e.g., the rear plate 311 of FIG. 3B) facing in a direction opposite to that of the first plate, and a side member (e.g., the side bezel structure 318 of FIG. 3A) enclosing a space between the first plate and the second plate and connected to the second plate or integrally formed with the second plate, and including a conductive material, wherein a first portion (e.g., the first portion P1 of FIG. 8) of the side member (e.g., the side member 510 of FIG. 8) may include a first surface (e.g., the first surface 511 of FIG. 8) facing outside the housing, a second surface (e.g., the second surface 512 of FIG. 8) facing in a direction opposite to that of the first surface, and a through hole (e.g., the through hole 513 of FIG. 8) formed between the first surface and the second surface, wherein the through hole includes a first opening (e.g., the first opening 5131 of FIG. 8) formed on the first surface and having a first size when viewed from the outside of the housing, a second opening (e.g., the second opening 5132 of FIG. 8) formed on the second surface and having a second size smaller than the first size when viewed from the outside of the housing and at least partially overlapped with the first opening, and a channel (e.g., the channel CH1 of FIG. 8) formed between the first opening and the second opening, wherein the housing includes a first non-conductive material (e.g., first non-conductive material 514 of FIG. 5A) inserted into the through hole; a display (e.g., the display 301 of FIG. 3A) visible through at least a portion of the first plate, and a printed circuit board (e.g., the printed circuit board 520 of FIG. 8) disposed inside the housing so as to face the first portion, wherein printed circuit board includes a third surface (e.g., the third surface 521 of FIG. 8) facing the second surface, a fourth surface (e.g., the fourth surface 522 of FIG. 8) facing in a direction opposite to that of the third surface, and a first conductive layer (e.g., the first conductive layer 523 of FIG. 8) disposed closer to the third surface rather than the fourth surface, wherein the first conductive layer includes a first area (e.g., the first area A1 of FIG. 7A) including a slot (e.g., the slot 5231 of FIG. 8) facing the second opening and a second area (e.g., the second area A2 of FIG. 7A) formed at a periphery of the first area, a second conductive layer (e.g., the second conductive layer 524 of FIG. 8) disposed closer to the fourth surface rather than the first conductive layer, a conductive line (e.g., the conductive line 526 of FIG. 8) overlapped with at least a portion of the second area when viewed from above the first conductive layer and disposed between the first conductive layer and the second conductive layer; a printed circuit board configured to enclose at least a portion of the second area and including a plurality of conductive vias (e.g., the plurality of conductive vias 525 of FIG. 8) configured to electrically connect the first conductive layer and the second conductive layer; and at least one wireless communication circuit (e.g., the wireless communication circuit 590 of FIG. 8) electrically connected to the conductive line and configured to transmit and/or receive a signal having a frequency between 3 GHz and 100 GHz.

According to various embodiments, the slot may be formed in substantially the same size and shape as those of the second opening.

According to various embodiments, the wireless communication circuit may be disposed at the fourth surface of the printed circuit board.

According to various embodiments, the slot may include a second non-conductive material (e.g., the non-conductive material 5232 of FIG. 7A).

According to various embodiments, when viewed from above the first conductive layer, the printed circuit board may further include a conductive pattern (e.g., the conductive pattern 5263 of FIG. 8) overlapped with the second area and disposed between the first conductive layer and the second conductive layer, and the conductive pattern may be electrically connected to the conductive line.

According to various embodiments, the conductive pattern may include a conductive pad of a predetermined size disposed inside the second area at a position capacitively coupled to the first conductive layer in a direction parallel to the first surface when viewed from above the first surface.

According to various embodiments, the conductive line may be electrically connected to a designated position of the second area.

According to various embodiments, the conductive line may be electrically connected to at least a portion of the first conductive layer.

According to various embodiments, the electronic device may further include at least one electronic component (e.g., the electronic component 2050 of FIG. 20) disposed inside the space and a waveguide hole (e.g., the waveguide hole 2051 of FIG. 20) for connecting at least a portion of the through hole and the electronic component (e.g., the through hole 2031 of FIG. 20), and the through hole may be used as an operating channel of the electronic component together with the waveguide hole.

According to various embodiments, the electronic component may include a microphone device, a speaker device, a temperature sensor, a humidity sensor, or an odor sensor.

According to various embodiments, the electronic device (e.g., the electronic device 300 of FIG. 3A) may include a housing (e.g., the housing 310 of FIG. 3A) including a first plate (e.g., the front plate 302 of FIG. 3A), a second plate (e.g., the rear plate 311 of FIG. 3B) facing in a direction opposite to that of the first plate, and a side member (e.g., the side bezel structure 318 of FIG. 3A) configured to enclose a space between the first plate and the second plate and connected to the second plate or formed integrally with the second plate and including a conductive material, wherein a first portion (e.g., the first portion P1 of FIG. 8) of the side member (e.g., the side member 510 of FIG. 8) includes a first surface (e.g., the first surface 511 of FIG. 8) facing outside the housing, a second surface (e.g., the second surface 512 of FIG. 8) facing in a direction opposite to that of the first surface, and a through hole (e.g., the through hole 513 of FIG. 8) formed between the first surface and the second surface, wherein the through hole includes a first opening (e.g., the first opening 5131 of FIG. 8) formed on the second surface and having a first size when viewed from the outside of the housing, a second opening (e.g., the second opening 5132 of FIG. 8) formed on the second surface, having a second size smaller than the first size when viewed from the outside of the housing, and at least partially overlapped with the first opening, and a channel (e.g., the channel CH1 of FIG. 8) formed between the first opening and the second opening, wherein the housing includes a first non-conductive material (e.g., the first non-conductive material 514 of FIG. 5A) inserted into the through hole; a display (e.g., the display 301 of FIG. 3A) visible through at least a portion of the first plate, a structure (e.g., the printed circuit board 520 of FIG. 8) disposed inside the housing so as to face the first portion, wherein the structure includes a first area (e.g., the first area A1 of FIG. 8) disposed to face the second opening, a second area (e.g., the second area A2 of FIG. 8) including a plurality of conductive vias (e.g., the plurality of conductive vias 525 of FIG. 8) formed at a periphery of the first area, and a conductive line (e.g., the conductive line 526 of FIG. 8) disposed in the second area; and at least one wireless communication circuit (e.g., the wireless communication circuit 590 of FIG. 8) electrically connected to the conductive line and configured to transmit and/or receive a signal having a frequency between 3 GHz and 100 GHz.

According to various embodiments, the structure may include a printed circuit board (e.g., the printed circuit board 520 of FIG. 8), wherein the printed circuit board may include a third surface (e.g., the third surface 521 of FIG. 8) facing the second surface, a fourth surface (e.g., the fourth surface 522 of FIG. 8) facing in a direction opposite to that of the third surface, a first conductive layer (e.g., the first conductive layer 523 of FIG. 8) disposed closer to the third surface rather than the fourth surface, and a second conductive layer (e.g., the second conductive layer 524 of FIG. 8) disposed closer to the fourth surface rather than the first conductive layer.

According to various embodiments, the printed circuit board may include a slot (e.g., the slot 5231 of FIG. 7A) at least partially overlapped with the second opening when viewed from above the first surface and formed through the first conductive layer.

According to various embodiments, the slot may be formed in substantially the same size and shape as those of the second opening.

According to various embodiments, the plurality of conductive vias may enclose at least a portion at a periphery of the slot and electrically connect the first conductive layer and the second conductive layer, when viewed from above the first surface.

According to various embodiments, the conductive line may be disposed between the first conductive layer and the second conductive layer in the second area.

According to various embodiments, the wireless communication circuit may be disposed on a fourth surface of the printed circuit board.

According to various embodiments, the electronic device (e.g., the electronic device 300 of FIG. 3A) may include a housing (e.g., the housing 310 of FIG. 3A) including a first plate (e.g., the front plate 302 of FIG. 3A), a second plate (e.g., the rear plate 311 of FIG. 3B) facing in a direction opposite to that of the first plate, and a side member (e.g., the side bezel structure 318 of FIG. 3A) enclosing a space between the first plate and the second plate and connected to the second plate or integrally formed with the second plate and including a conductive material, wherein a first portion (e.g., the first portion P2 of FIG. 13A) of the side member (e.g., the side member 510 of FIG. 15) includes a first surface (e.g., the first surface 511 of FIG. 15) facing outside the housing, a second surface (e.g., the second surface 512 of FIG. 15) facing in a direction opposite to that of the first surface, and a through hole (e.g., the through hole 513 of FIG. 15) formed between the first surface and the second surface, wherein the through hole includes a first opening (e.g., the first opening 5131 of FIG. 15) formed on the first surface and having a first size when viewed from the outside of the housing, a second opening (e.g., the second opening 5132 of FIG. 15) formed on the second surface, having a second size smaller than the first size when viewed from the outside of the housing, and at least partially overlapped with the first opening, and a channel (e.g., the channel CH2 of FIG. 15) formed between the first opening and the second opening, wherein the housing includes a first non-conductive material (e.g., the first non-conductive material 514 of FIG. 13A) inserted into the through hole; a display (the display 301 of FIG. 3A) visible through at least a portion of the first plate, and a printed circuit board (e.g., the printed circuit board 530 of FIG. 15) disposed inside the housing so as to face the first portion, wherein the printed circuit board includes a third surface (e.g., the first substrate surface 5301 of FIG. 15) facing in the same direction as that of the first plate, a fourth surface (e.g., the second substrate surface 5302 of FIG. 15) facing in a direction opposite to that of the third surface, a substrate side surface (e.g., the substrate side surface 531 of FIG. 15) configured to enclose a space between the third surface and the fourth surface and including a first area (e.g., the first area A1 of FIG. 14) facing the second opening, a first conductive layer (e.g., the conductive layer 533 of FIG. 15) disposed closer to the third surface rather than the fourth surface and including a second area (e.g., the second area A2 of FIG. 14) formed at the third surface adjacent to the substrate side surface, a second conductive layer (e.g., the second conductive layer 534 of FIG. 15) disposed closer to the fourth surface rather than the first conductive layer, a conductive line (e.g., the conductive line 536 of FIG. 15) overlapped with at least a portion of the second area and disposed between the first conductive layer and the second conductive layer, when viewed from above the first conductive layer, wherein the printed circuit board is configured to enclose at least a portion of the second area and includes a plurality of conductive vias (e.g., a plurality of conductive vias 535 of FIG. 15) configured to electrically connect the first conductive layer and the second conductive layer; and at least one wireless communication circuit (e.g., the wireless communication circuit 590 of FIG. 15) electrically connected to the conductive line and configured to transmit and/or receive a signal having a frequency between 3 GHz and 100 GHz.

According to various embodiments, the first area may be formed in substantially the same size and shape as those of the second opening.

According to various embodiments, an operating frequency band and/or an operating frequency bandwidth may be determined according to a transition length (e.g., the transition length L of FIG. 14) between the first area and the plurality of conductive vias.

While the disclosure has been shown and described with reference to various embodiment thereof, it will be understood by those skilled in the art that various changes in form and details may be made therein without departing from the spirit and scope of the embodiments of the disclosure as defined by the appended claims and their equivalents.

What is claimed is:

1. A portable communication device comprising:
a display;
a housing accommodating the display, the housing comprising a side member, the side member comprising a conductive portion and a non-conductive portion, the conductive portion having an opening formed therein, the non-conductive portion being at least partially disposed in the opening, the opening being formed from an outer surface to an inner surface of the conductive portion such that, when viewed in a first direction perpendicular to the display, a first opening portion extending from the outer surface has a first length in a second direction, the second direction corresponding to an extending direction of a length of the conductive portion, and a second opening portion extending from and being connected to the first opening portion has a second length in the second direction smaller than the first length;
an antenna circuitry disposed parallel to the side member, the antenna circuitry comprising:
a printed circuit board comprising a first layer facing the side member and a second layer facing a direction opposite to that of the first layer,
a first portion disposed at the printed circuit board, the first portion including a radiating element facing the second opening portion and being disposed between the first layer and the second layer, the radiating element being connected to a feeding line through a conductive line extended in a direction perpendicular to each of the feeding line and the radiating element, and
a second portion adjacent to the first portion at the printed circuit board and facing a part of the conductive portion, the second portion including a plurality of conductive vias formed therein, at least one via of the plurality of conductive vias being electrically connected to a ground layer included in the printed circuit board; and
a communication circuit electrically connected to the antenna circuitry.

2. The portable communication device of claim 1, wherein a periphery of the opening forms a stepped shape when viewed in a direction perpendicular to a lower side or an upper side of the side member.

3. The portable communication device of claim 1, wherein an outer surface of the non-conductive portion in the opening is substantially planar.

4. The portable communication device of claim 1, further comprising:
a supporting structure at least partially surrounding the antenna circuitry.

5. The portable communication device of claim 4, wherein an antenna structure for the antenna circuitry is at least partially formed by combining the side member and at least part of the supporting structure.

6. The portable communication device of claim 1,
wherein the non-conductive portion comprises a non-conductive material, and
wherein the non-conductive material comprises a dielectric material.

7. The portable communication device of claim 1, wherein the plurality of conductive vias are disposed at regular intervals in the printed circuit board.

8. A portable communication device comprising:
an antenna circuitry;
a communication circuit electrically connected to the antenna circuitry; and
a housing comprising a side member forming a side surface of the portable communication device, the side member comprising a conductive portion and a non-conductive portion, the conductive portion including an opening formed between an inner surface and an outer surface of the conductive portion such that a periphery of the opening has an uneven shape, the non-conductive portion being at least partially located in the opening, the opening comprising:

a first area formed on the outer surface and having a first size when viewed in a direction perpendicular to the outer surface of the conductive portion, and a second area formed at least partially between the antenna circuitry and the outer surface and having a second size smaller than the first size when viewed in the direction perpendicular to the outer surface of the conductive portion, the first area extending toward the second area in a stepped shape while reducing a width of the opening, wherein the antenna circuitry is parallel to the side member and configured to radiate a signal to an outside of the housing through the opening, the antenna circuitry comprising:

a printed circuit board comprising a first surface facing the side member and a second surface facing a direction opposite to that of the first surface, a first portion disposed at the printed circuit board, the first portion including a radiating element facing the second area of the opening, the radiating element being connected to a feeding line through a conductive line extended in a direction perpendicular to each of the feeding line and the radiating element, a second portion adjacent to the first portion at the printed circuit board and facing a part of the conductive portion surrounding the second area of the opening, the second portion including a plurality of conductive vias formed therein, a first conductive layer disposed on a first layer of the printed circuit board, and a second conductive layer disposed on a second layer between the first layer and the second surface.

9. The portable communication device of claim 8, wherein the periphery of the opening forms a stepped shape when viewed in a direction perpendicular to a lower side or an upper side of the side member.

10. The portable communication device of claim 8, wherein an outer surface of the non-conductive portion in the opening is substantially planar.

11. The portable communication device of claim 8, further comprising:

a supporting structure at least partially surrounding the antenna circuitry.

12. The portable communication device of claim 11, wherein an antenna structure for the antenna circuitry is at least partially formed by combining the side member and at least part of the supporting structure.

13. The portable communication device of claim 8,
wherein the non-conductive portion comprises a non-conductive material, and
wherein the non-conductive material comprises a dielectric material.

14. The portable communication device of claim 8, wherein the plurality of conductive vias are disposed at regular intervals in the printed circuit board.

15. A portable communication device comprising:
a housing comprising a side member forming a side surface of the portable communication device, the side member comprising:

a conductive member including an opening formed therein such that a first area of the opening corresponding to an outer surface of the side member has a first size, a second area of the opening between the first area and an inner surface of the side member has a second size smaller than the first size, and a periphery of the opening is uneven between the first area and the second area when viewed in a direction perpendicular to a lower side or an upper side of the side member, the first area extending toward the second area in a stepped shape while reducing a width of the opening, and a non-conductive member formed in at least part of the opening;

an antenna circuitry located parallel to the side member and configured to radiate a signal to an outside of the housing through the opening, the antenna circuitry comprising:

a printed circuit board comprising a first surface facing the side member and a second surface facing a direction opposite to that of the first surface, a first portion disposed at the printed circuit board, the first portion including a radiating element facing the second area of the opening, the radiating element being connected to a feeding line through a conductive line extended in a direction perpendicular to each of the feeding line and the radiating element, a second portion adjacent to the first portion at the printed circuit board and facing a part of the conductive member surrounding the second area of the opening, the second portion including a plurality of conductive vias formed therein, a first conductive layer disposed on a first layer of the printed circuit board, and a second conductive layer disposed on a second layer between the first layer and the second surface; and a communication circuit electrically connected to the antenna circuitry.

16. The portable communication device of claim 15, wherein the periphery of the opening forms a stepped shape when viewed in the direction perpendicular to the lower side or the upper side of the side member.

17. The portable communication device of claim 15, wherein an outer surface of the non-conductive member in the opening is substantially planar.

18. The portable communication device of claim 15, further comprising:

a supporting structure at least partially surrounding the antenna circuitry.

19. The portable communication device of claim 18, wherein an antenna structure for the antenna circuitry is at least partially formed by combining the side member and at least part of the supporting structure.

20. A portable communication device comprising:
a display;
a housing accommodating the display, the housing comprising a side member, the side member comprising a conductive portion and a non-conductive portion, the conductive portion having an opening formed therein, the non-conductive portion being at least partially disposed in the opening, the opening being formed from an inner surface of the conductive portion to an outer surface of the conductive portion such that, when viewed in a first direction perpendicular to the display, a first opening portion adjacent to the outer surface has a first length in a second direction corresponding to an extending direction of a length of the conductive portion, a second opening portion adjacent to the inner surface has a second length smaller than the first length in the second direction, and a stepped opening portion reducing a width of the opening is disposed between the first opening portion and the second opening portion;

an antenna circuitry disposed parallel with the side member and configured to radiate a signal to an outside of the housing through the non-conductive portion disposed in the opening, the antenna circuitry comprising:
- a printed circuit board comprising a first surface facing the side member and a second surface facing a direction opposite to that of the first surface,
- a radiating element disposed at the printed circuit board, the radiating element facing the second opening portion, the radiating element being connected to a feeding line through a conductive line extended in a direction perpendicular to each of the feeding line and the radiating element,
- a plurality of conductive vias adjacent to the radiating element at the printed circuit board and facing a part of the conductive portion surrounding the second opening portion,
- a first conductive layer disposed on a first layer of the printed circuit board, and
- a second conductive layer disposed on a second layer between the first layer and the second surface; and a communication circuit electrically connected to the antenna circuitry.

\* \* \* \* \*